(12) United States Patent
Leon et al.

(10) Patent No.: US 8,999,851 B2
(45) Date of Patent: Apr. 7, 2015

(54) METHODS FOR FORMATION OF SUBSTRATE ELEMENTS

(75) Inventors: Francisco Leon, Palo Alto, CA (US); Francesco Lemmi, Sunnyvale, CA (US); Jeffrey Miller, Los Altos Hills, CA (US); David Dutton, San Jose, CA (US); David P. Stumbo, Belmont, CA (US)

(73) Assignee: OneD Material LLC, Palo Alto, CA (US)

( * ) Notice: Subject to any disclaimer, the term of this patent is extended or adjusted under 35 U.S.C. 154(b) by 701 days.

(21) Appl. No.: 12/331,150

(22) Filed: Dec. 9, 2008

(65) Prior Publication Data
US 2009/0230380 A1 Sep. 17, 2009

Related U.S. Application Data

(60) Provisional application No. 61/006,028, filed on Dec. 14, 2007, provisional application No. 61/064,363, filed on Feb. 29, 2008, provisional application No. 61/064,954, filed on Apr. 4, 2008.

(51) Int. Cl.
| | | |
|---|---|---|
| *H01L 21/302* | (2006.01) | |
| *H01L 29/06* | (2006.01) | |
| *B81C 1/00* | (2006.01) | |
| *B82Y 10/00* | (2011.01) | |
| *H01L 29/66* | (2006.01) | |
| *H01L 29/786* | (2006.01) | |

(52) U.S. Cl.
CPC ........ *H01L 29/0665* (2013.01); *B81C 1/00142* (2013.01); *B82Y 10/00* (2013.01); *H01L 29/0673* (2013.01); *H01L 29/66772* (2013.01); *H01L 29/78603* (2013.01); *H01L 29/78696* (2013.01)

(58) Field of Classification Search
USPC .......................................... 438/706, 745, 585
See application file for complete search history.

(56) References Cited

U.S. PATENT DOCUMENTS

| | | |
|---|---|---|
| 3,615,956 A | 10/1971 | Irving |
| 3,994,793 A | 11/1976 | Harvilchuck et al. |
| 4,057,460 A | 11/1977 | Saxena et al. |
| 4,414,066 A | 11/1983 | Forrest et al. |
| 4,464,223 A | 8/1984 | Gorin |
| 4,523,976 A | 6/1985 | Bukhman |
| 4,595,454 A | 6/1986 | Dautremont-Smith et al. |

(Continued)

FOREIGN PATENT DOCUMENTS

| | | |
|---|---|---|
| JP | 2006093390 A | 4/2006 |
| WO | 2005022120 | 3/2005 |
| WO | 2006130721 | 12/2006 |

OTHER PUBLICATIONS

International Search Report dated Aug. 12, 2009 for corresponding PCT Application PCT/US2008/013499 filed Dec. 9, 2008.
Ashby, "Photochemical Dry Etching of GaAs" Appl Phys. Lett (1984) 45:892.
Ashby, et al. "Composition-selective Photochemical Etching of Compound Semiconductors" Appl. Phys. Lett (1985) 47:62.

(Continued)

*Primary Examiner* — Long Pham
(74) *Attorney, Agent, or Firm* — Sterne, Kessler, Goldstein & Fox PLLC

(57) ABSTRACT

The present invention relates to methods of forming substrate elements, including semiconductor elements such as nanowires, transistors and other structures, as well as the elements formed by such methods.

19 Claims, 62 Drawing Sheets

(56) References Cited

U.S. PATENT DOCUMENTS

| | | | |
|---|---|---|---|
| 4,599,136 | A | 7/1986 | Araps et al. |
| 4,639,301 | A | 1/1987 | Doherty et al. |
| 5,092,957 | A | 3/1992 | Ashby et al. |
| 5,149,974 | A | 9/1992 | Kirch et al. |
| 5,374,564 | A | 12/1994 | Bruel |
| 5,418,181 | A | 5/1995 | Ohkubo et al. |
| 5,565,291 | A | 10/1996 | Mayama et al. |
| 5,820,689 | A | 10/1998 | Tseng et al. |
| 6,536,106 | B1 | 3/2003 | Jackson et al. |
| 6,687,987 | B2 | 2/2004 | Mayer et al. |
| 6,753,538 | B2 | 6/2004 | Musil et al. |
| 6,816,380 | B2 | 11/2004 | Credelle et al. |
| 6,985,361 | B2 | 1/2006 | Credelle et al. |
| 7,115,526 | B2 | 10/2006 | Ho et al. |
| 7,153,782 | B2 | 12/2006 | Eissa |
| 7,195,733 | B2 | 3/2007 | Rogers |
| 7,260,882 | B2 | 8/2007 | Credelle et al. |
| 7,353,598 | B2 | 4/2008 | Craig et al. |
| 7,521,292 | B2 | 4/2009 | Rogers et al. |
| 7,557,367 | B2 | 7/2009 | Rogers et al. |
| 2006/0079048 | A1 | 4/2006 | Sampsell |
| 2007/0032089 | A1 | 2/2007 | Nuzzo et al. |
| 2007/0228583 | A1 | 10/2007 | Islam et al. |
| 2007/0252234 | A1 | 11/2007 | Kawamata et al. |
| 2007/0264481 | A1 | 11/2007 | DeSimone et al. |

OTHER PUBLICATIONS

Bourland et al. "Silicon-on-insulator process for the fabrication of novel nanostructures" J. Vac. Sci Tech B (2001) 19:1997-1997.

Ciucci et al. "Silicon nanowires fabricated by means of an underetching technique" Microelec Eng (2005) 78-79:338-342.

Kloeppel, J.E. "Foldable and stretchable silicon circuits conform to many shapes" U. Of Illinois New Bureau (2008) http://news.illinois.edu/NEWS/08/0327electronics.html.

Lee et al. "Well controlled assembly of silicon nanowires by nanowire transfer method" Nanotech (2007) 18:445302.

Mack et al., "Mechanically flexible thin-film transistors that use ultrathin ribbons of silicon derived from bulk wafers," Appl Phys Lett (2006) 88:213101 (6 pages).

Matsui et al. "Electron Beam Induced Selective Etching and Deposition Technology" J. Vac. Sci & Tech B (1989) 7: 7(5), Sep./Oct. 1989.

Meitl, M.A. et al. "Transfer printing by kinetic control of adhesion to an elastomeric stamp" Nature Mat (2006) 5:33-38.

Menard et al., "A printable form of silicon for high performance thin film transistors on plastic substrates," Appl Phys Lett (2004) 84:5398-5400.

Mgrdichian, L. "Stretchable silicon may inspire a new wave of electronics" Physorg.com (2007) http://www.physorg.com/news100966375.html.

Sun, Y. et al. "Controlled buckling of semiconductor nanoribbons for stretchable electronics" Nature Nanotech (2006) 1:201-207.

Winkler et al. "E-Beam Probe Station with Integrated Tool for Electron Beam Induced Etching" Microelec. Eng. (1996) 31-141-147.

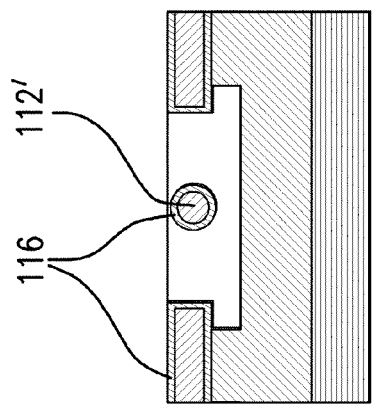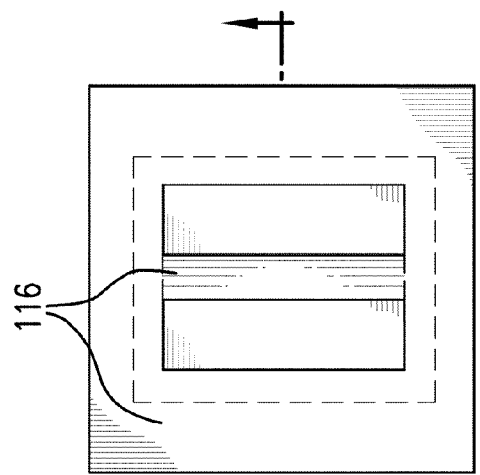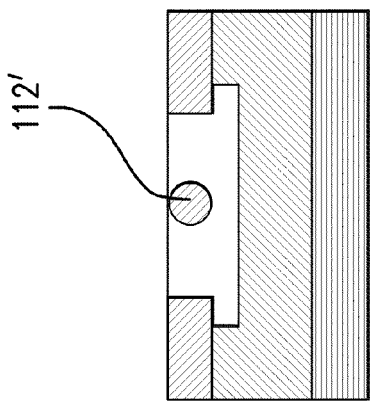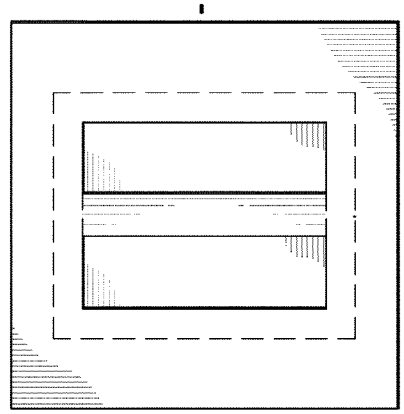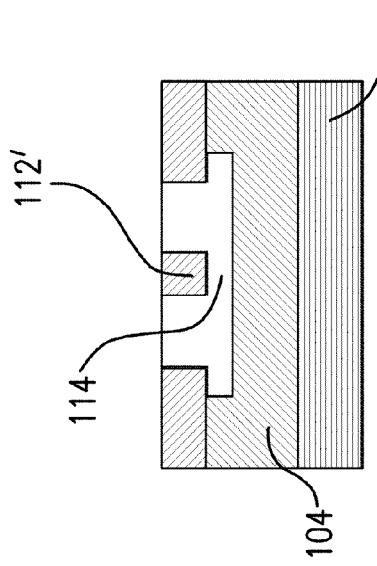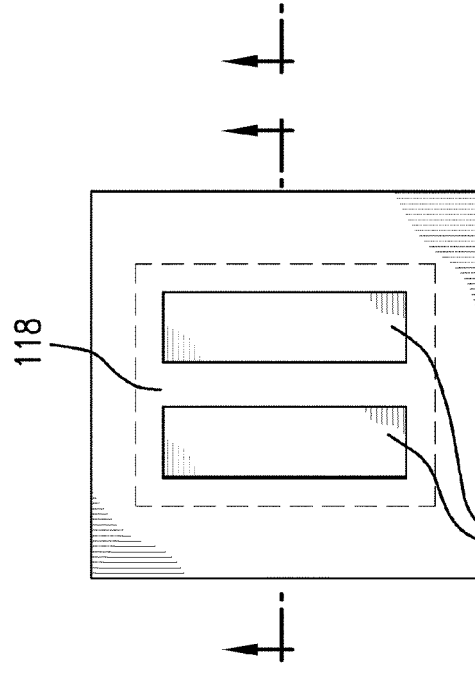

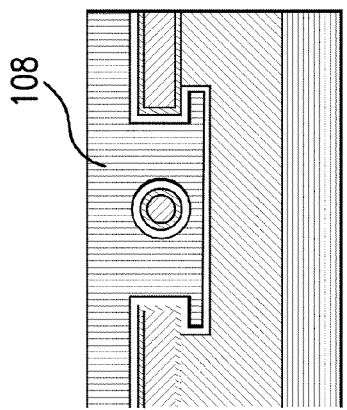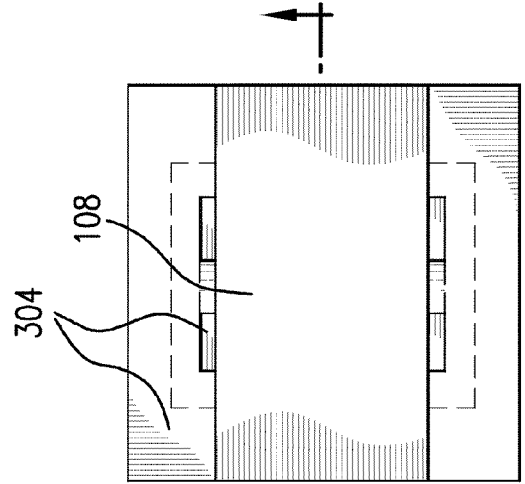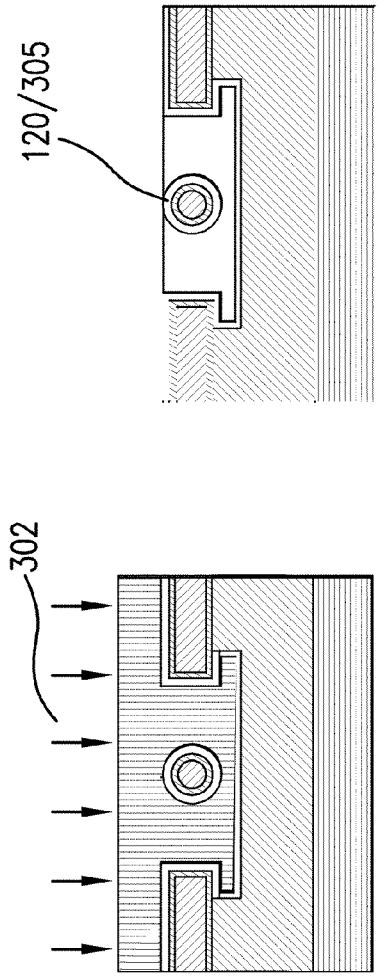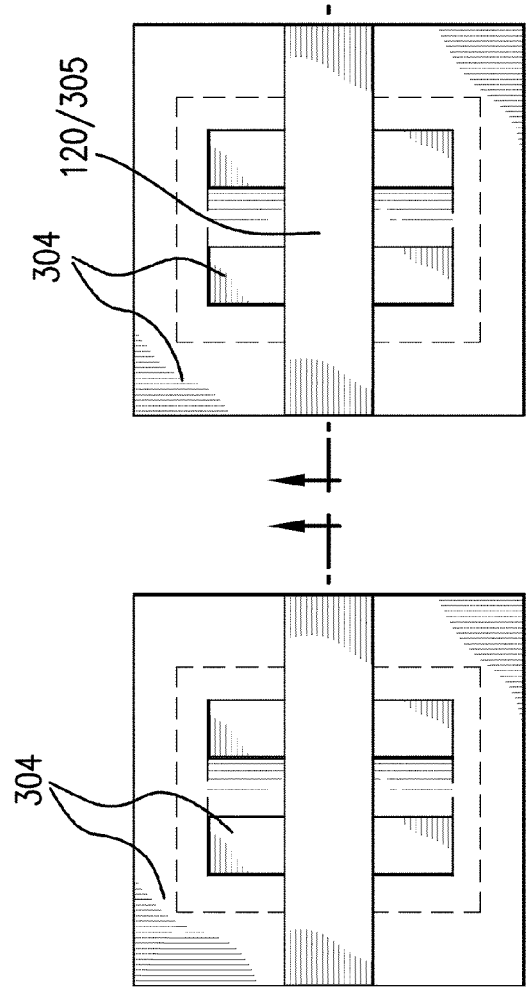
FIG.3G  FIG.3I  FIG.3K
FIG.3H  FIG.3J  FIG.3L

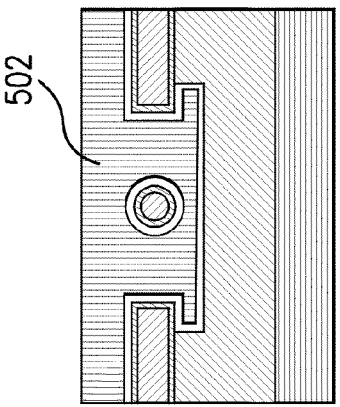
FIG.5A
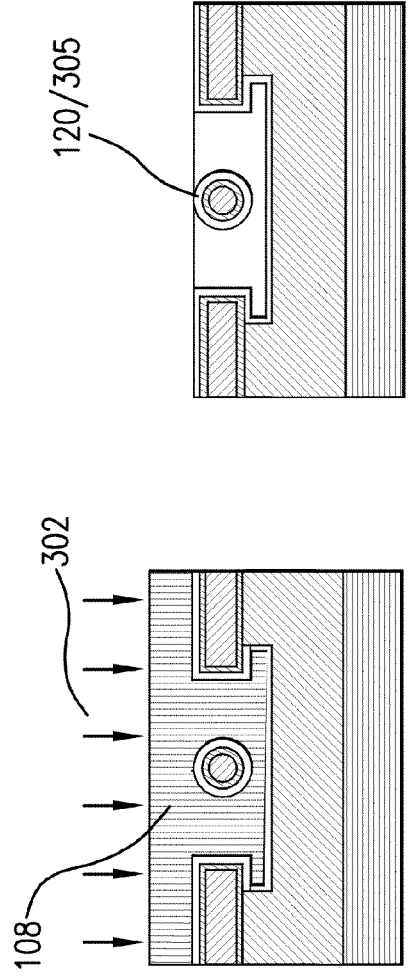
FIG.5C
FIG.5E
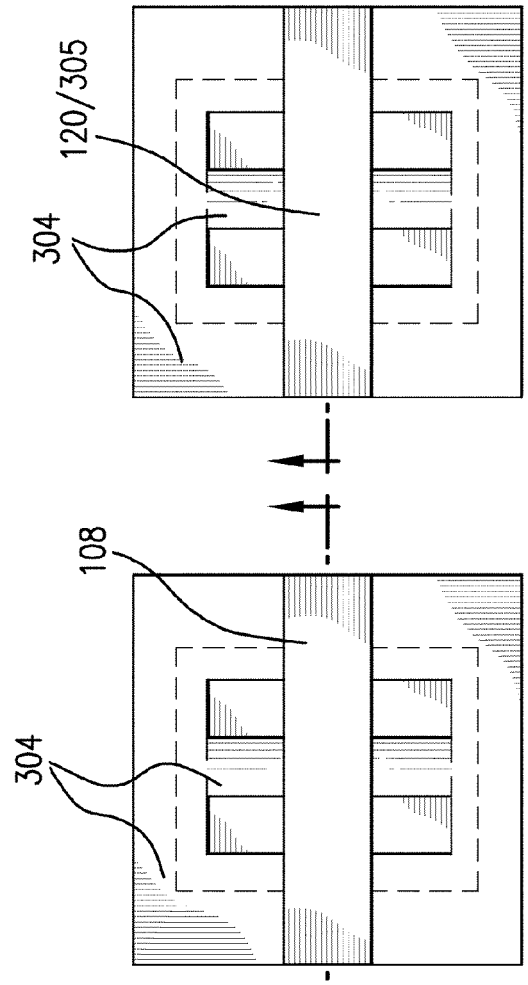
FIG.5B
FIG.5D
FIG.5F

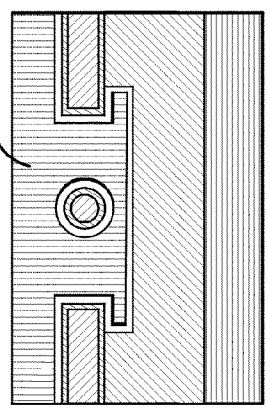
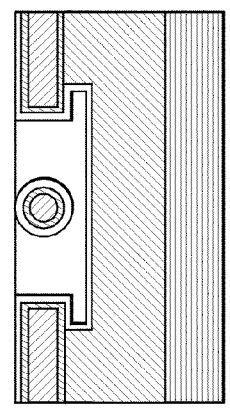
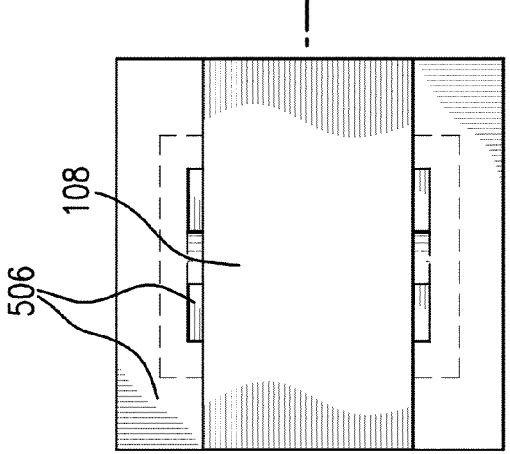
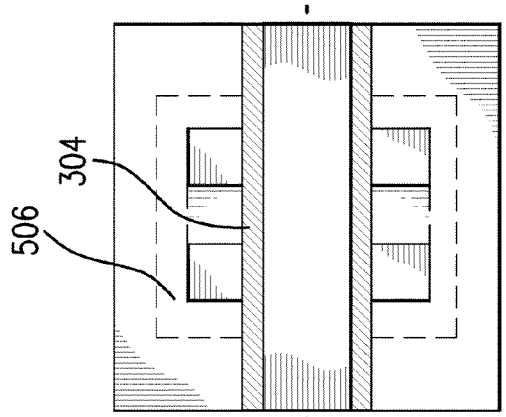
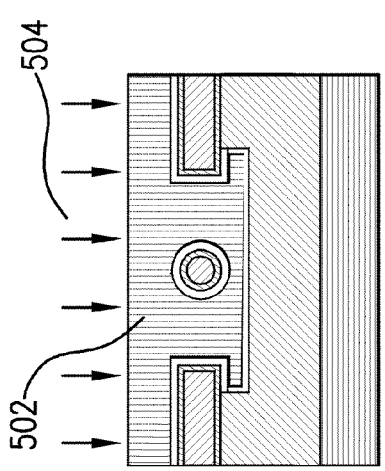
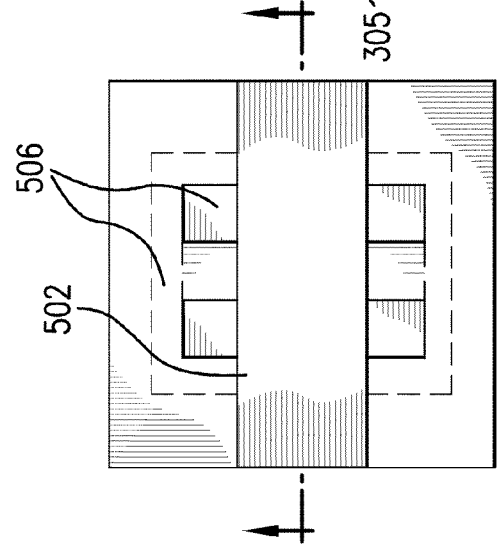

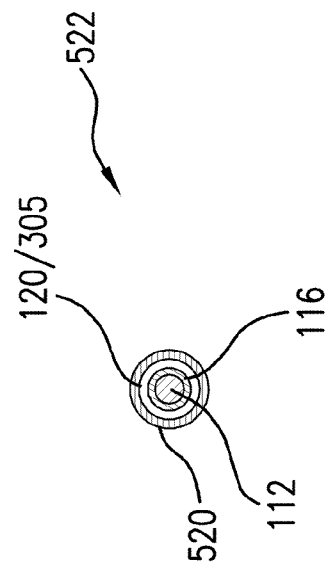
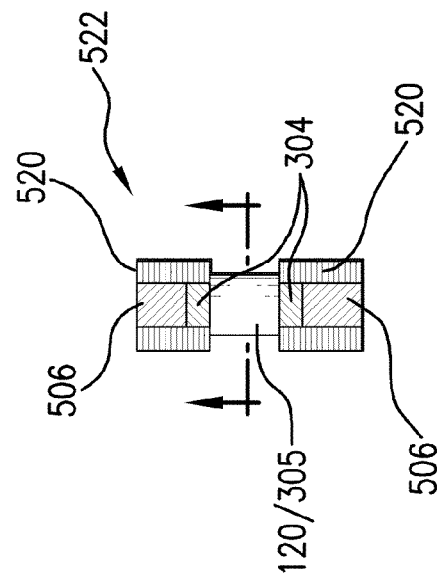
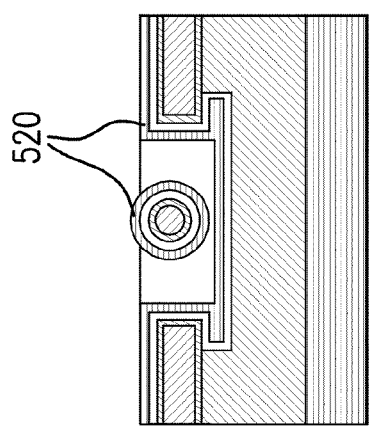
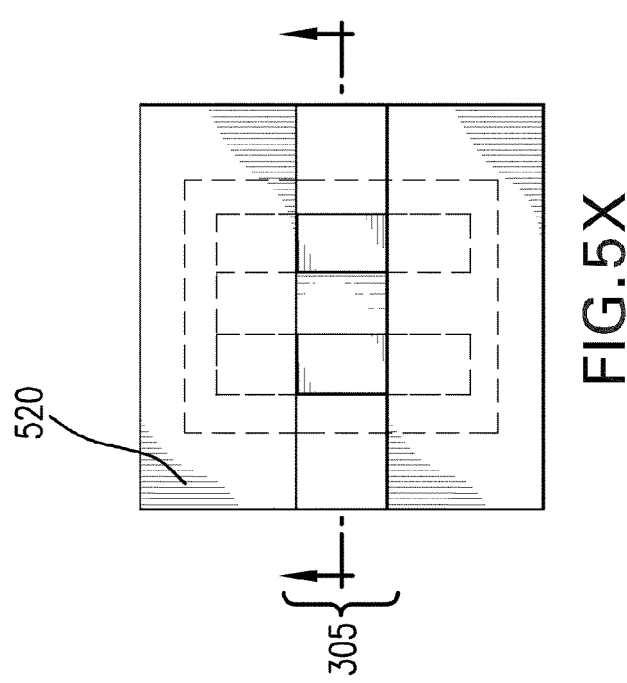

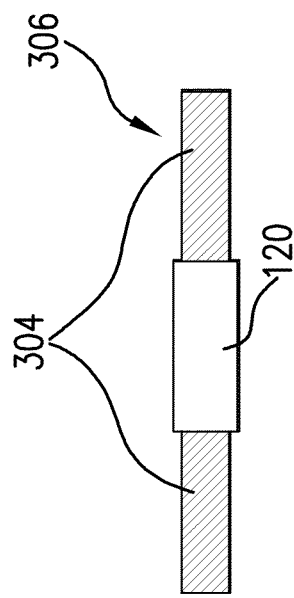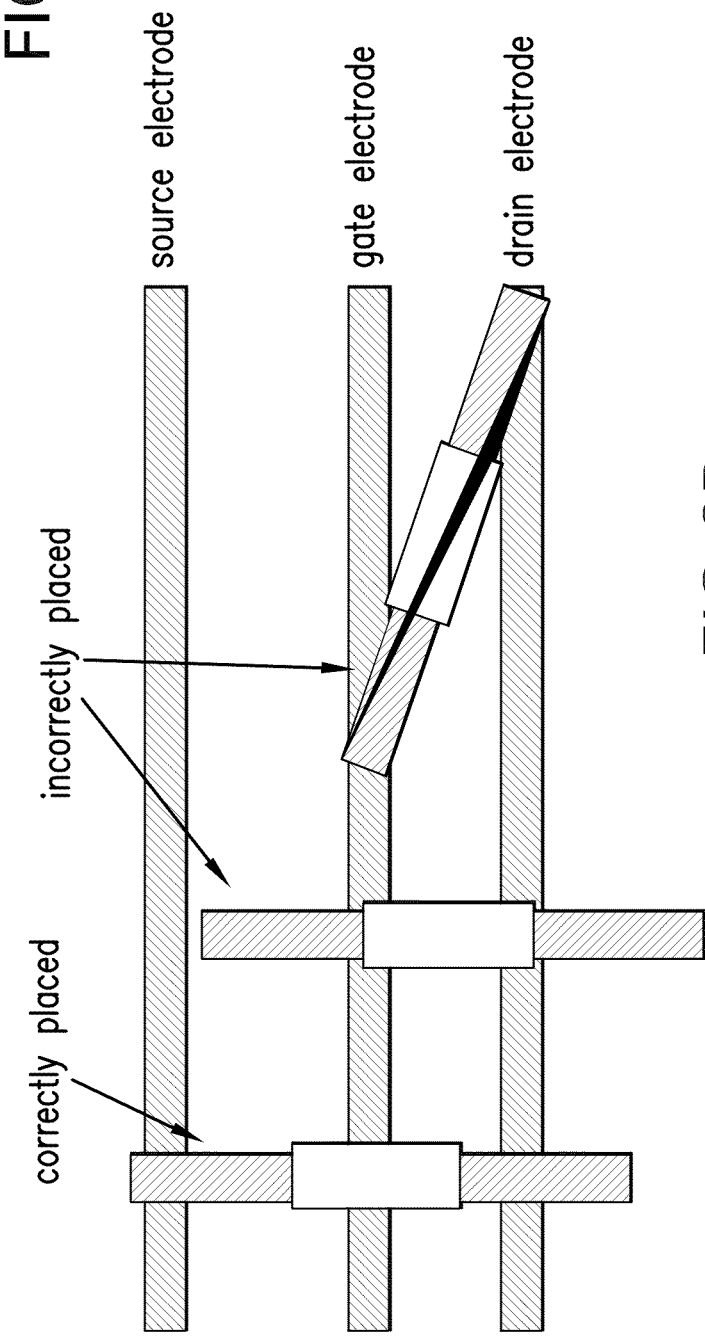

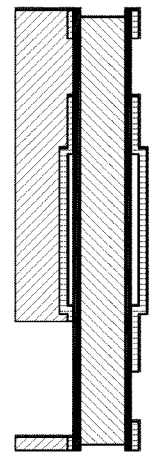
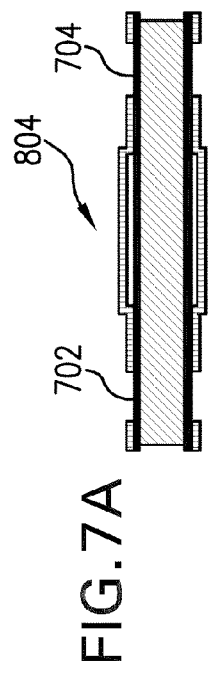
FIG.7A
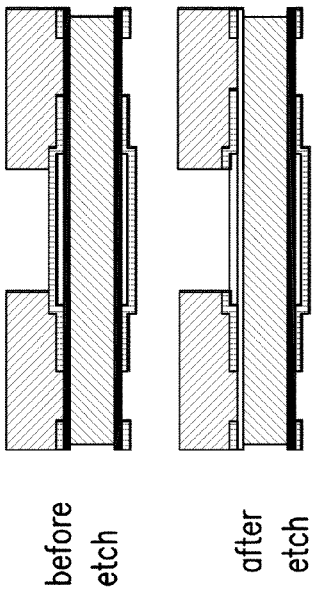
FIG.7B
Gate Via Etch
(selective for 502)
FIG.7C
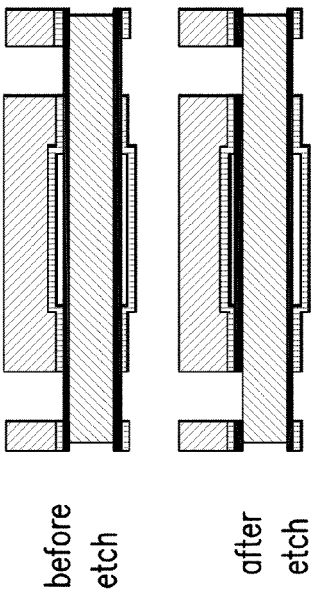
FIG.7D
S/D Via Etch
(selective for 116)
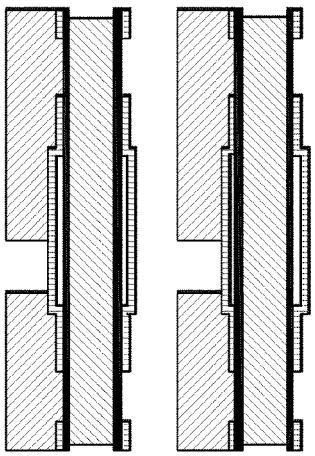
FIG.7E

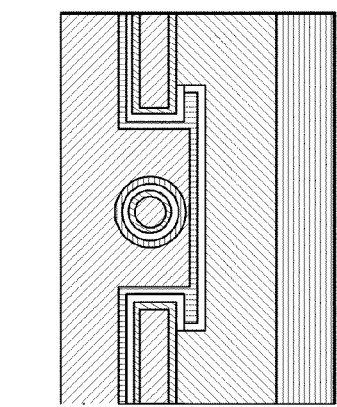
FIG.8E
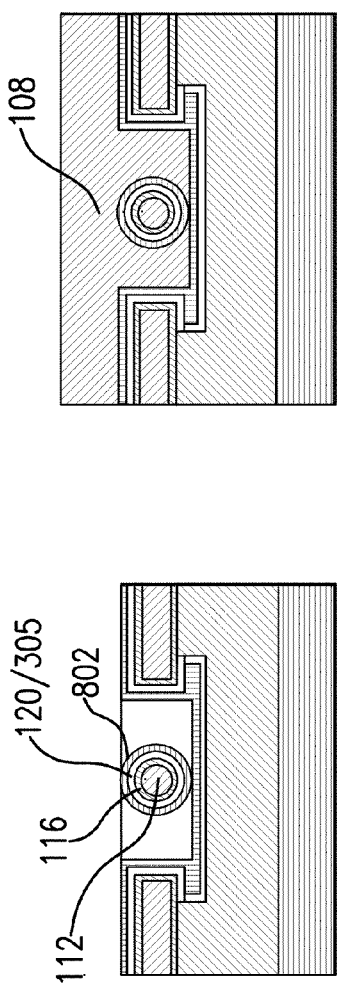
FIG.8C
FIG.8A
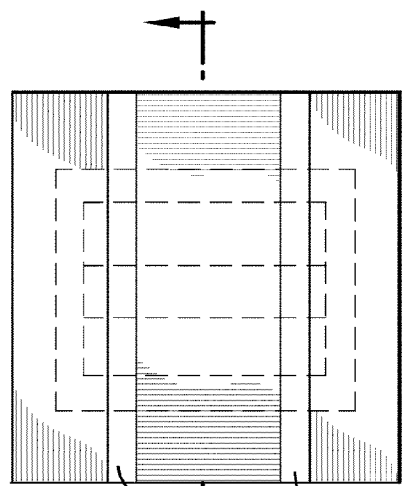
FIG.8F
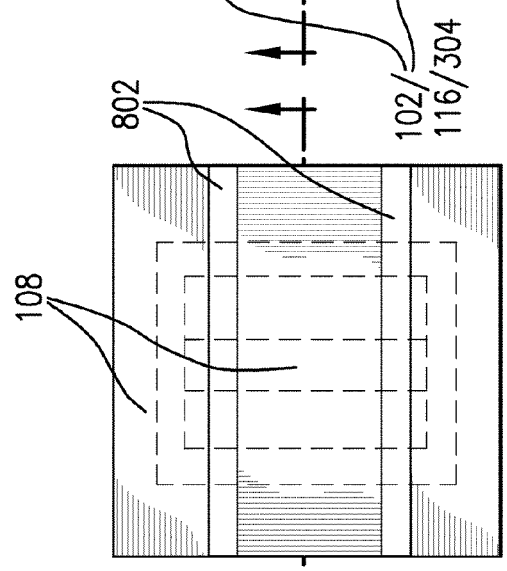
FIG.8D
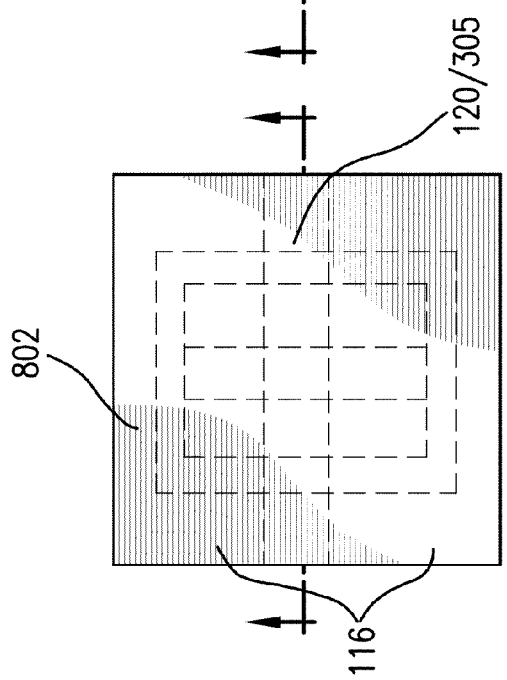
FIG.8B

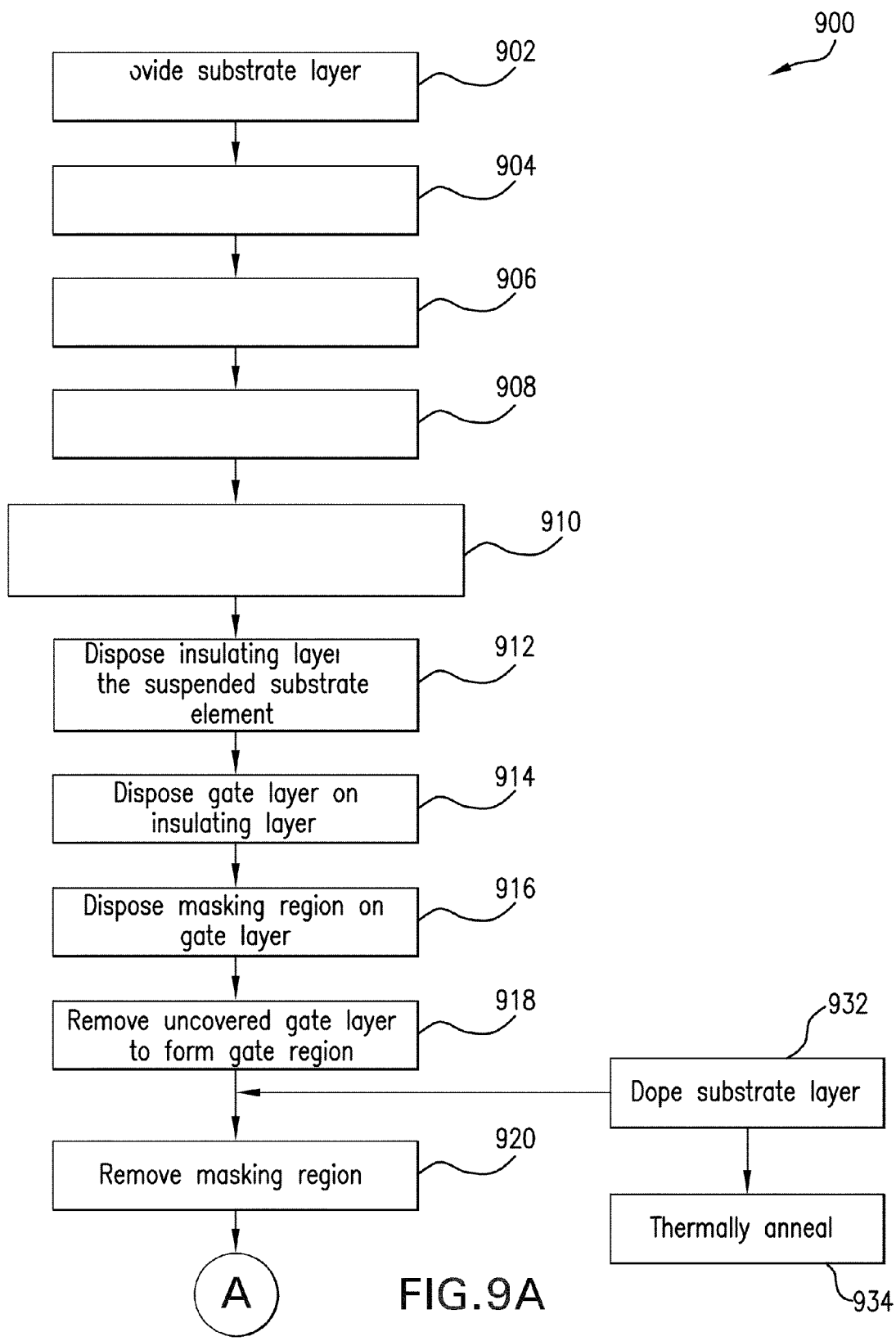

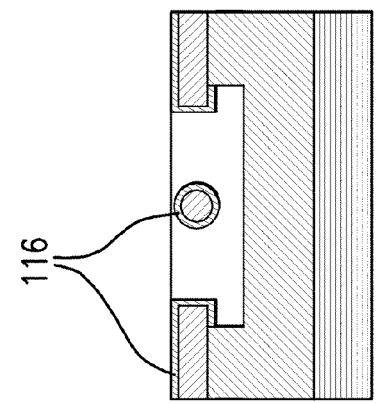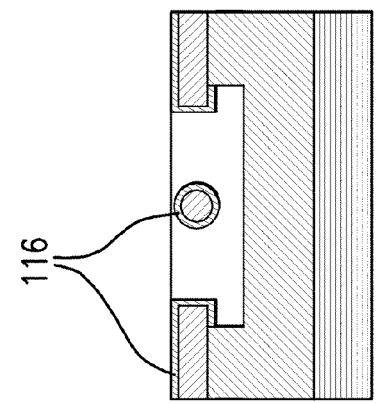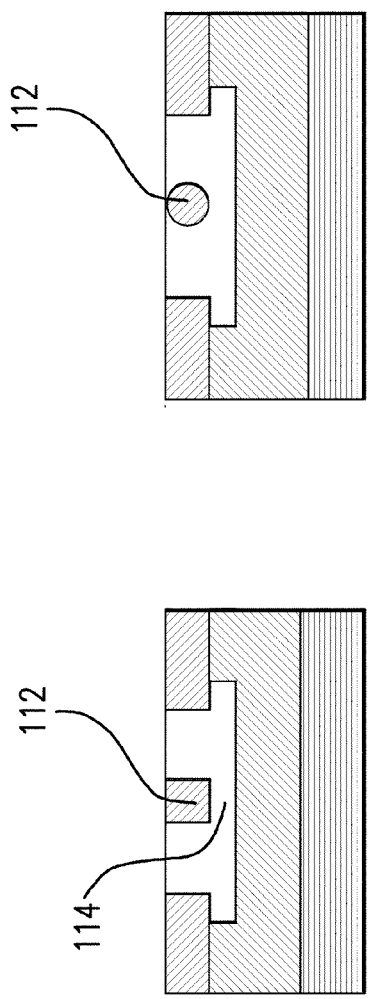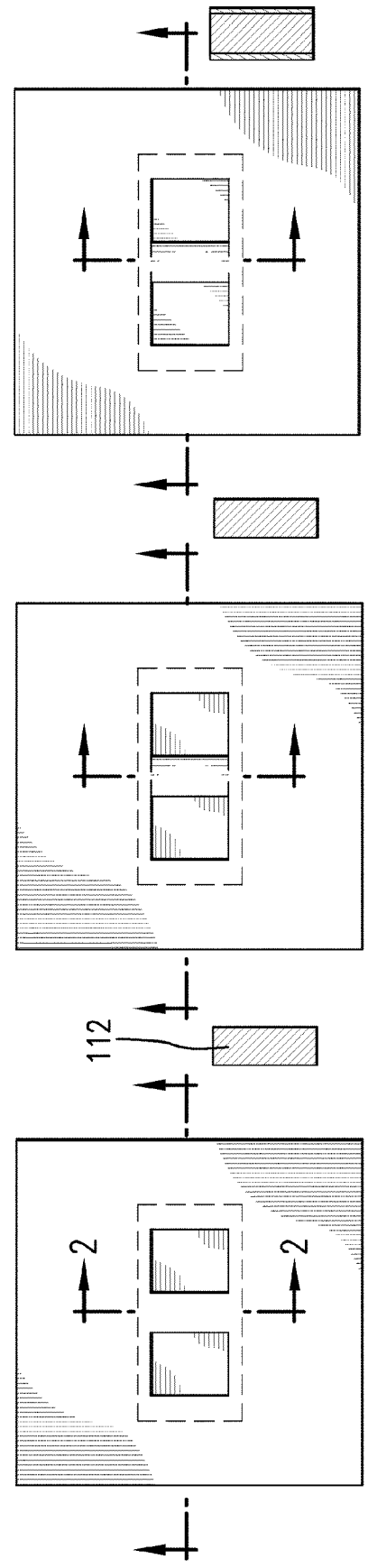

■ = 102  ■ = 108
◨ = 116  □ = 120/305

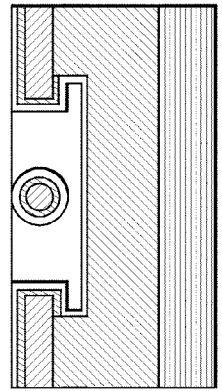
FIG.11A
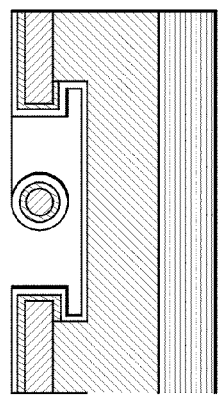
FIG.11C
FIG.11E
■ = 102  ▨ = 108  ▨ = 304
▨ = 116  □ = 120
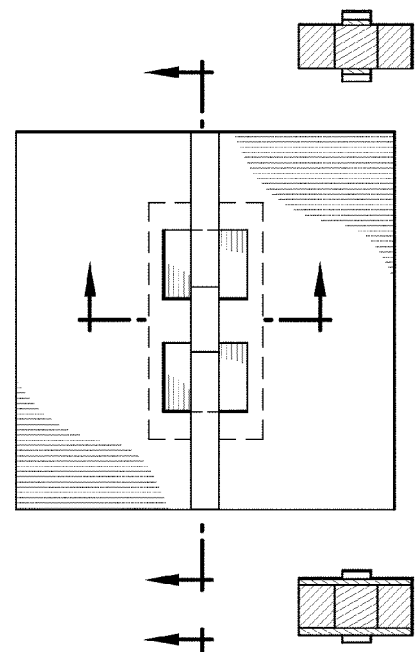
FIG.11B
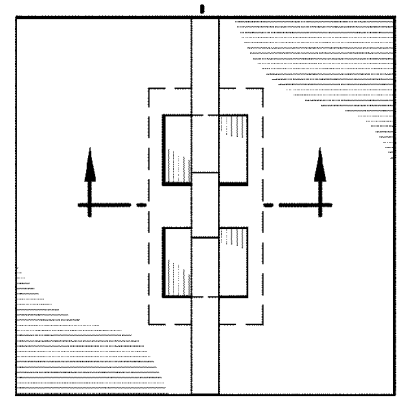
FIG.11D
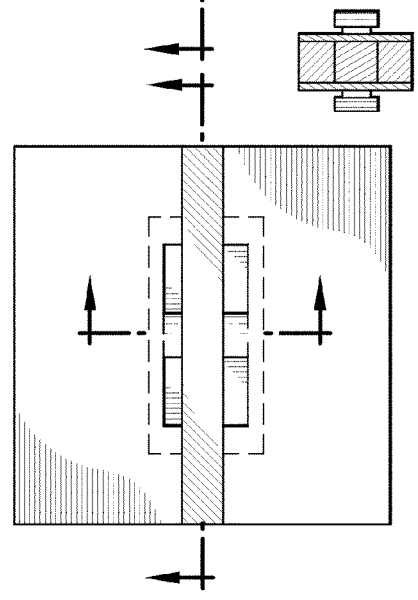
FIG.11F

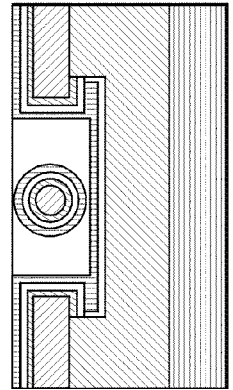
FIG. 12A
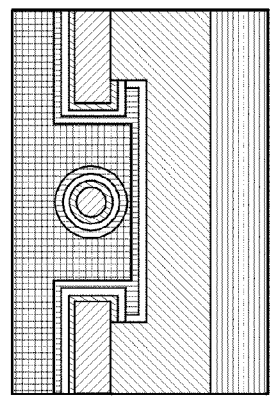
FIG. 12C
FIG. 12E
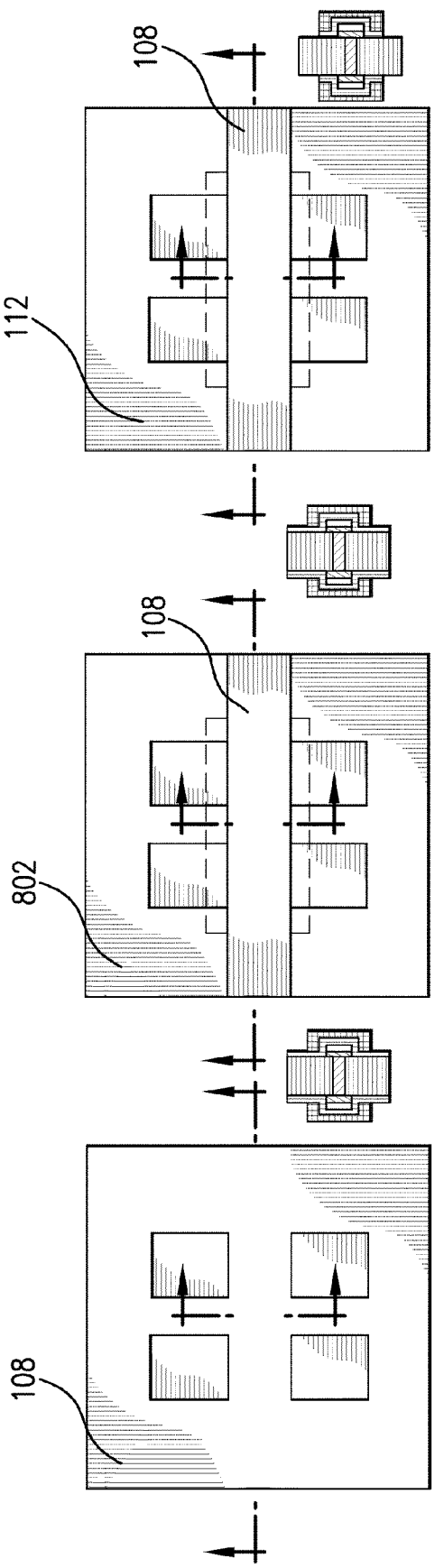
FIG. 12B
FIG. 12D
FIG. 12F

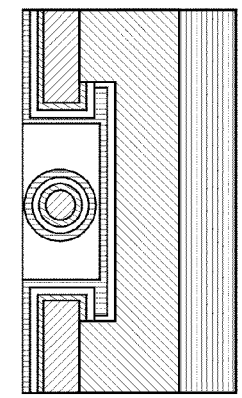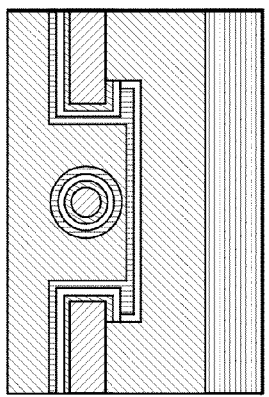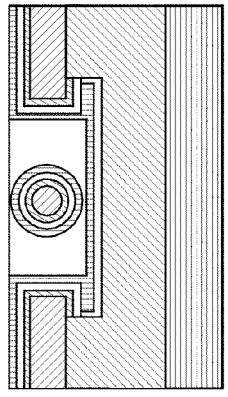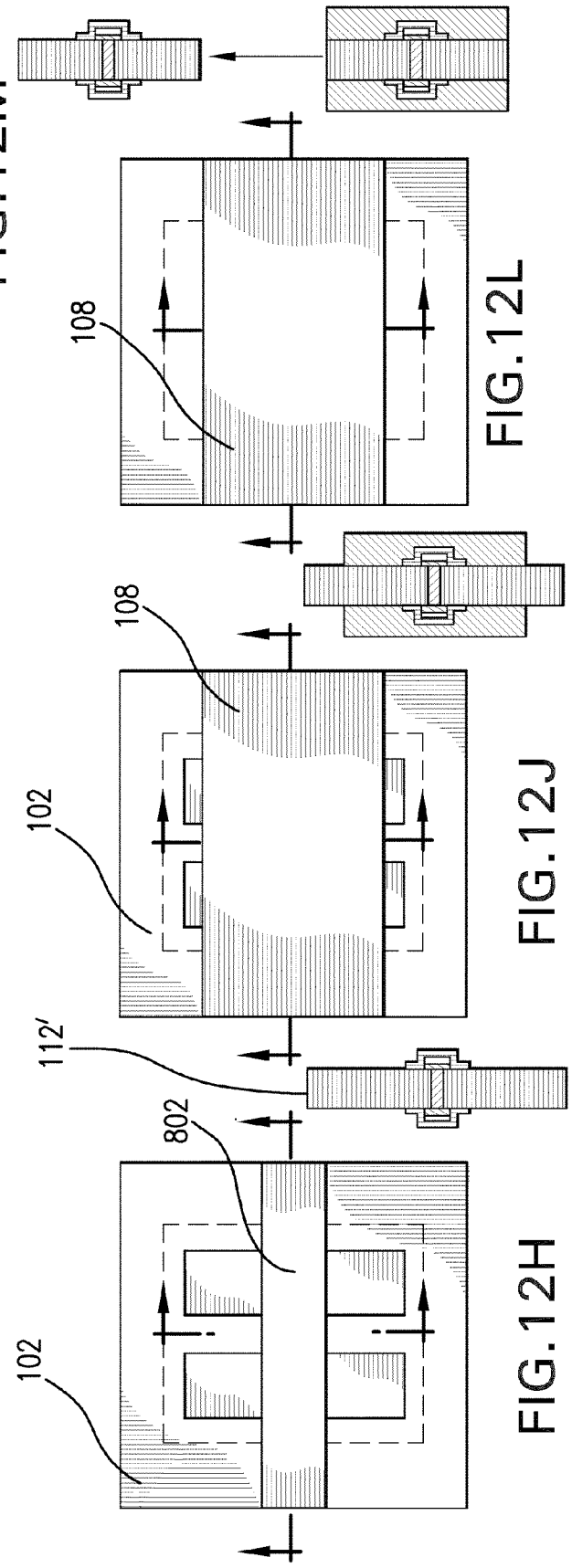

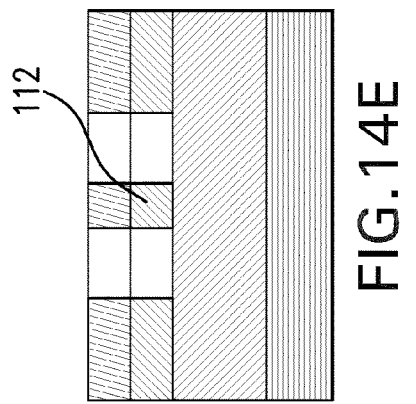
FIG.14A
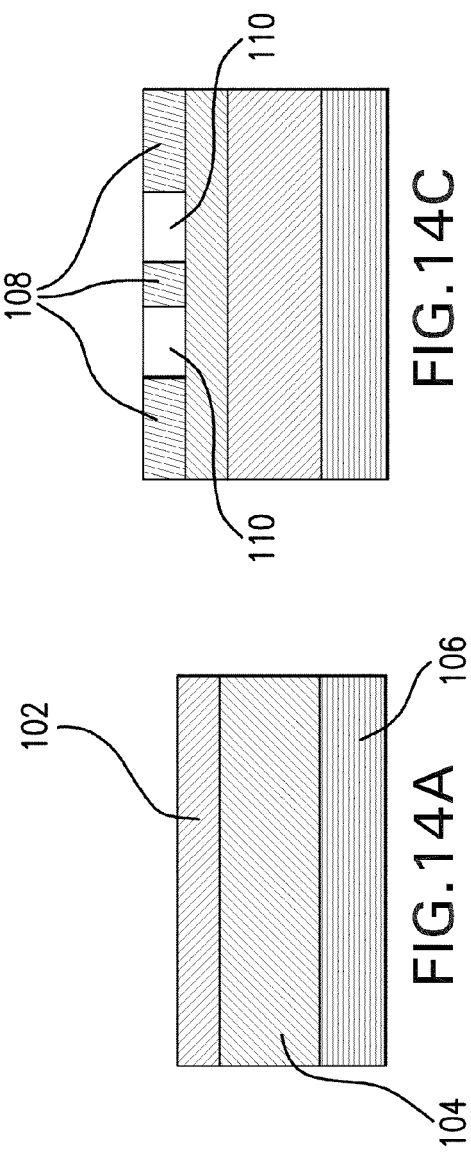
FIG.14C
FIG.14E
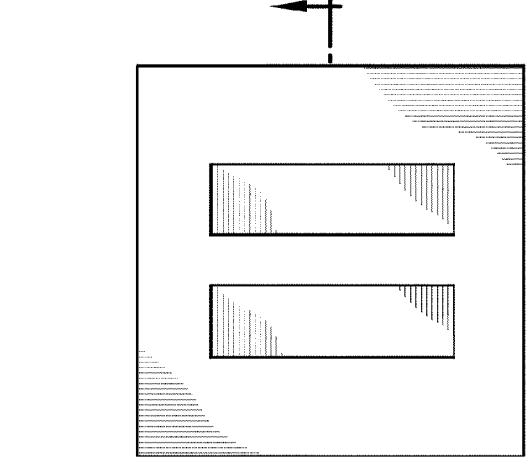
FIG.14B
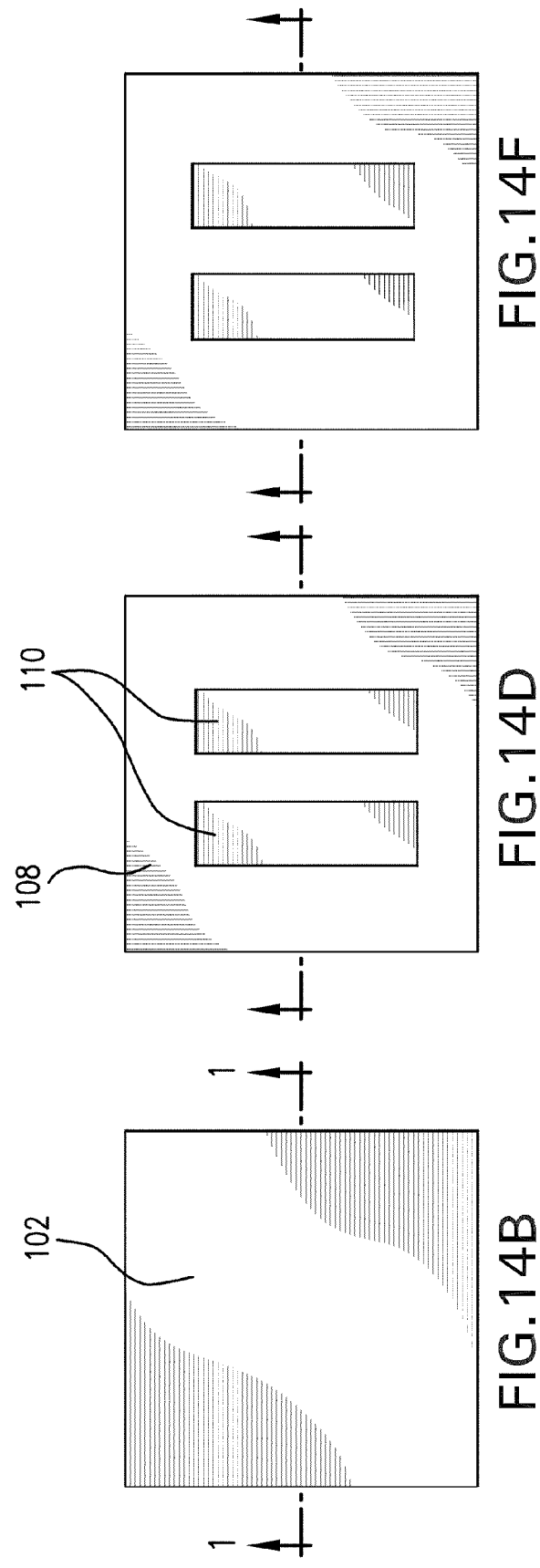
FIG.14D
FIG.14F

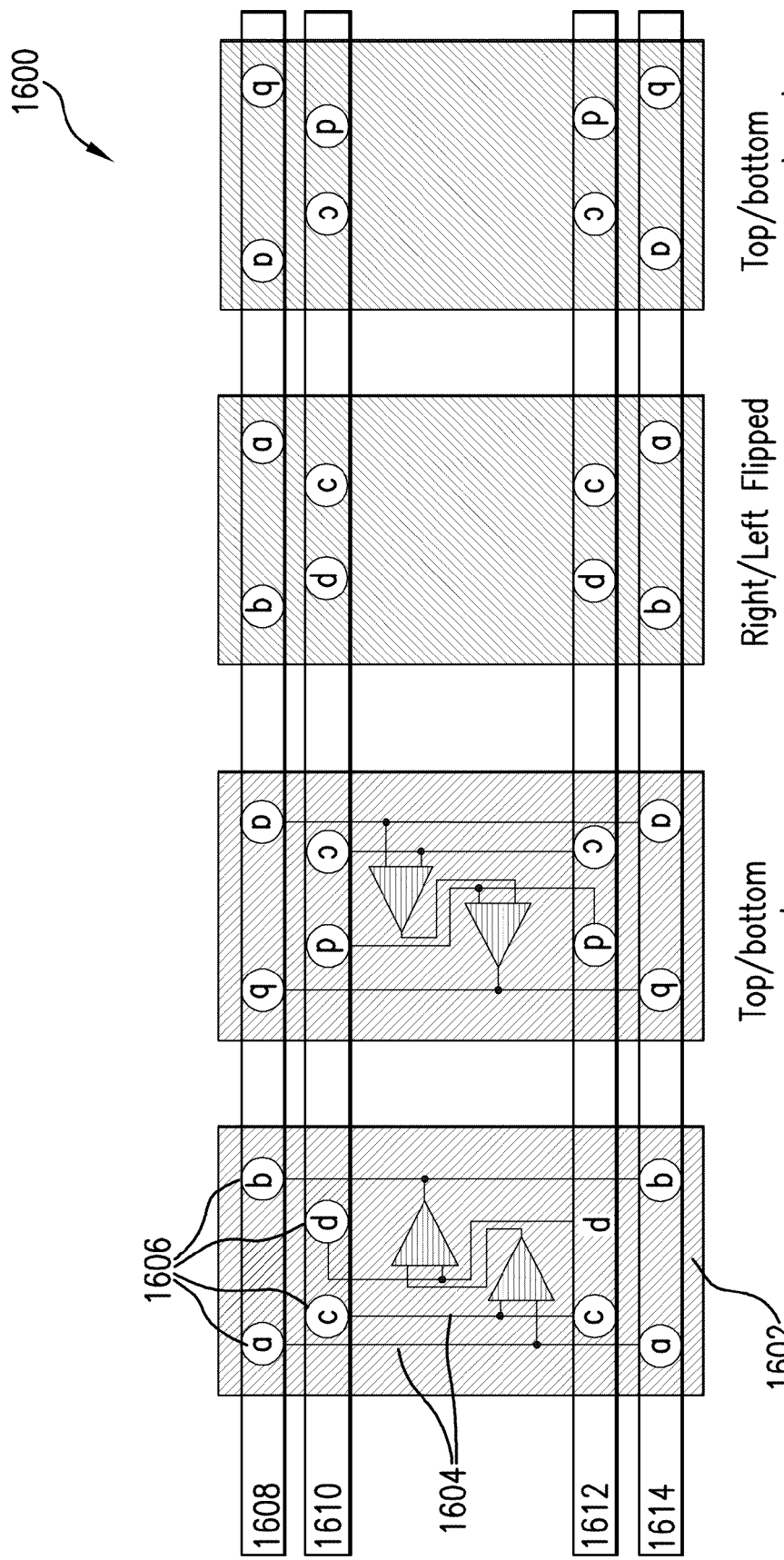

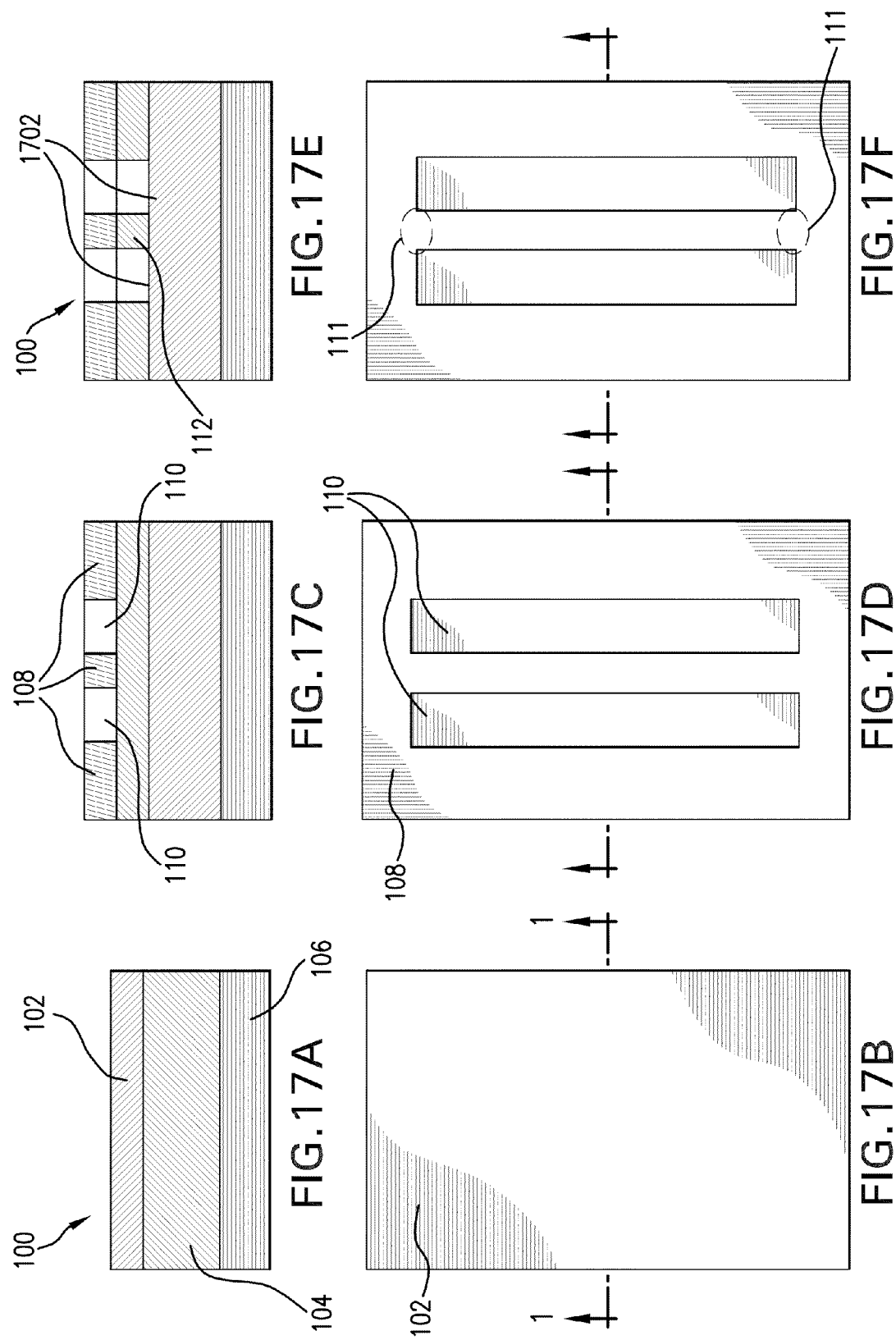

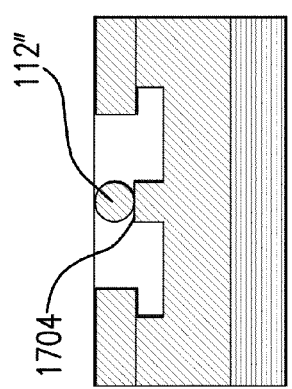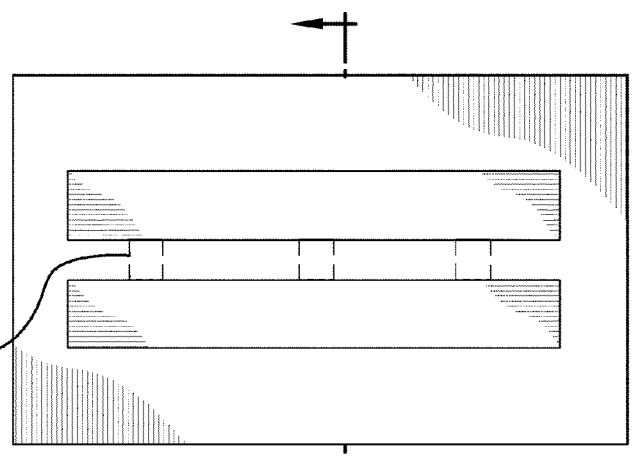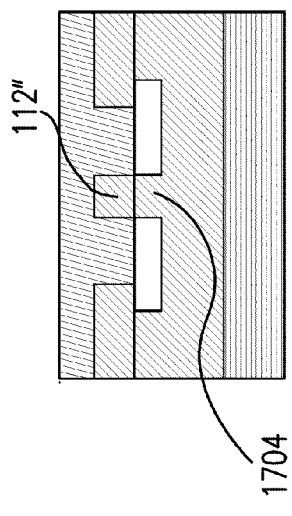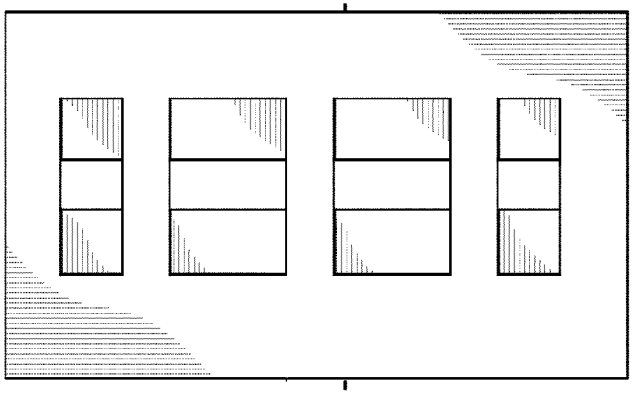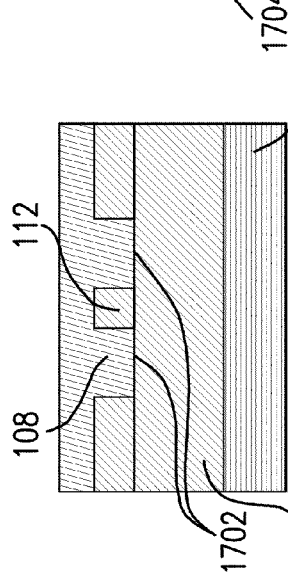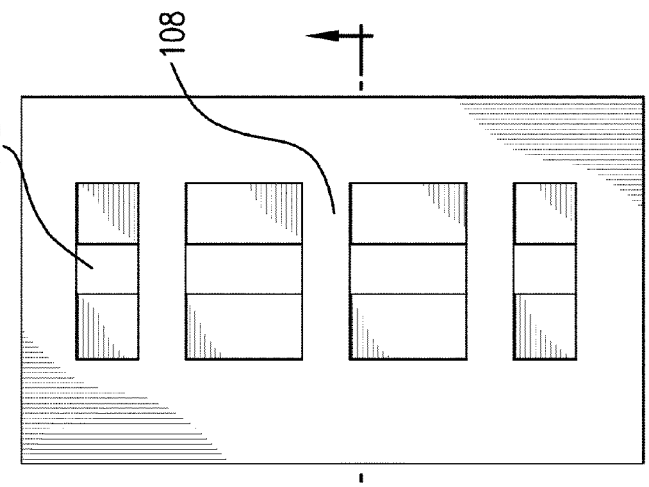

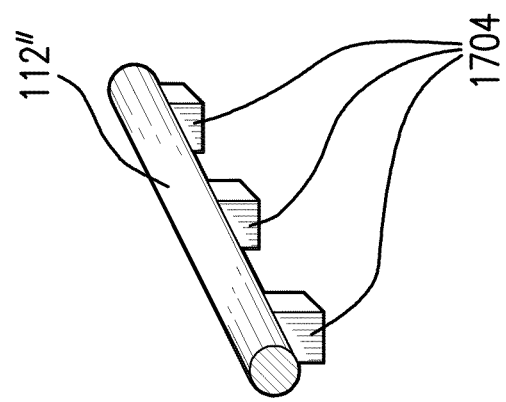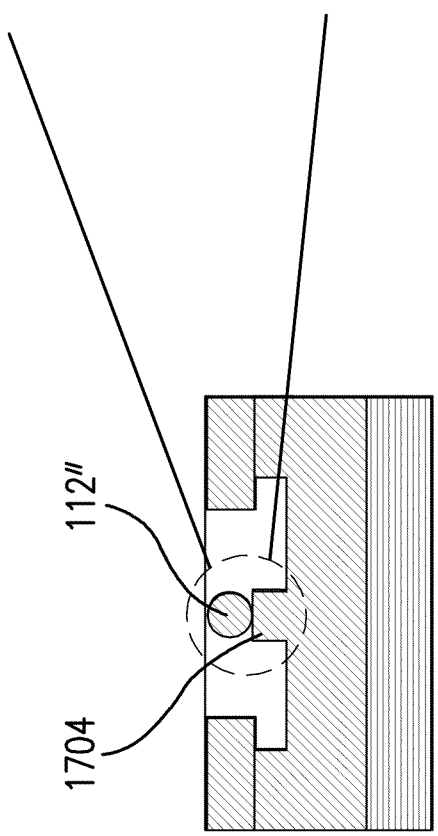
FIG.17N
FIG.17M

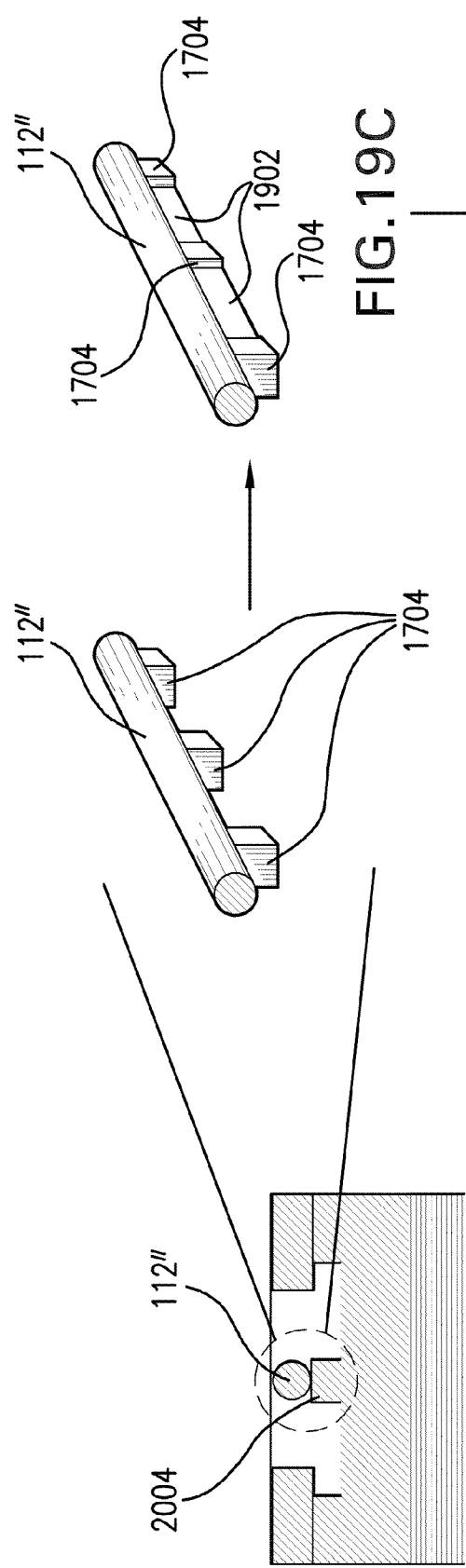

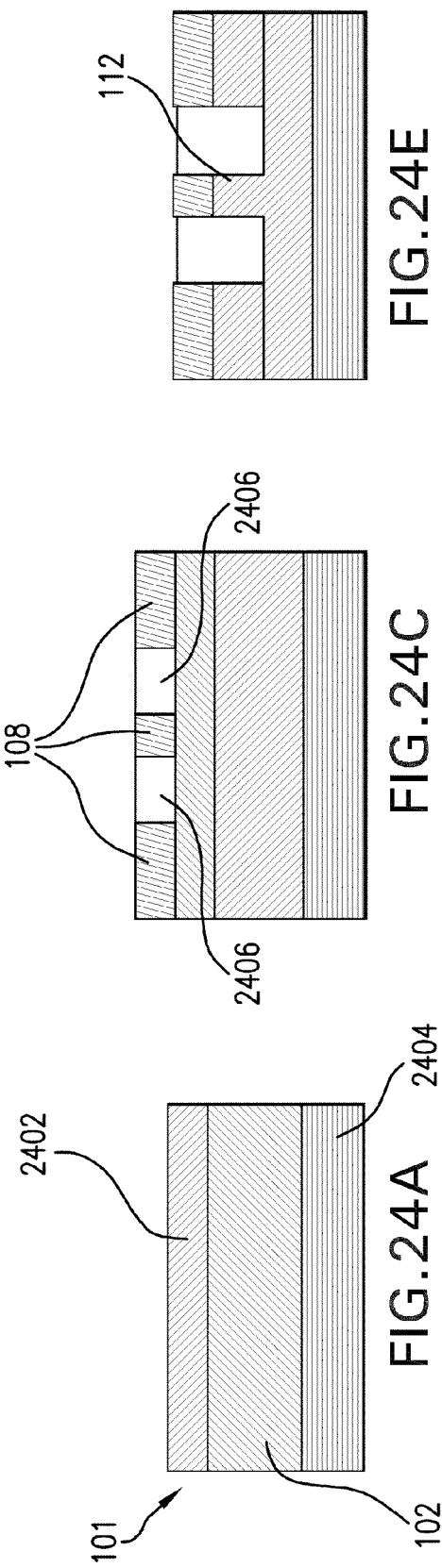

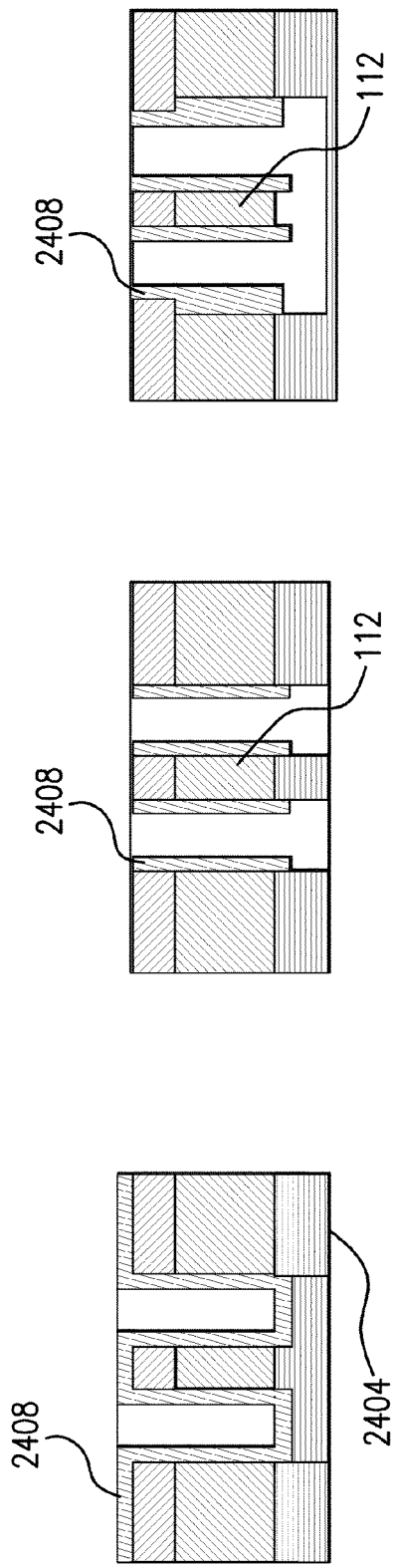
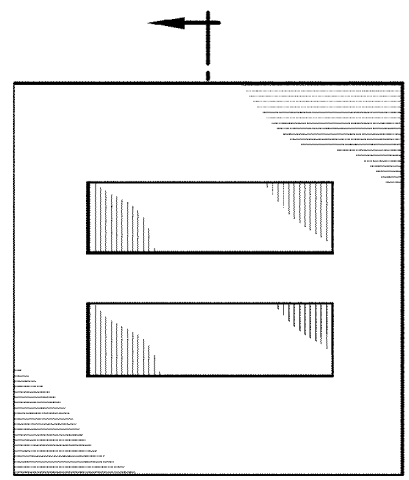
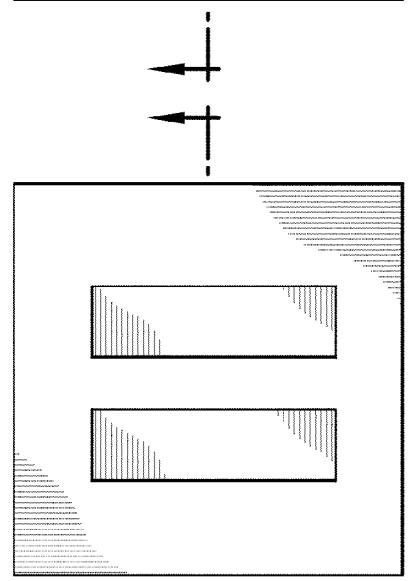
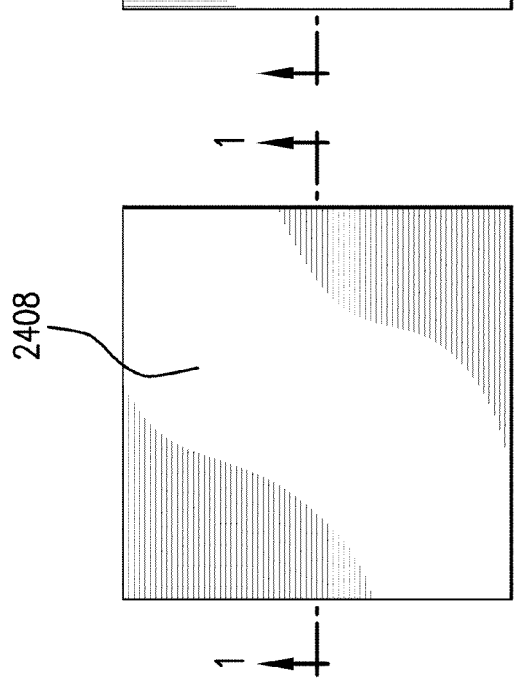
FIG.25A  FIG.25C  FIG.25E
FIG.25B  FIG.25D  FIG.25F

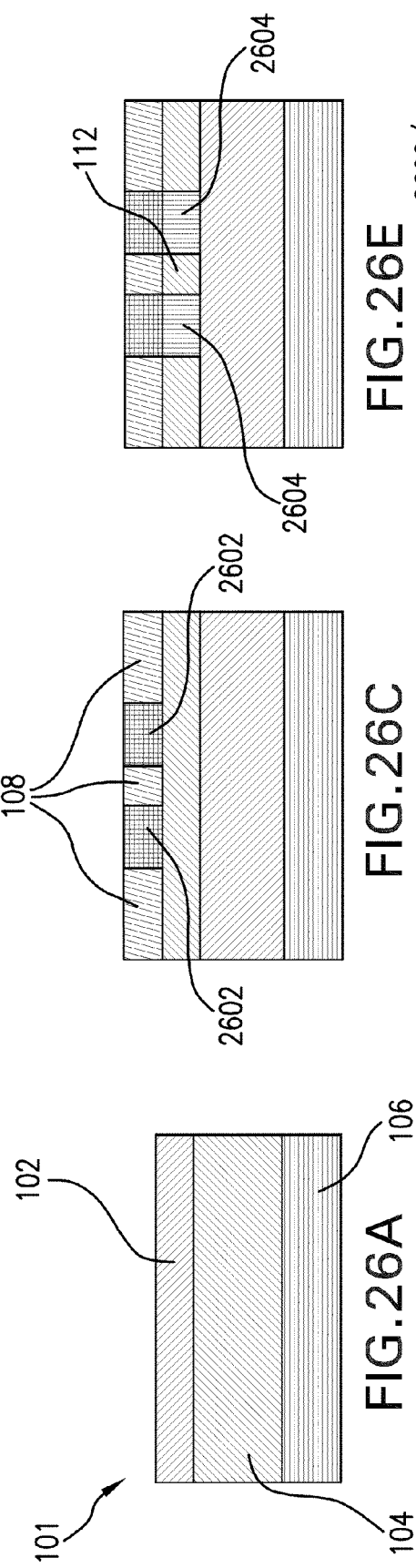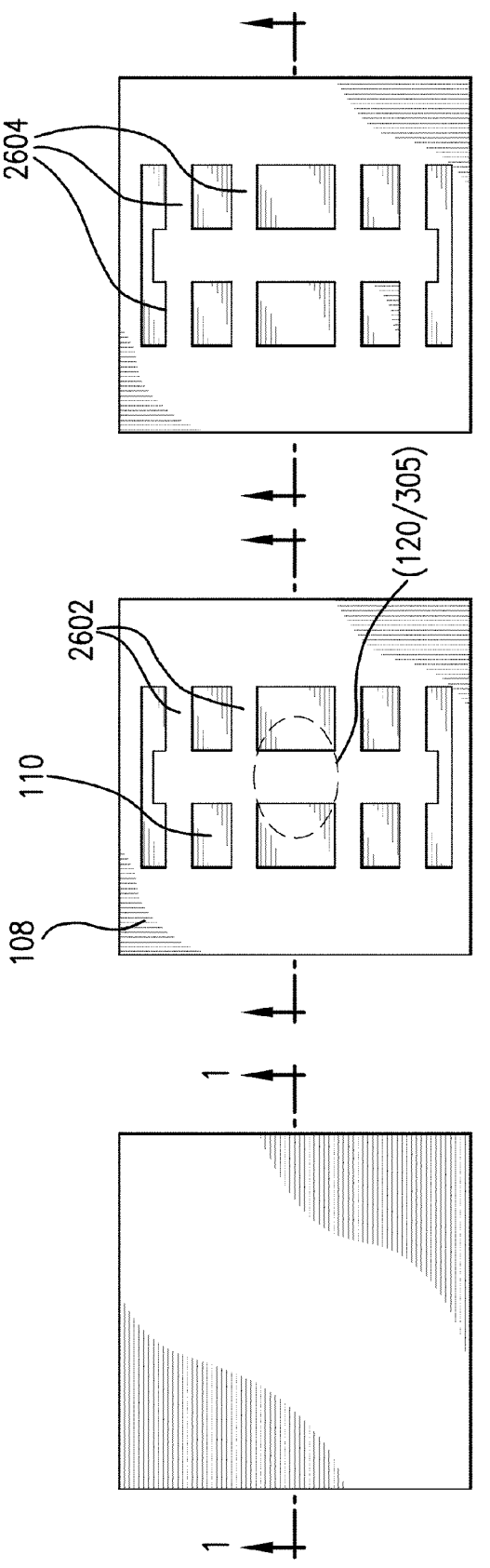

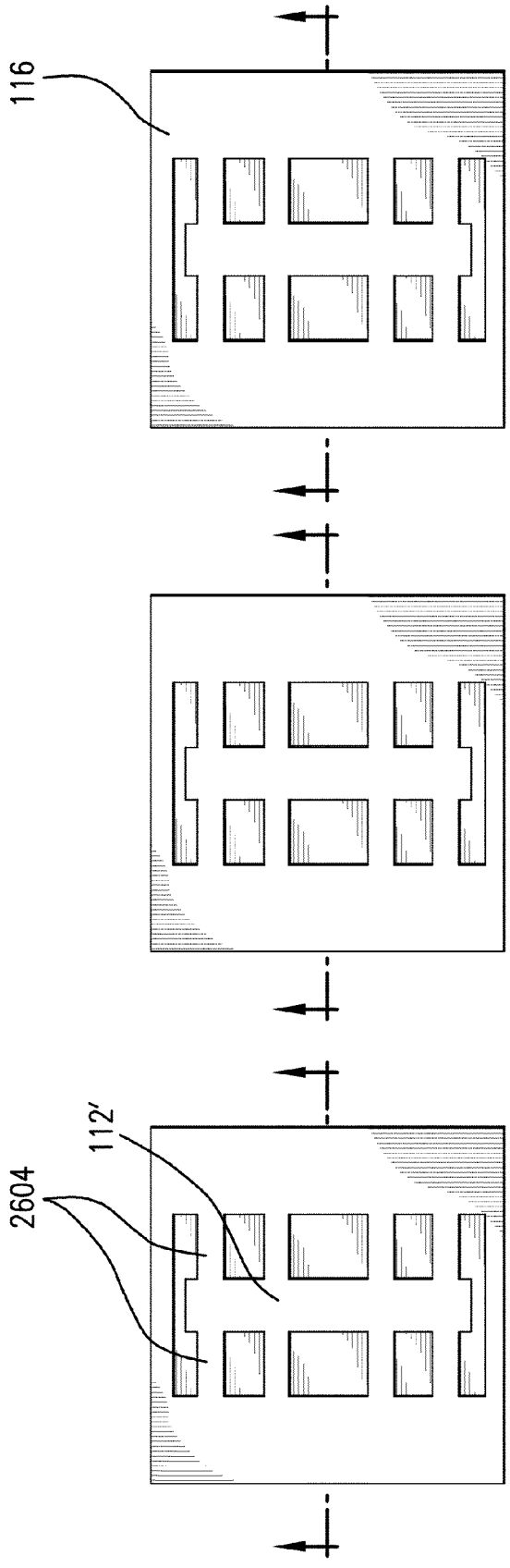

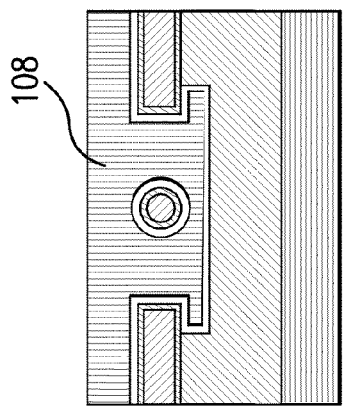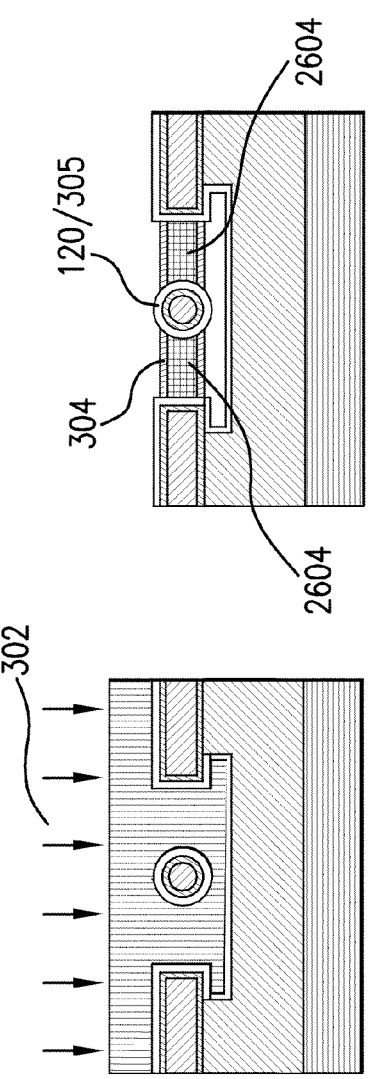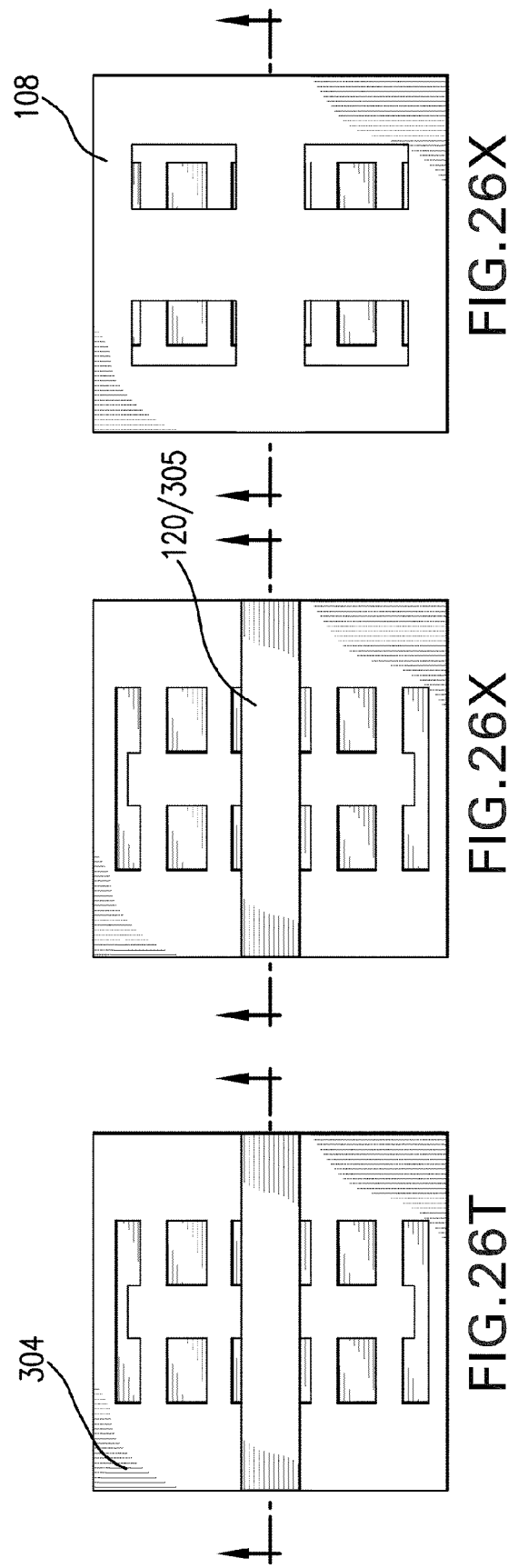

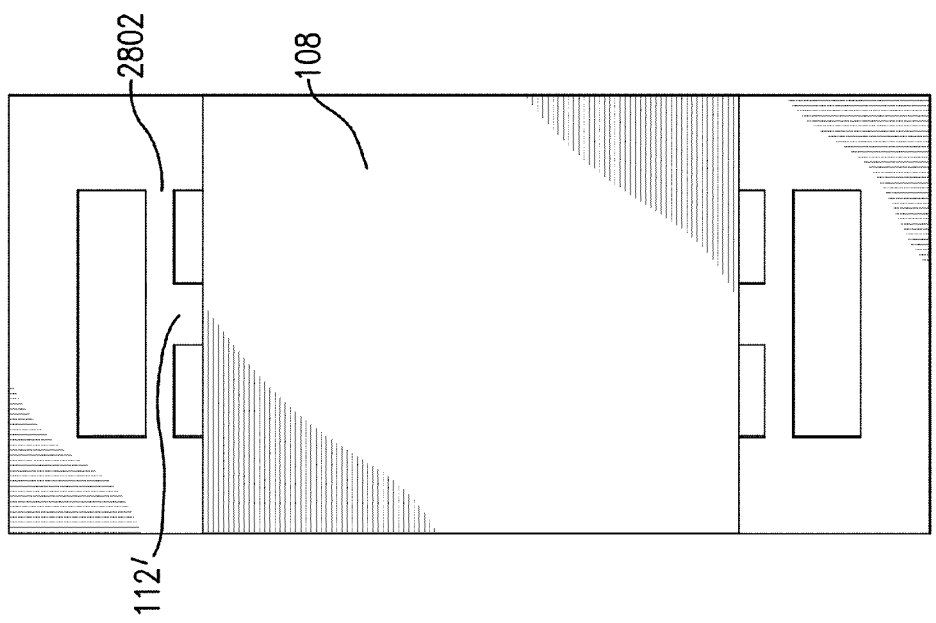
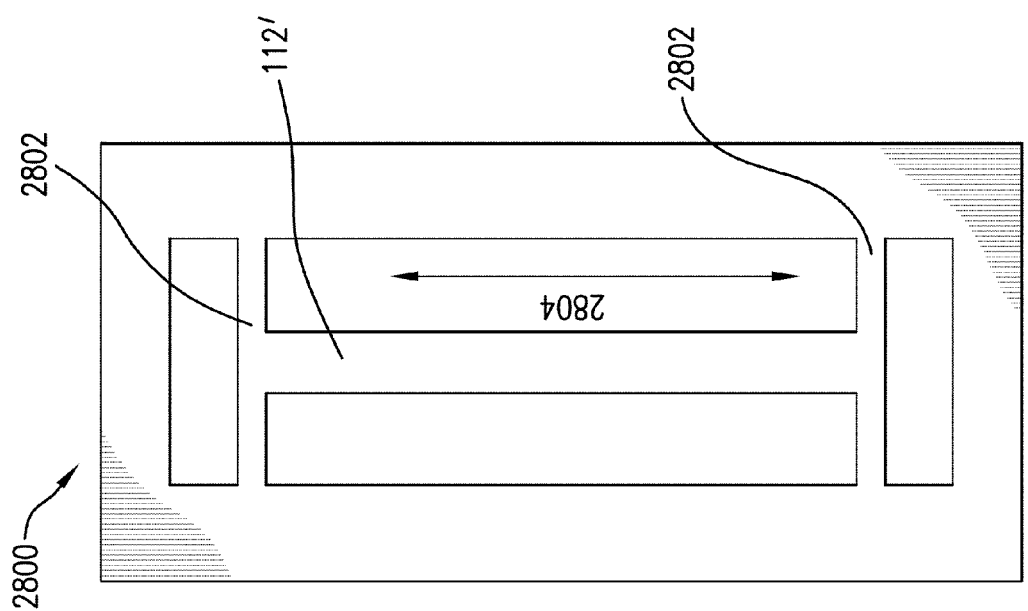
FIG. 28B
FIG. 28A

METHODS FOR FORMATION OF SUBSTRATE ELEMENTS

CROSS-REFERENCE TO RELATED APPLICATIONS

The present application claims the benefit of U.S. Provisional Patent Application No. 61/006,028, filed Dec. 14, 2007, U.S. Provisional Patent Application No. 61/064,363, filed Feb. 29, 2008, and U.S. Provisional Patent Application No. 61/064,954, filed Apr. 4, 2008, the disclosures of each of which are incorporated by reference herein in their entireties.

STATEMENT REGARDING FEDERALLY SPONSORED RESEARCH

This invention was made with Government support under W911QY-06-C-0099 awarded by the United States Government, United States Special Operations Command. The Government has certain rights in the invention.

BACKGROUND OF THE INVENTION

1. Field of the Invention

The present invention relates to methods of forming substrate elements, including semiconductor elements such as nanowires, transistors and other structures, as well as the elements formed by such methods.

2. Background of the Invention

Methods of fabricating electronic components, such as nanowires and transistors, have historically been performed using metal-catalyzed vapor-liquid-solid (VLS) growth techniques, followed by subsequent device fabrication, for example, on a second substrate. The VLS approach, however, limits the types of devices that can be fabricated. For example, it is difficult to pattern gate or other electrodes on the VLS growth wafer as the structures are typically in a vertical orientation. In addition, it is difficult to create self-aligned source and drain doped structures, which are standard features of conventional metal oxide semiconductor (MOS) transistors. It is also challenging to create structures with lightly doped drain regions using traditional VLS techniques. In general, the vertical orientation of VLS-produced structures (e.g., nanowires) precludes many of the standard patterning techniques that are widely used in the semiconductor industry.

Furthermore, VLS growth utilizes metal catalysis, which often leads to contamination of the formed structures and does not allow for precise control of dimensions or surface smoothness.

What is needed therefore are methods for the production of substrate elements that overcome these deficiencies.

BRIEF SUMMARY OF THE INVENTION

The present invention fulfills needs noted above by providing methods for forming substrate elements, including electronic components such as nanowires and transistors.

In an embodiment, the present invention provides methods for forming one or more substrate elements. In suitable embodiments, a substrate layer disposed on a support layer is provided. One or more masking regions are then disposed on the substrate layer to cover at least a portion of the substrate layer. One or more uncovered substrate layer sections are then removed. Next, at least a portion of the support layer beneath the substrate layer is removed, thereby forming one or more suspended substrate elements, wherein the suspended substrate elements remain attached to the substrate layer (in suitable embodiments, via one or more lateral support tabs) and can be processed prior to removal. The substrate elements are then removed.

In exemplary embodiments, the substrate layer comprises a semiconductor (e.g., silicon) and the support layer comprises a semiconductor oxide (e.g., silicon oxide). In further embodiments, the support layer comprises a semiconductor alloy (e.g., SiGe) or a doped semiconductor (e.g., doped Si). In suitable embodiments, the masking regions described herein are photolithography masks and the removal of the various layers occurs through etching (including isotropic and anisotropic etching). The final removal step can also comprise masking and etching to remove the substrate elements. In other embodiments, sonicating or mechanical cutting can be used to remove substrate elements.

Examples of methods of processing the substrate elements include disposing various layers on the elements, such as insulator layers (e.g., oxide layers) and then gate layers on the insulator layers (e.g., metals or polysilicon). Additional processing can also include light and heavy doping of the elements, as well as the addition of a protective layer, such as a nitride layer.

The present invention also provides nanowires prepared by the various processes described herein, including nanowires comprising a semiconductor core, an oxide layer and a metal or polysilicon outer shell. The present invention also provides transistor components that can be prepared by the various processes of the present invention.

The present invention also provides methods for forming one or more substrate elements where the substrate elements are not suspended during processing. Suitably, a substrate layer disposed on a support layer is provided, and then one or more masking regions are disposed on the substrate layer to cover at least a portion of the substrate layer. One or more uncovered substrate layer sections are then removed, thereby forming one or more substrate elements. The substrate elements are then processed (e.g., disposing various layers, doping, etc.) prior to removal.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 6A-6B show schematics demonstrating correctly and incorrectly-placed transistor elements.

FIGS. 7A-7E show schematics illustrating a selective etching process in accordance with one embodiment of the present invention.

FIGS. 8A-8L show schematics of a further method of forming substrate elements in accordance with one embodiment of the present invention.

FIGS. 9A-9B show a flowchart of a still further method of forming substrate elements in accordance with one embodiment of the present invention.

FIGS. 11A-11J show schematics of a method of forming substrate elements, continued from FIGS. 10A-10R, in accordance with one embodiment of the present invention.

FIGS. 12A-12M show schematics of a method of forming substrate elements, continued from FIGS. 11A-11J, in accordance with one embodiment of the present invention.

FIGS. 16A-16D show methods of forming two-dimensional die circuits in accordance with one embodiment of the present invention.

FIGS. 17A-17N show schematics of a method for forming substrate elements utilizing support members in accordance with one embodiment of the present invention.

FIGS. 19A-19E show schematics of a method of removing substrate elements in accordance with one embodiment of the present invention.

FIGS. 25A-25H show schematics of a method of forming substrate elements in accordance with one embodiment of the present invention.

Figure 26M:
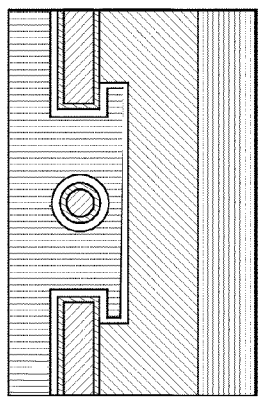
Figure 26O:
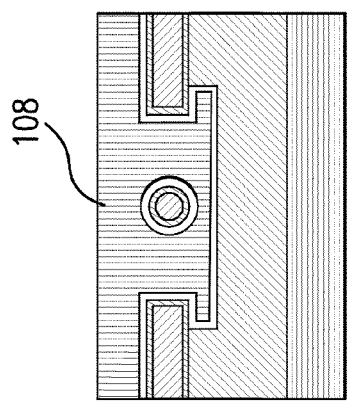
Figure 26Q:
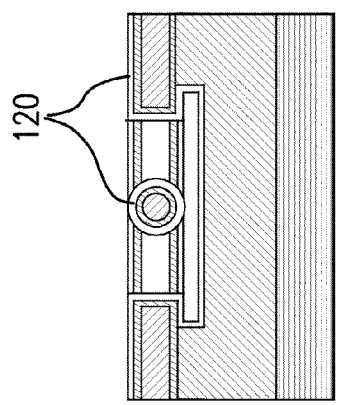
Figure 26R:
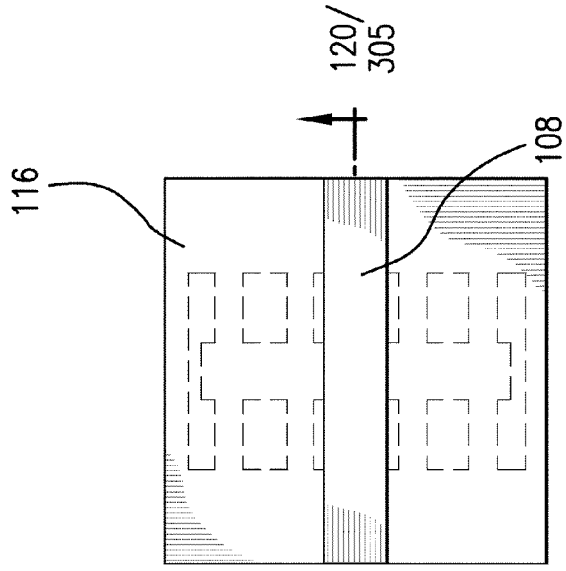
Figure 26P:
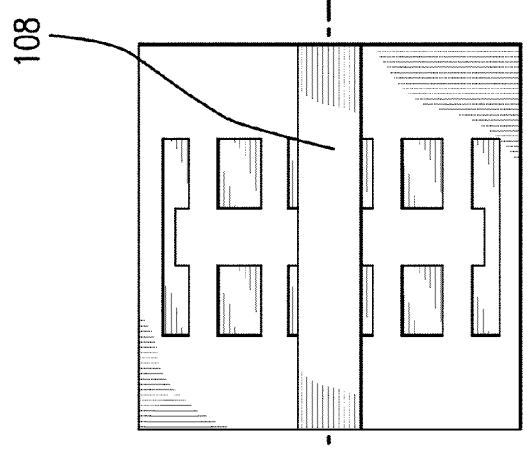
Figure 26N:
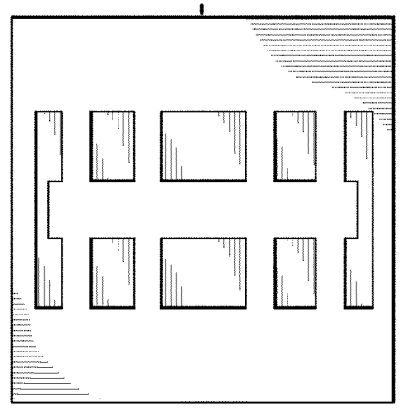
Figure 26A:
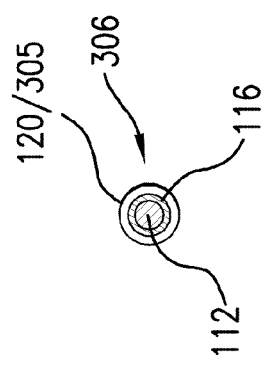
Figure 26A:
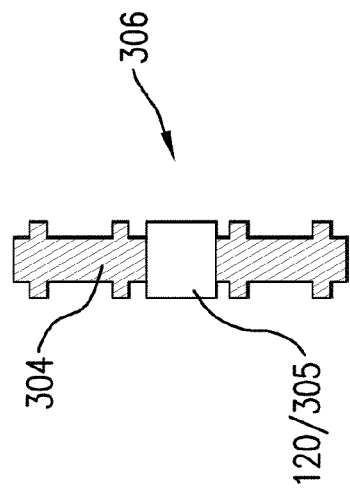

FIGS. 26A-26AB show schematics of a method of forming substrate elements, utilizing lateral support tabs, in accordance with one embodiment of the present invention.

Figure 27:
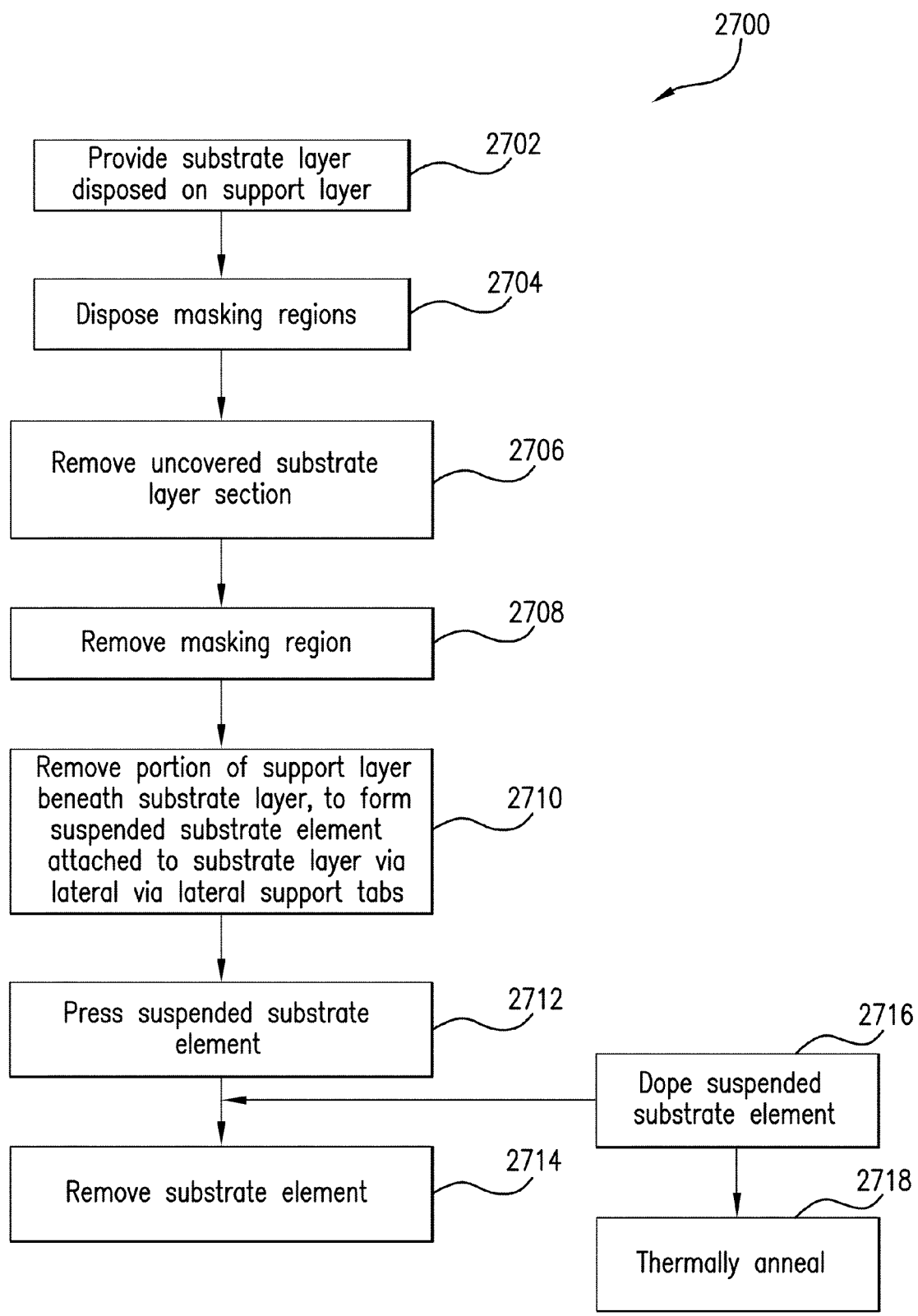

FIG. 27 shows a flowchart of a method of forming substrate elements, utilizing lateral support tabs, in accordance with one embodiment of the present invention.

FIGS. 28A-28B show schematics of a method of forming substrate elements using a stress-relief structure in accordance with one embodiment of the present invention.

Figure 29B:
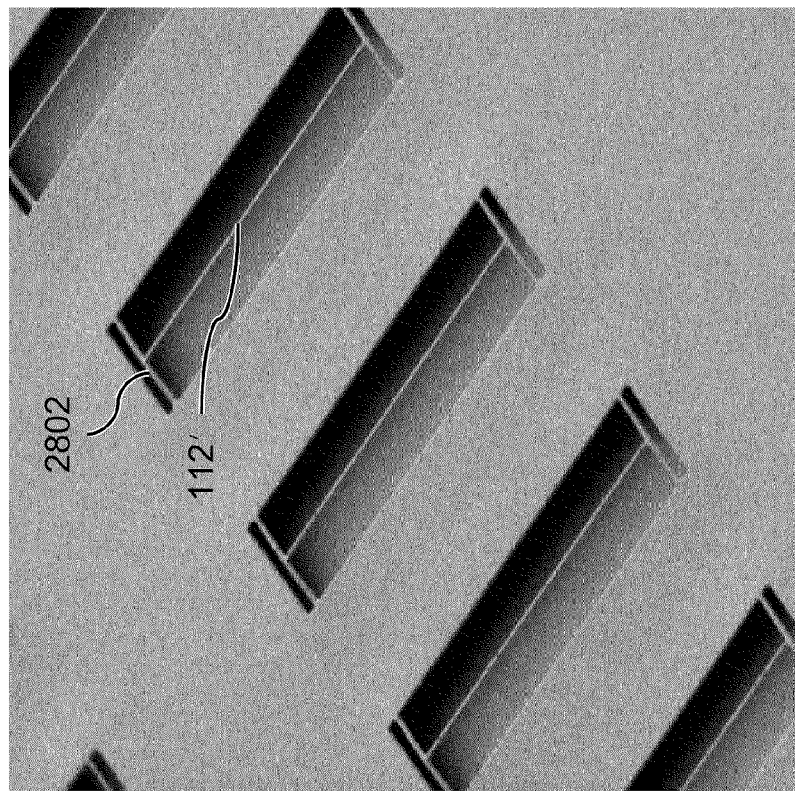
Figure 29A:
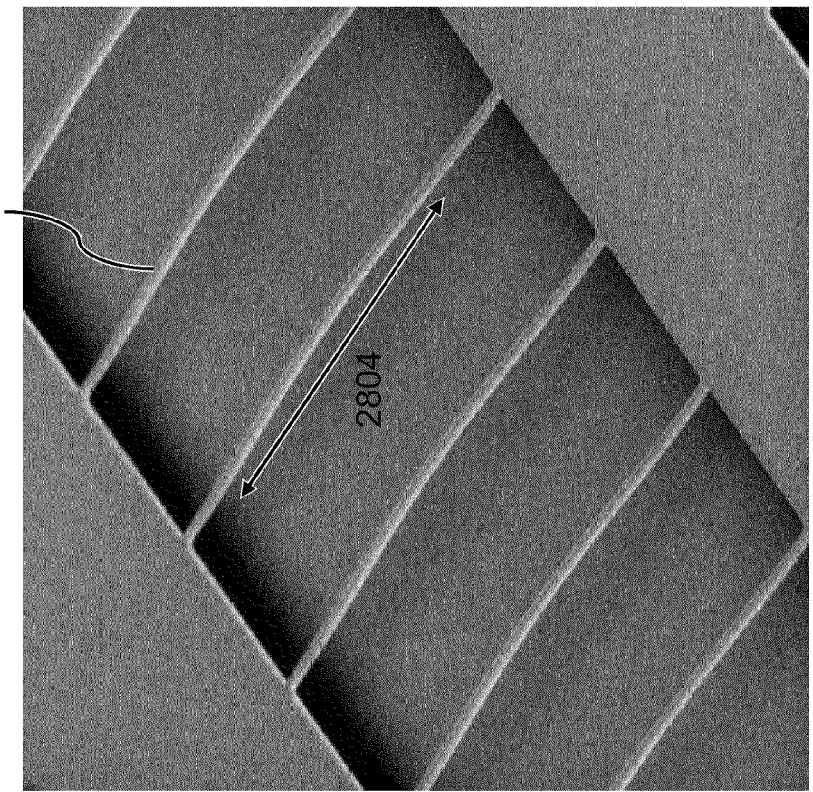

FIGS. 29A-29B show electron micrographs of substrate elements without (A) and with (B) the use of a stress relief structure.

Figure 29C:
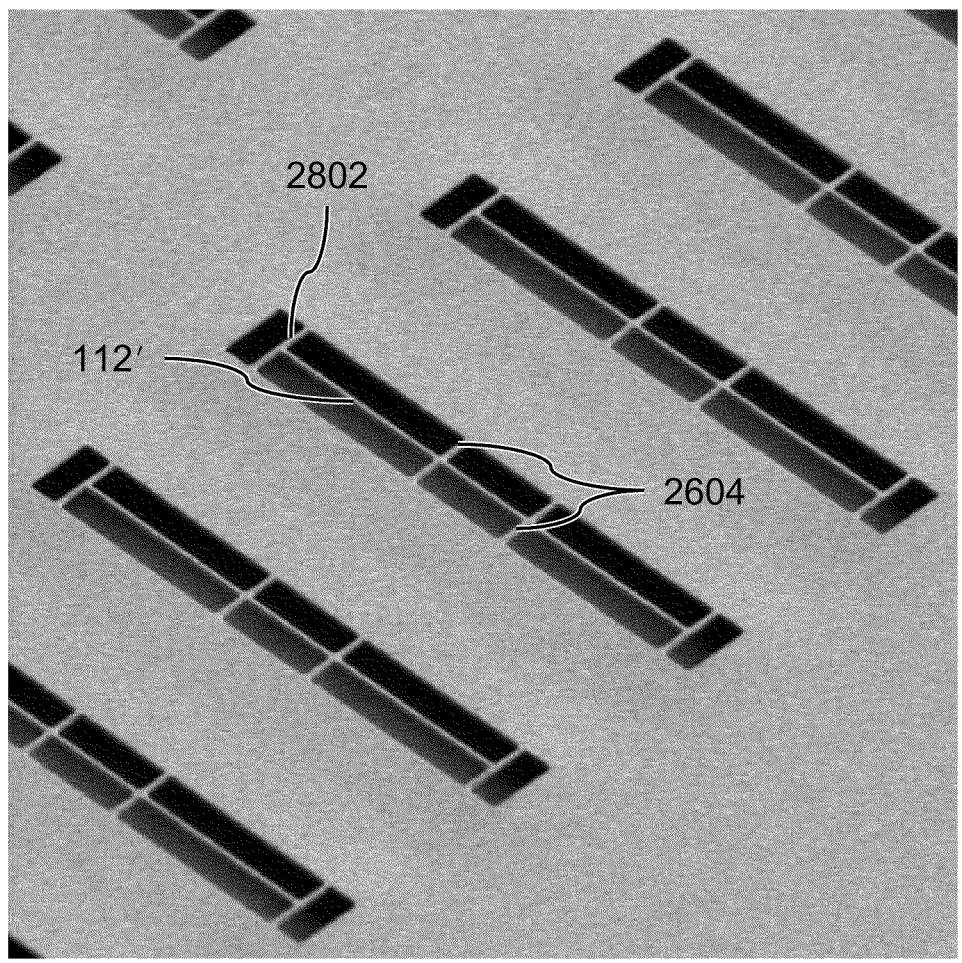

FIG. 29C shows an electron micrograph of substrate elements comprising both lateral support tabs and stress relief structures.

The present invention will now be described with reference to the accompanying drawings. In the drawings, like reference numbers indicate identical or functionally similar elements.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanocrystal, nanoparticle, nanowire (NW), nanorod, nanotube, and nanoribbon technologies and other functional aspects of the systems (and components of the individual operating components of the systems) may not be described in detail herein. Further, the techniques are suitable for applications in electrical systems, optical systems, consumer electronics, industrial or military electronics, wireless systems, space applications, or any other application.

As used herein, the term "nanostructure" refers to a structure that has at least one region or characteristic dimension with a dimension of less than about 500 nm, including on the order of less than about 1 nm. As used herein, when referring to any numerical value, "about" means a value of ±10% of the stated value (e.g. "about 100 nm" encompasses a range of sizes from 90 nm to 110 nm, inclusive). The term "nanostructure" as used herein encompasses nanoparticles, quantum dots, nanocrystals, nanowires, nanorods, nanoribbons, nanotubes, nanotetrapods and other similar nanostructures known to those skilled in the art. As described throughout, nanostructures (including nanoparticles, nanocrystals, quantum dots, nanowires, etc.) suitably have at least one characteristic dimension less than about 500 nm. Suitably, nanostructures are less than about 500 nm, less than about 300 nm, less than about 200 nm, less than about 100 nm, less than about 50 nm, less than about 20 nm, less than about 15 nm, less than about 10 nm or less than about 5 nm in at least one characteristic dimension (e.g., the dimension across the width or length of the nanostructure).

As used herein, the term "substrate element" refers to a structure formed from a substrate material or layer. Examples of substrate elements that can be produced using the methods of the present invention include, but are not limited to, wires, rods, ribbons, tetrapods (including nanostructures such as nanowires, nanorods, nanoribbons, nanotetrapods, nanotubes, nanodots, nanocrystals, and the like), as well as circuit elements such as transistors, capacitors, diodes, resistors, inductors, etc., and combinations of circuit elements on the same substrate element, such as transistors, capacitors, diodes, etc., on the same element, that form complex devices that can be removed and utilized in further applications.

Substrate elements produced by the methods of the present invention can be produced from any suitable material, including an inorganic material, such as inorganic conductive materials (e.g., metals), semiconductive materials and insulator materials. In exemplary embodiments, semiconductor elements are produced using the methods of the present invention. As used herein, "semiconductor elements" refers to structures that comprise at least one semiconductor, and in exemplary embodiments, can comprise additional layers or materials. Suitable semiconductor materials and semiconductor elements for use in the practice of the present invention include those disclosed in U.S. patent application Ser. No. 10/796,832 and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Ge_3N_4$, $(Al, Ga, In)_2 (S, Se, Te)_3$, $Al_2CO$, and an appropriate combination of two or more such semiconductors. In further embodiments, the substrate elements can comprise materials such as metals, polysilicons, polymers, insulator materials, etc. Suitable metals include, but are not limited to, Pd, Pt, Ni, W, Ru, Ta, Co, Mo, Ir, Re, Rh, Hf, Nb, Au, Ag, Fe, Al, $WN_2$ and TaN. Suitable insulator materials include, but are not limited to, $SiO_2$, $TiO_2$ and $Si_3N_4$.

Figure 1A:
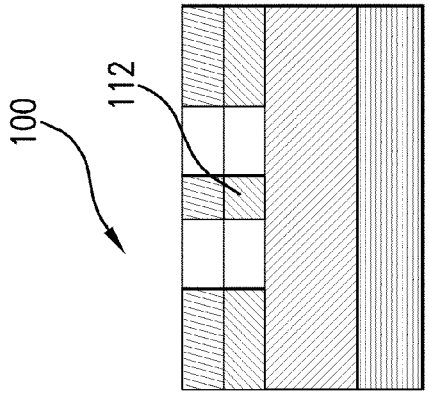
FIGS. 1A-1V show schematics of a method for forming substrate elements in accordance with one embodiment of the present invention.
Figure 1C:
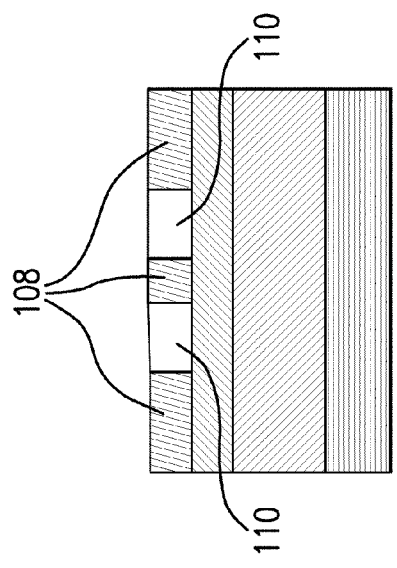
FIG. 1W shows substrate element prior to removal by sonication in accordance with one embodiment of the present invention.
FIG. 1X shows a substrate element prior to removal by mechanical cutting in accordance with one embodiment of the present invention.
Figure 1E:
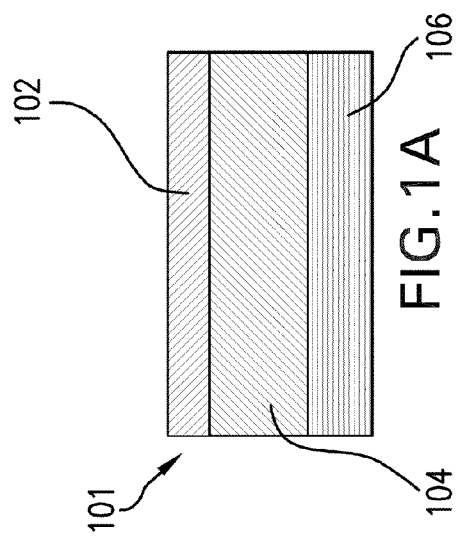
Figure 1B:
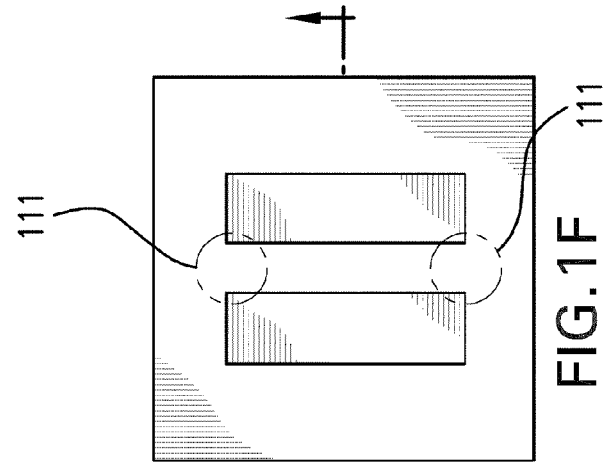
Figure 1D:
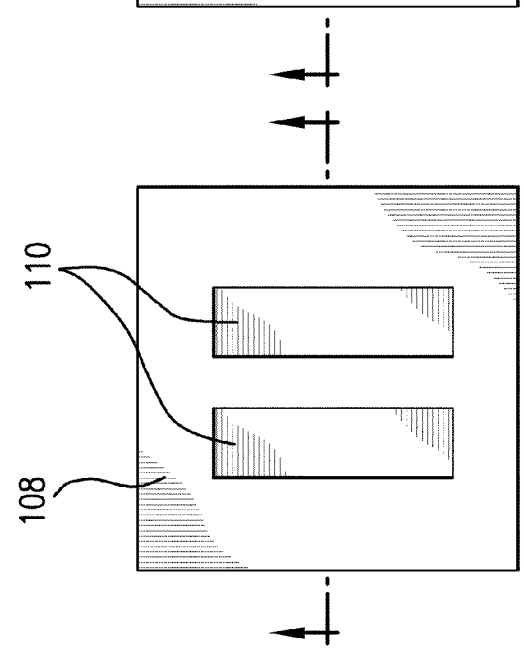
Figure 1F:
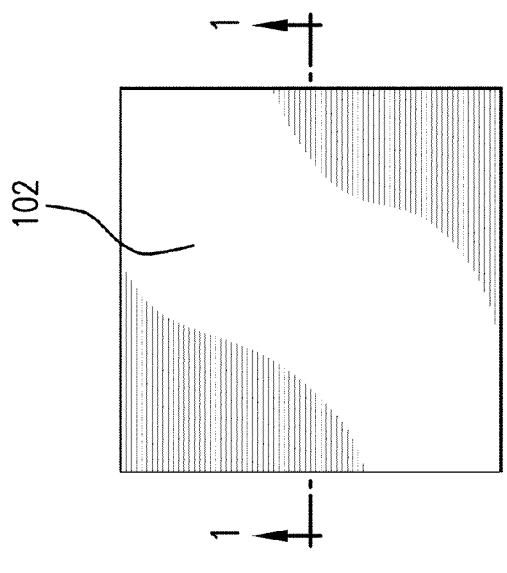
Figure 1Q:
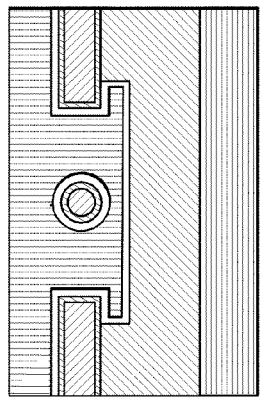
Figure 1R:
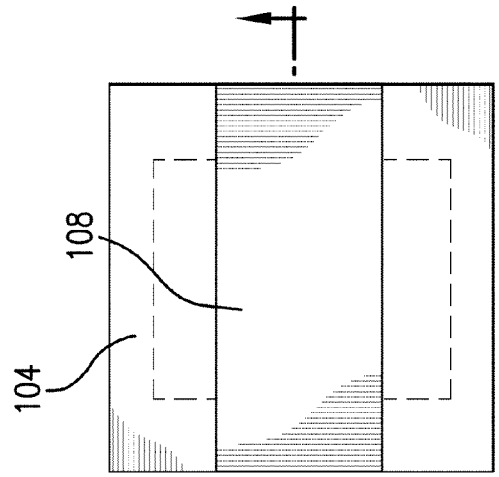
Figure 1O:
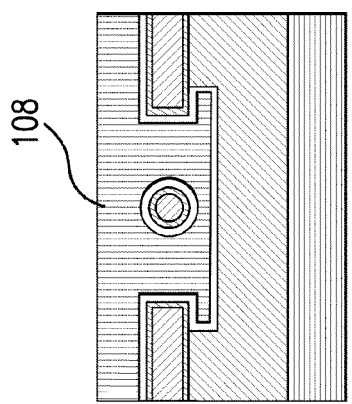
Figure 1P:
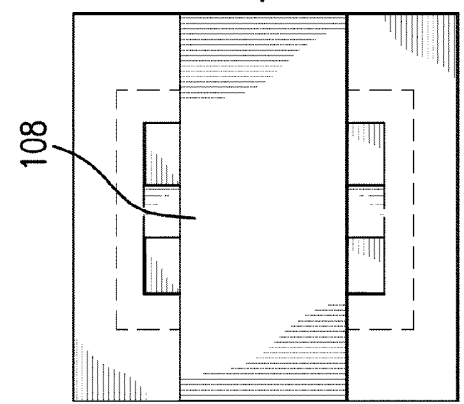
Figure 1M:
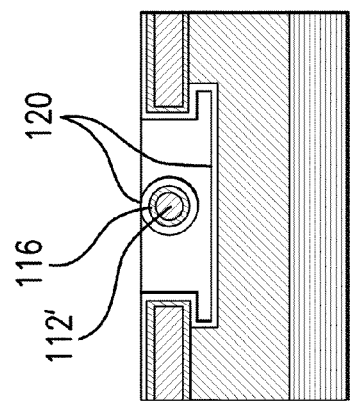
Figure 1N:
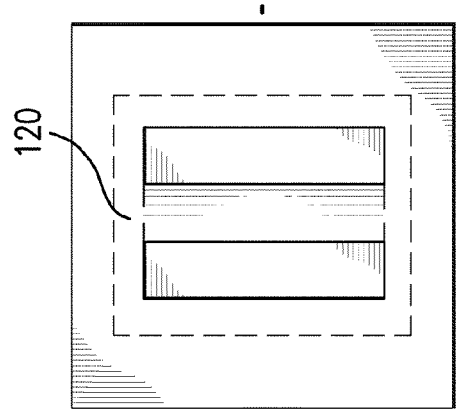
Figure 1U:
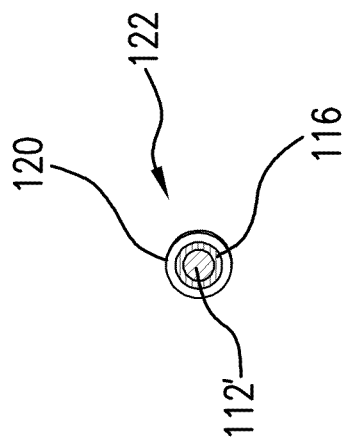
Figure 1V:
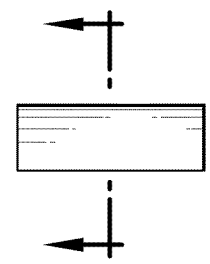
Figure 1S:
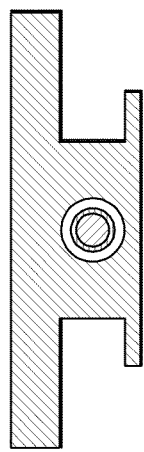
Figure 1T:
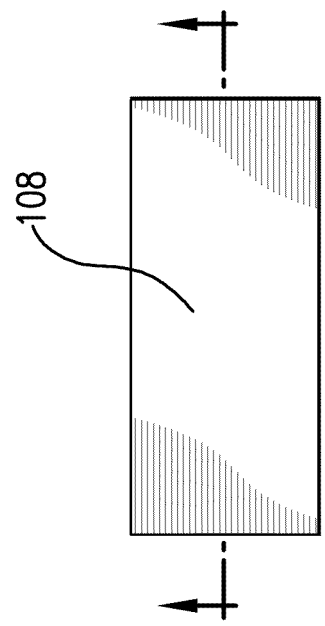
Figure 2:
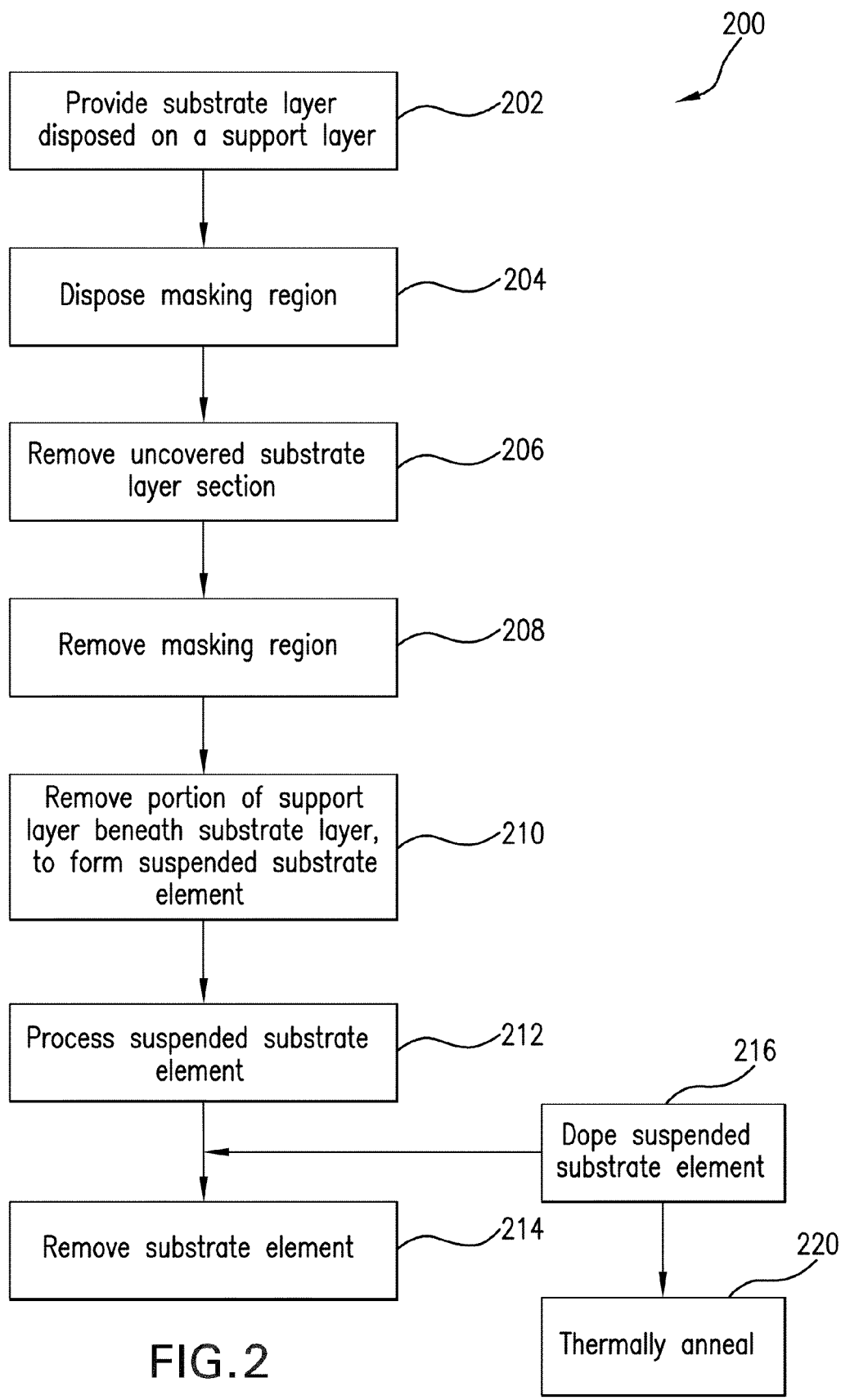
FIG. 2 is a flowchart of another method for forming substrate elements in accordance with one embodiment of the present invention.

In exemplary embodiments, the present invention provides methods for forming one or more substrate elements, as set forth in flowchart 200 in FIG. 2 with reference to the schematics in FIGS. 1A-1V. In the schematics of FIGS. 1A-1V, the figures on the bottom half of the page (e.g., FIGS. 1B, 1D, 1F, 1H, 1J, 1L, 1N, 1P, 1R, 1T and 1V) show top views of wafer 101 during the processing described throughout. The figures on the top half of the page (e.g., FIGS. 1A, 1C, 1E, 1G, 1I, 1K, 1M, 1O, 1Q, 1S and 1U) show cross sectional views take through the various layers of wafer 101. The double headed arrows (1-1) shown in the bottom half of the page indicate the location and direction of the cross-sectional view through wafer 101 shown in the top half of the page.

As shown in flowchart 200, in step 202, a substrate layer 102 on a support layer 104 is provided. Suitably, substrate layer 102 fully covers support layer 104, though it is not required that support layer 104 be fully covered. In general, the thickness of substrate layer 102 is less than support layer 104, though this is also not required. The thickness of substrate layer 102 dictates one of the dimensions of the final substrate element. In general, the thickness of substrate layer 102 is about 1 nm to about 1 cm, suitably about 1 nm to about 1 mm, about 1 nm to about 1 µm or about 1 nm to about 500 nm. As shown in FIG. 1A, suitably support layer 104 is provided on an optional support platform 106.

In exemplary embodiments, substrate layer 102 comprises a semiconductor. Exemplary semiconductors are described herein, and include Si, Ge, Sn, Se and Te. As discussed in detail below, suitably substrate layer 102 and support layer 104 are differentially removable. That is, substrate layer 102 is removed by a first substance that does not remove (or does not substantially remove) support layer 104, and similarly, support layer 104 is removed by a second substance that does not remove (or does not substantially remove) substrate layer 102. In embodiments, substrate layer 102 comprises a semiconductor and support layer 104 suitably comprises a semiconductor oxide, semiconductor alloy or doped semiconductor. In exemplary embodiments, support layer 104 comprises a semiconductor oxide, such as an oxide of substrate layer 102 (e.g., $SiO_2$ if substrate layer 102 is Si), though in further embodiments, the semiconductor oxide can comprise a different semiconductor than the substrate layer.

In other embodiments, support layer 104 comprises a semiconductor alloy, such as an alloy of substrate layer 102 (e.g., SiGe if substrate layer 102 is Si), though in further embodiments, the semiconductor alloy can comprise a different semiconductor than the substrate layer. As used herein, the term semiconductor alloy means a homogeneous mixture of one or more semiconductor materials and one or more metals.

Methods for generating wafers 101 comprising semiconductors on a semiconductor alloy are well known in the art. For example, using epitaxial deposition technology or using SMART-CUT® processing, or a combination of the two. SMART-CUT® processing is described in U.S. Pat. No. 5,374,564, which is incorporated by reference herein for its teachings of SMART-CUT®. SMART-CUT® uses a hydrogen layer that is implanted prior to bonding, and bulk semiconductor (e.g., silicon) which is fractured after bonding to leave behind a thin layer. In the SMART-CUT® process, hydrogen implantation and annealing are used to fracture the bulk of the device wafer from the bonded wafers. Chemical-mechanical polishing (CMP) is used to planarize and minimize non-uniformity of the as-cut wafer. For example, SMART-CUT® process can be utilized to form the semiconductor/semiconductor alloy wafers as follows: 1) a device wafer (e.g., Si) is processed to have a device quality surface layer, a layer is provided over the device layer, and a buried hydrogen-rich layer is implanted at a certain depth; 2) a "handle wafer" with an alloy surface is provided; 3) the device wafer is flipped and the surfaces are bonded; 4) the structure is annealed to form connecting voids from hydride formation; 5) the structure is fractured; and 6) the transferred device layer is CMP polished and cleaned. In suitable embodiments, the semiconductor alloy layer is pseudo-morphic (i.e., the lattice matches with the semiconductor substrate layer), or the strain in the semiconductor alloy layer could be released using techniques developed for strained semiconductor (e.g., Si) and semiconductor alloy (e.g., SiGe) technologies.

In further embodiments, support layer 104 comprises a doped semiconductor, such as a doped semiconductor of substrate layer 102 (e.g., doped Si if substrate layer 102 is Si), though in further embodiments, the doped semiconductor can comprise a different semiconductor than the substrate layer. Exemplary dopants for use in doped semiconductors of support layer 104 are disclosed herein or otherwise known in the art. Generation of a doped semiconductor support layer (104) beneath a semiconductor substrate layer 102 can be prepared utilizing semiconductor epitaxial deposition technology as is known in the art. In still further embodiments, support layer 104 can comprise polysilicon.

In step 204 of flowchart 200, one or more masking regions 108 are disposed on substrate layer 102 to cover at least a portion of substrate layer 102. As shown in FIGS. 1C and 1D, a strip of substrate layer 102 is masked in such a way that it is flanked by two sections of uncovered substrate layer 110. It should be noted that while FIGS. 1A-1V illustrate the formation of a single substrate element, the methods of the present invention can be applied such that multiple substrate elements (e.g., 2, 5, 10, 50, 100, 1000, 10000, etc.) can be prepared simultaneously, either from a single wafer 101, or from multiple wafers.

In step 206 of flowchart 200, uncovered substrate layer sections 110 are removed. This generates a substrate section 112 beneath the masking regions, as shown in FIG. 1E. It should be noted that substrate section 112, is still connected to substrate layer 102 at either one or both ends at attachment points 111. Thus, as shown in FIG. 1E, substrate layer 102 is still visible in the cross section where substrate section 112 is connected at attachment point 111. As shown in FIG. 1E, removing uncovered substrate layer sections 110 reveals sections of support layer 104 beneath substrate layer 102. As discussed herein, as substrate layer 102 and support layer 104 are differentially removable, removal of substrate layer 102 does not substantially impact the integrity of underlying support layer 104.

In step 208 of flowchart 200, masking regions 108 are removed. Then, in step 210, at least a portion of support layer 104 beneath the substrate layer 102 is removed, thereby forming one or more suspended substrate elements 112'. It should be noted that in other embodiments, masking regions 108 do not have to be removed prior to step 210. As noted herein, suspended substrate elements 112' remain attached to substrate layer 102, at either one end (e.g., cantilevered above support layer 104) or both ends (e.g., suspended as a bridge above support layer 104). As described herein, the ability to generate suspended substrate elements 112', allows for further processing of such elements in step 212 prior to removal from wafer 101. As shown in FIG. 1G, suspended substrate element 112' is fully separated from support layer 104 as at least enough of support layer 104 is removed in step 210 to undercut (e.g., at 114) suspended substrate element 112'. In step 214, substrate element 112' is removed from wafer 101. It should be understood that the terms "substrate element" and "suspended substrate element" are used interchangeably throughout, with suspended substrate element used to generally refer to the element when it is still attached to substrate layer 102. In addition, it should be understood that substrate sections 112 are used to refer to substrate elements 112 prior to being undercut and separated from support layer 104. As discussed in detail below, substrate element 112" refers to a substrate element that is supported by a support member 1704.

In suitable embodiments, disposing of masking regions in step 204 comprises disposing an etch-resistant masking region, such as a photolithography mask. Then, in step 206, uncovered substrate layer sections 110 are suitably removed by etching. In general, as used herein, removal of the various layers is suitably performed by etching.

As used herein, the terms "etch" or "etching" refer to any process, including chemical, physical, or energetic, which removes exposed or uncovered material of a substrate (e.g., substrate layer, support layer, as well as other substances). Examples of suitable etching methods include, but are not limited to, chemical etching, such as acid or base etching, including wet chemical etches (e.g., using Acetic Acid ($H_3COOH$), Hydrochloric Acid (HCl), Hydrofluoric Acid (HF), Nitric Acid ($HNO_3$), Phosphoric Acid ($H_3PO_4$), Potassium Hydroxide (KOH), Sodium Hydroxide (NaOH), Sulfuric Acid ($H_2SO_4$), as well as other chemicals known by one of ordinary skill in the art, see e.g., U.S. Pat. Nos. 7,153,782, 7,115,526, 5,820,689); photochemical etching, see e.g., U.S. Pat. Nos. 4,414,066 and 5,092,957, as well as Ashby, "Photochemical Dry Etching of GaAs", *Appl. Phys. Lett.* 45:892 (1984); Ashby et al., "Composition-selective Photochemical Etching of Compound Semiconductors", *Appl. Phys. Lett.* 47:62 (1985), Smith, R. A., Semiconductors, 2nd Ed., Cambridge Univ. Press, New York, 1978, p. 279; plasma etching, see e.g., U.S. Pat. Nos. 3,615,956, 4,057,460, 4,464,223 and 4,595,454; reactive ion etching (RIE) see e.g., U.S. Pat. Nos. 3,994,793, 4,523,976 and 4,599,136; electron beam etching, see e.g., U.S. Pat. Nos. 4,639,301, 5,149,974 and 6,753,538, and also, Matsui et al., "Electron Beam Induced Selective Etching and Deposition Technology," *Journal of Vacuum Science and Technology B* 7 (1989), Winkler et al. "E-Beam Probe Station With Integrated Tool For Electron Beam Induced Etching," *Microelectronic Engineering* 31:141-147 (1996). Each of the patents and references listed above are hereby incorporated by reference herein in their entireties for all purposes, specifically for their disclosure of various etching methods and compositions. In embodiments where doped semiconductors or semiconductor alloys are utilized as support layer 104, etches, such as vapor etches, which have differential etch rates depending on the content of the alloy material (e.g., Ge) can be utilized. In general, such etches, e.g., HCl, are less problematic to utilize, as compared to harsh etches such as HF.

As used herein, etching "anisotropically" means that the rate of etching in one primary direction is greater than the rate of etching in other directions. Suitably, in anisotropic etching, the rate of etching is nearly zero in directions other than the primary direction (for example, normal to the plane of the substrate surface). Suitably, the removing in step 206 is performed by etching, suitably aniostropic etching. For example, as shown in FIG. 1E, substrate layer 102 is removed primarily only in a direction that is normal to the plane of substrate layer 102. As the substrate layer is etched away anisotropically, i.e., only in a direction normal to the plane of the substrate, the cross-sectional diameter of the substrate elements 112' that are generated are substantially the same size as the masking regions 108 that covered the substrate. For example, if a masking region 108 is disposed in strip, for example, as shown in FIGS. 1D and 1E, with a width of about 100 nm, and then an anisotropic etched is performed on uncovered portions of the substrate layer 102, wherein the thickness of substrate layer 102 is about 100 nm, substrate elements 112' with dimensions on the order of about 100×100 nm are generated. Thus, by controlling the thickness of substrate layer 102 and the width of masking regions 108, the cross-sectional dimensions of substrate elements 112' can be controlled. Suitably, the cross sectional dimensions of substrate elements 112' are on the order of about 1 nm to about 500 nm, by about 1 nm to about 500 nm. It should be understood that while the cross-sectional dimensions can be the same in both directions (i.e., square in shape), elements that do not have equal cross-section dimensions can also be formed using the methods disclosed herein. Furthermore, by controlling the length of masking regions 108, the maximum length of substrate elements 112' can be set, and then subsequently shortened as desired during removal or processing.

Suitably, the removing in step 210 of flowchart 200 comprises etching, and in exemplary embodiments, comprises isotropic etching. Isotropic etching refers to an etching process in which the rate of etching is the same, or substantially the same, in all directions. That is, there is no primary direction of etching. As shown in FIG. 1G, isotropic etching, by removing material in all directions at substantially the same rate, allows for removal of support layer 104 beneath substrate layer 102, and specifically allows for substrate element 112' to be undercut (e.g., at 114), thereby allowing it to be suspended between one or two attachment points 111 to substrate layer 102 (in further embodiments, suspended substrate element 112' can be attached at more than two attachment points 111 to substrate layer 102).

In exemplary embodiments, masking regions 108 that are used throughout in the various embodiments can comprise a negative photoresistant material. In other embodiments, a "positive photoresistant layer" can be used. As used herein, a "negative photoresistant layer" refers to a material that, when exposed to radiation (including visible and ultraviolet light wavelengths, as well as electron beam and x-ray radiation) becomes relatively insoluble to a photoresist developer. Unexposed portions (i.e., covered) of the negative photoresistant layer are then able to be dissolved by a photoresist developer, while covered regions are not able to be developed. Examples of methods of the use of a negative photoresist layer, as well as photoresist developers, can be found in, for example, Sze, S. M., "Semiconductor Devices, Physics and Technology," John Wiley & Sons, New York, pp. 436-442 (1985), the disclosure of which is incorporated by reference herein in its entirety. In general, negative photoresists for use in the practice of the present invention comprise a polymer combined with a photosensitive compound. Upon exposure to radiation (e.g., UV light), the photosensitive compound cross-links the polymer, rendering it resistant to a developing solvent. Unexposed areas, however, are removable by the developing solvent. Some exemplary negative photoresist materials and developers include Kodak® 747, copolymer-ethyl acrylate and glycidylmethacrylate (COP), GeSe and poly(glycidyl methacrylate-co-ethyl acrylate) DCOPA. Disposing of negative photoresist material can be performed using any suitable method, for example, spin coating, spray coating, or otherwise layering the layer. In contrast, "positive photoresistant" materials become less chemically robust when exposed to radiation, and hence, work in the opposite manner to negative photoresistant materials. Here, materials that are exposed to radiation will remain to generate the mask, while unexposed areas will be removed.

Thus, in exemplary embodiments, a photoresist layer is disposed on support layer 102. Then, the desired pattern is placed on top of the photoresist layer such that after exposing to radiation, areas that are not chemically robust (i.e., able to be chemically removed) can be removed, thereby leaving behind masking regions 108 that are etch-resistant, and open, uncovered regions of substrate layer 102 (or other layers as described herein) that can then be removed, e.g., etched, using the various methods described throughout.

The removing of masking regions 108 in step 208 of flowchart 200 can be carried out using any suitable method, such as simply washing or rinsing substrate layer 102 with a dissolving solution (e.g., alcohol or aqueous-based solution) to remove masking regions 108, or by plasma ashing (e.g., a plasma etch based on $O_2$ gas).

In further embodiments, masking regions 108 can comprise a nitride layer that is disposed on the various surfaces, such as substrate layer 102. A photolithography mask can then be used to pattern the nitride layer which is then etched to form a "hard mask" which prevents the etching of the underlying, covered regions. Use of nitride masking in combination with photolithography techniques is well known to those of ordinary skill in the art.

Various methods can be used to remove substrate elements 112' from wafer 101 in step 214. For example, in suitable embodiments, the removing in step 214 comprises, first, disposing one or more masking regions 108 on the suspended substrate elements 112', as shown in FIGS. 1O and 1P. At least a portion of the suspended substrate elements 112' and/or substrate layer 102 are then removed, thereby separating the suspended substrate elements 112' from the substrate layer 102, as shown in FIGS. 1Q and 1R (for example, etching to separate at one or more of attachment points 111). As shown in FIG. 1R, removing substrate element 112'/substrate layer 102 reveals support layer 104 beneath. As shown in FIGS. 1S and 1T, substrate element 112' is surrounded by masking region 108 and this entire structure can be removed from wafer 101. In alternative embodiments, substrate element 112' and masking region 108 can remain on wafer 101 before removing masking region 108. Removing masking region 108 (e.g., dissolving) then leaves substrate element 112' as a separate structure, for example, as shown in FIGS. 1V and 1U. As discussed throughout, suitably masking region 108 is a photolithography mask which is etch-resistant. Removal of the portion of the suspended substrate element 112' and/or substrate layer 102 is suitably carried out by etching using the various techniques described herein. In suitable embodiments, anisotropic etching is used so that substrate elements 112' are removed from substrate layer 102 by etching primarily in a direction normal to the plane of the substrate layer such that a "cut" is made at the end of substrate elements 112'.

Figure 1W:
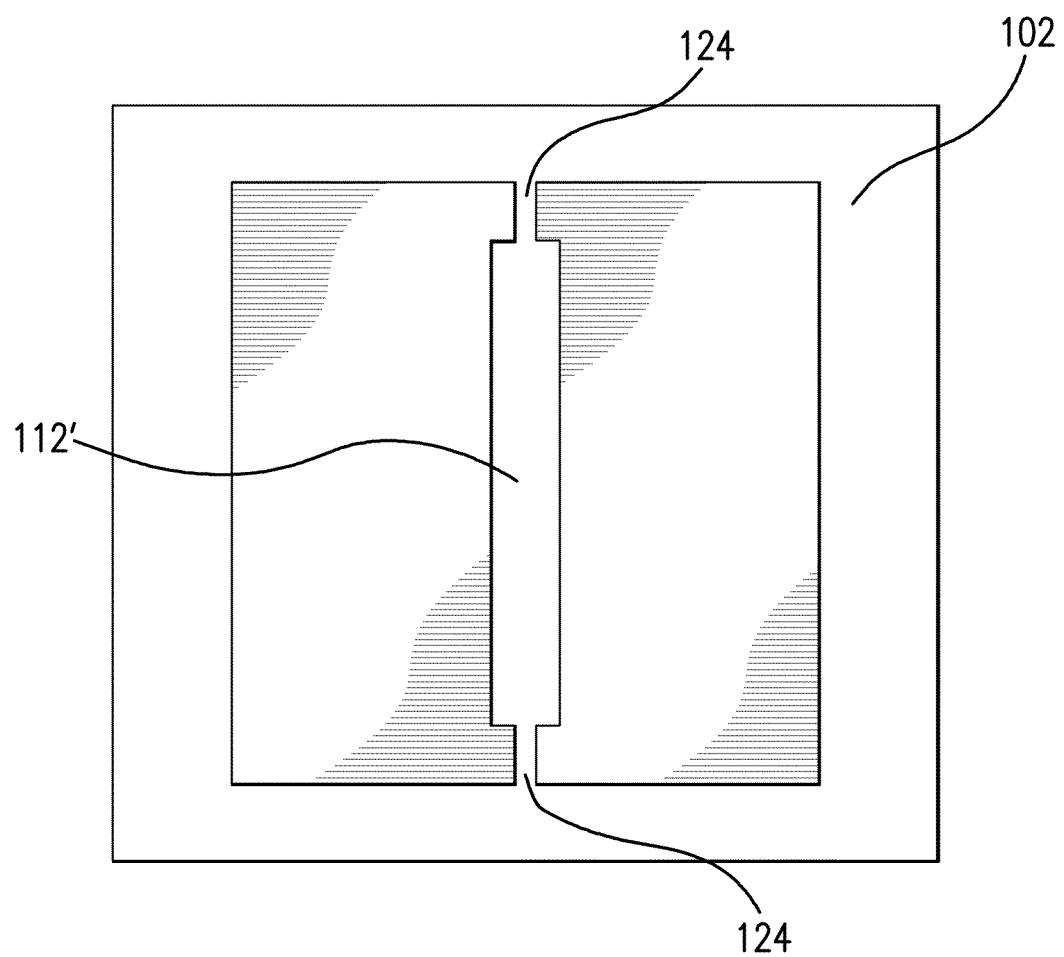
Figure 1X:
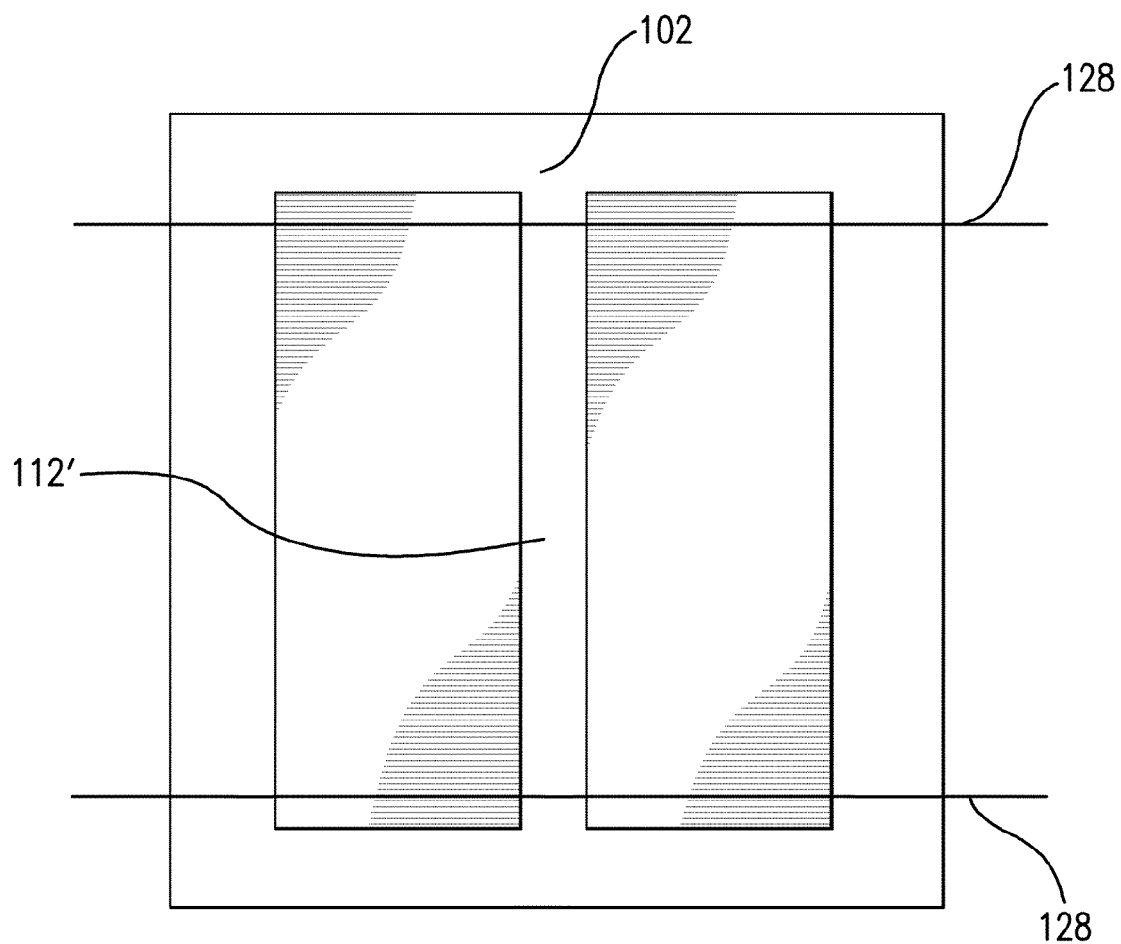

In further embodiments, substrate elements 112' can be removed from substrate layer 102 by simply agitating or vibrating the suspended substrate elements 112', for example, by using ultrasound. As shown in FIG. 1W, suspended substrate element 112' can be attached to substrate layer 102 via fairly thin or fragile connections 124. By sonicating the suspended substrate element 112', the element can be induced to break away from substrate layer 102. In still further embodiments, substrate elements 112' can be removed from substrate layer 102 by mechanically cutting, sawing, or otherwise separating the elements from substrate layer 102. For example, as shown in FIG. 1X, substrate element 112' can be mechanically cut from substrate layer 102, for example, along cut-lines 128. Examples of methods for mechanically cutting substrate elements 112' from substrate layer 102 include the use of saws, knives or blades, lasers, water jets and other similar devices.

As discussed throughout, forming substrate elements 112' such that they are suspended (i.e., attached at one or both ends, or even via additional attachment points 111 to substrate layer 102), allows for further processing of the elements, as noted in step 212 of flowchart 200, while still on wafer 101. The fact that substrate elements 112' are suspended means that processing can take place on one surface of the elements (e.g., the top, bottom, or one side), or suitably, can take place on all surfaces at the same time, as all surfaces are exposed following the undercutting of substrate element 112'.

In further embodiments, in order to provide additional support to suspended substrate elements 112' during processing, filling material can be added between the suspended substrate elements 112' and support layer 104 to provide stabilization, thereby reducing bending or buckling/sagging and element breakage and touching during processing. Exemplary filling materials that can be used in the practice of the present invention include, but are not limited to, semiconductor-based materials (e.g., Si-based materials), such as semiconductor alloys (e.g., SiGe), doped semiconductors (e.g., doped Si), or polysilicon. Suitably, such filling materials are differentially etchable when compared to suspended substrate elements 112', thus allowing them to be removed at a later time while limiting the impact on suspended substrate elements 112' and/or layers that have been disposed on such elements. Such filling materials are especially useful during wet processing of substrate elements, such as nanowires, so as to prevent the nanowires from touching each other and/or support layer 104 during processing.

As shown in FIG. 1I, an initial processing that can be performed on substrate element 112' is to "round off" the corners of substrate element 112' so as to produce a more circular or oval cross-section. It should be understood that this "rounding off" is not required. In one embodiment, this initial processing can comprise disposing an oxide layer (for example, growing a thin layer of oxide as described herein), and then removing or etching off this "sacrificial" oxide layer. By etching off the sacrificial oxide layer, a clean layer of substrate element 112' is revealed, and in addition, the corners of the element initially present after formation are also slightly rounded. In additional embodiments, a thermal treatment in the presence of H gas can also result in a rounding off of the corners of substrate element 112' prior to subsequent processing and removal.

Subsequent processing can comprise disposing an insulator layer on the suspended substrate elements 112'. As shown in FIGS. 1K and 1L, insulator layer 116 is suitably disposed such that it covers all exposed surfaces of substrate element 112'. In exemplary embodiments, insulator layer 116 is an oxide layer that is grown on substrate element 112'. For example, when substrate layer 102 is a semiconductor such as Si, Ge, Sn, Se, Te or B, the oxide that is grown is a semiconductor oxide such as Si oxide ($SiO_2$), Ge oxide, Sn oxide, Se oxide, Te oxide or B oxide. As the substrate element is suspended, all surfaces of the element oxidize equally, and thus, the oxide layer "grows" essentially equally in all directions from/on the element. That is, the layer grows at essentially equal rates in all directions, and therefore increases in thickness in a direction normal to the surface of substrate element 112'. It should be noted, however, that variations in growth rates may be caused by crystallographic orientation, stress, as well as other factors.

As used throughout, the term "disposed," as used to describe the disposition of the various layers, including insulator layer 116, for example, indicates that the various layers (e.g., insulator layer) are formed, applied, deposited or otherwise generated on substrate element 112.' The term "disposed" as used with relation to insulator layer 116 is not to be limited to actual growth of the insulator layer (e.g., an oxide layer). FIG. 1K shows a cross-section of substrate element 112' on which insulator layer 116 is disposed equally, or substantially equally, on all surfaces. The amount of insulator layer 116 that is disposed on substrate element 112' can be controlled in various ways, depending on the method of disposition. For example, by removing or increasing the amount of oxygen, the thickness of a growing oxide layer can be controlled. In some cases, it has been found that disposition of insulator layer 116 causes suspended substrate element 112' to expand. Thus, use of a cantilevered suspended substrate element 112' (i.e., attached at only one end via attachment point 111) rather than a suspended substrate element 112' that is attached at both ends, may be desired so as to minimize buckling during processing. Another method for limiting or overcoming expansion of substrate element 112' is to perform the insulator deposition (e.g., oxide growth) at an elevated temperature, or to perform a post-growth thermal anneal. Additional solutions include deposition of an insulator layer such by plasma chemical vapor deposition (CVD) or low-pressure chemical vapor deposition (LPCVD).

In additional embodiments, still further processing can be carried out on substrate elements 112'. For example, a gate layer 120 can be disposed on insulator layer 116, as shown in FIGS. 1M and 1N. As noted in FIGS. 1K-1L, while insulator layer 116 typically is disposed only on exposed surfaces of substrate element 112' and substrate layer 102 (e.g., if an oxide is grown), disposition of gate layer 120 suitably covers all exposed surfaces. Suitably, gate layer 120 is a metal or polysilicon layer, or similar conductive material. Exemplary metals for use as gate layer 120 include, but are not limited to, palladium (Pd), iridium (Ir), nickel (Ni), platinum (Pt), gold (Au), ruthenium (Ru), cobalt (Co), tungsten (W), tellurium (Te), rhenium (Re), molybdenum (Mo), iron platinum alloy (FePt), tantalum nitride (TaN), etc.

In suitable embodiments, the substrate elements that are formed by the present methods are nanowires. Thus, in another embodiment, the present invention provides nanowires. For example, nanowires are produced by first providing a substrate layer 102 disposed on a support layer 104. As discussed herein, suitably substrate layer 102 comprises a semiconductor and support layer 104 comprises a semiconductor oxide. Then, one or more masking regions 108 (e.g., photolithography etch-resistant masking regions) are disposed on substrate layer 102 to at least cover a portion of substrate layer 102. One or more uncovered substrate layer sections 110 are then removed (e.g., by etching) to generate substrate sections 112. Suitably, following removal of masking regions 108, at least a portion of support layer 104 beneath substrate layer 102 is removed, thereby forming one or more suspended substrate elements 112', wherein the suspended substrate elements 112' remain attached to substrate layer 102 at least one attachment point 111, allowing them to be processed (e.g., addition of various shell layers, etc.) prior to removal. Substrate elements 112' are then removed as nanowires 122.

As discussed throughout, nanowires can be removed by disposing one or more masking regions 108 (e.g., an etch-resistant photolithography mask) on the suspended substrate elements 112', as shown in FIGS. 1O and 1P. At least a portion of the suspended substrate elements 112' and/or substrate layer 102 are then removed (e.g., via etching), thereby separating the suspended substrate elements 112' from the substrate layer 102, as shown in FIGS. 1Q and 1R. As shown in FIGS. 1S and 1T, substrate element 112' is surrounded by masking region 108 and can be removed from wafer 101. In further embodiments, substrate elements 112' can be removed from substrate layer 102 by simply agitating or vibrating the suspended substrate elements 112', or by mechanically cutting them from substrate layer 102.

The nanowires 122 provided by the methods of the present invention suitably comprise a core layer (e.g., substrate layer 112, for example a semiconductor), and then one or more shell layers (e.g., insulator layer 116 and/or gate layer 120) surrounding the core, thereby forming a core-shell-shell structure. Additional layers/shells can also be added using the methods disclosed herein, for example to dispose an additional layer of metal or other material on the nanowires 122. As discussed herein, the diameter (or cross section) of nanowires 122 can be controlled by disposing a desired thickness of substrate layer 102 and then masking a desired section, so that after removal of unmasked regions, the desired cross-section in generated. Nanowires 122 are suitably prepared so as to have a diameter of approximately 5-500 nm, suitably about 10-400 nm, about 50-300, or about 100-200 nm, for example, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 160 nm, about 170 nm, about 180 nm, about 190 nm, or about 200 nm in diameter. Length of nanowires 122 can be controlled by the original dimensions of substrate layer 102, as well as the size of uncovered substrate regions formed during disposing of the masking regions 108.

In suitable embodiments, length of nanowires 122 is on the order of about 0.5 to about 50 µm, suitably about 0.5 to about 20 µm, for example, about 0.5 to about 10 µm or about 1 to about 10 µm in length.

In additional embodiments, the methods of the present invention can comprise additional processing steps, including by not limited to, doping of suspended substrate elements 112' with one or more dopant atoms as shown in step 216 of flowchart 200. As used herein, "doping" refers to growing or implanting a substrate, such as a semiconductor (e.g., silicon), with dopant atoms that have a greater number of electrons (n-type, n) or a fewer number of electrons (p-type, p) necessary to bond with the substrate material. For example, the concentration of atoms in a silicon crystal is approximately $5 \times 10^{23}/cm^3$. The intrinsic carrier concentration of silicon at room temperature is approximately $1 \times 10^{10}/cm^3$. Doping at concentrations of approximately $1 \times 10^{13}/cm^3$ to $5 \times 10^{15}/cm^3$, or one dopant atom per $5 \times 10^{10}$ crystal atoms to one dopant atom per $1 \times 10^8$ crystal atoms are considered lightly doped (n⁻, p⁻). In additional embodiments, light doping can include doping at $1 \times 10^{17}$ to $1 \times 10^{18}/cm^3$. Lightly doped semiconductors are used when it is necessary to flow current using minority carriers, as in the inversion layer of a metal-oxide-semiconductor field-effect transistor (MOSFET). Doping at concentrations of approximately $5 \times 10^{17}/cm^3$ and higher, or one dopant atom per $1 \times 10^5$ crystal atoms, are considered heavily doped (n⁺, p⁺). All of the electrons in a heavily doped semiconductor are in the conduction band at room temperature; n⁺ and p⁺ doped semiconductors behave as metals. Doping can take place by providing dopant atoms at any direction relative to the surface(s) being doped. In suitable embodiments, the dopant atoms are provided at a direction that is normal (90°) to the surface being doped, or at an angle of between about 30°-80°, an angle of about 30°-60° or at an angle of about 45° to the surface. As shown in step 220 of flowchart 200, following the doping in step 216, a thermal anneal can be applied to the dopant atoms/suspended substrate elements 112'. As used herein, thermal annealing refers to heating to a suitable temperature that helps to diffuse dopant atoms into substrate layer 102, as well as activate dopant atoms. In exemplary embodiments, the thermal annealing comprises heating to about 500° C.-1500° C. for a period of seconds to minutes to hours, suitably on the order of 3-50 seconds or less.

Figure 3C:
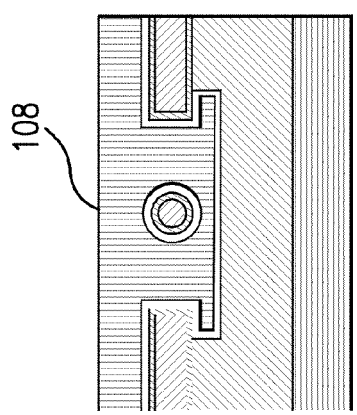
FIGS. 3A-3P show schematics of a method of forming substrate elements and transistor elements in accordance with one embodiment of the present invention.
Figure 3A:
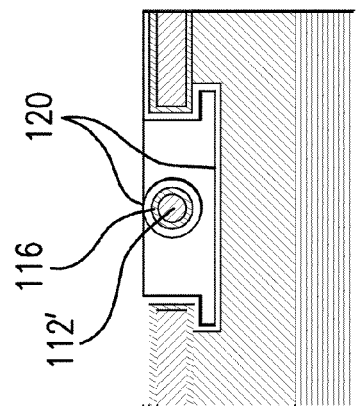
Figure 3B:
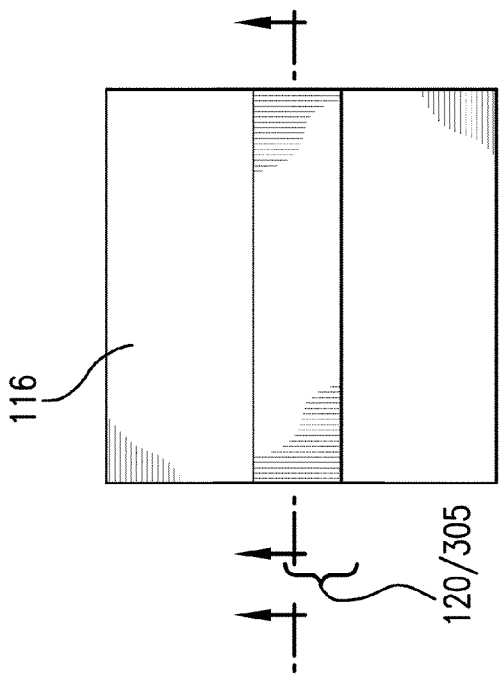
Figure 3E:
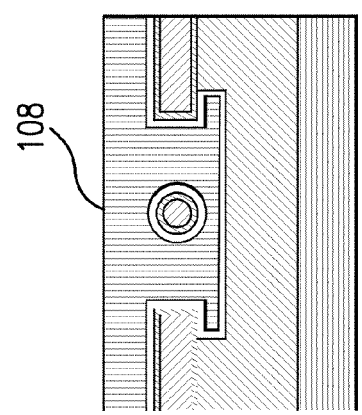
Figure 3D:
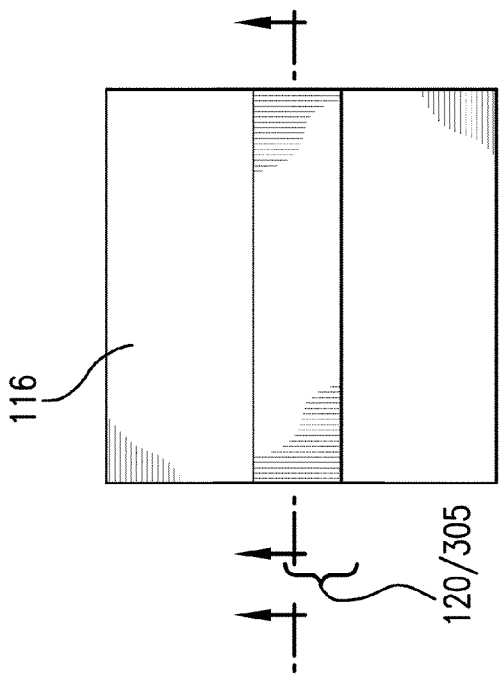
Figure 3F:
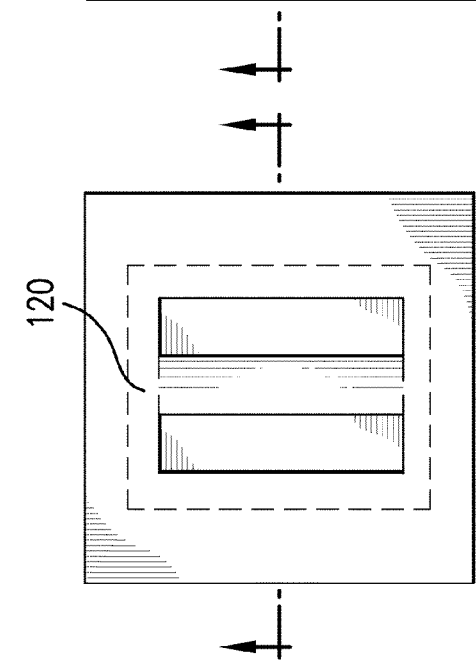
Figure 3O:
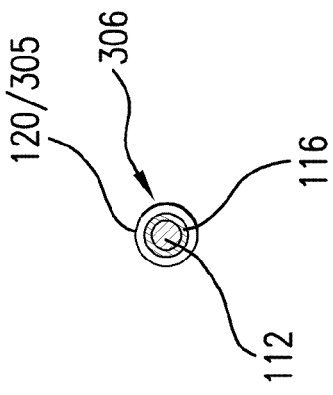
Figure 3P:
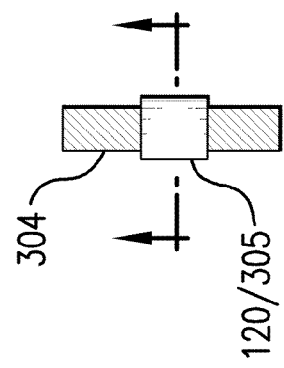
Figure 4:
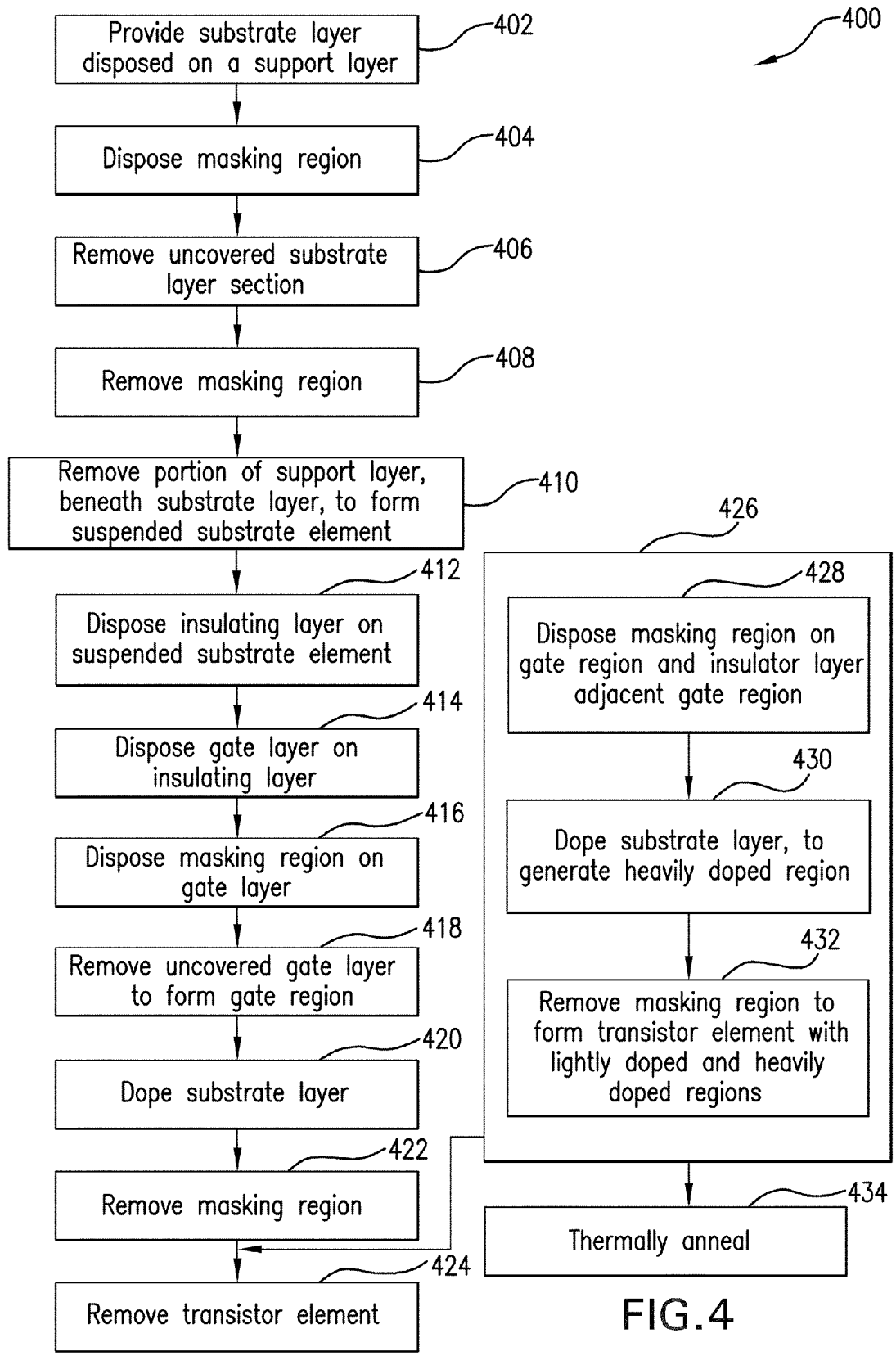
FIG. 4 shows a flowchart of another method of forming substrate elements and transistor elements in accordance with one embodiment of the present invention.

In another embodiment, processing of substrate elements 112', including doping, can be carried out as shown in the schematics of FIGS. 3A-3P, with reference to flowchart 400 of FIG. 4 so as to produce one or more transistor elements 306 as shown in FIG. 3O and 3P. In suitable embodiments, as shown in flowchart 400 of FIG. 4 (and as shown in FIG. 2 and described above), a wafer 101 comprising a substrate layer 102 (e.g., a semiconductor) disposed on a support layer 104 (e.g., a semiconductor oxide, semiconductor alloy or doped semiconductor) is provided in step 402. In step 404, a masking region 108 (such as a photoresistant etch mask) is disposed on substrate layer 102, and then uncovered substrate layer sections are removed in step 406. This generates substrate elements 112. After masking regions 108 are suitably removed, a portion of support layer 104 beneath substrate layer 102 is removed in step 410 to form suspended substrate elements 112'.

In step 412 then, an insulator layer 116 is disposed on suspended substrate elements 112', for example, by growing an oxide layer. In step 414, gate layer 120 (e.g. a metal or polysilicon) is disposed on insulator layer 116. This generates the structure shown in FIGS. 3A and 3B. As shown in cross section view 3A, suspended substrate elements 112' are covered by insulator layer 116 and then outer gate layer 120 (which as shown in FIG. 3A covers the entire wafer 101).

In step 416 of flowchart 400, a masking region 108 (e.g., an etch-resistant masking region such as a photolithography mask) is disposed on gate layer 120, as shown in FIGS. 3C and 3D. As shown in FIG. 3D, suitably only a portion of gate layer 120 is covered by masking layer 108, for example a portion near the center of suspended substrate element 112'. In step 418 of flowchart 400, uncovered gate layer 120 is removed, thereby revealing insulator layer 116 beneath as shown in FIG. 3F. This also forms gate region 305 (comprising a portion of gate layer 120) beneath masking layer 108.

In step 420 of flowchart 400, substrate layer 102 is then optionally doped with dopant atoms 302 to form doped regions 304 as shown in FIGS. 3G and 3H. As noted herein, in suitable embodiments, this doping can be a light doping or a heavy doping. In step 422 of flowchart 400, masking region 108 is then removed, as shown in FIGS. 3I and 3J, thereby revealing underlying gate region 305 which comprises material of gate layer 120.

Figure 3M:
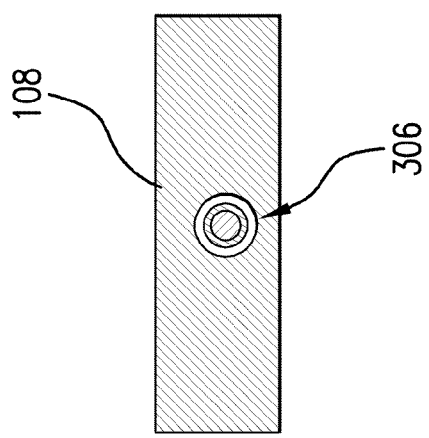
Figure 3N:
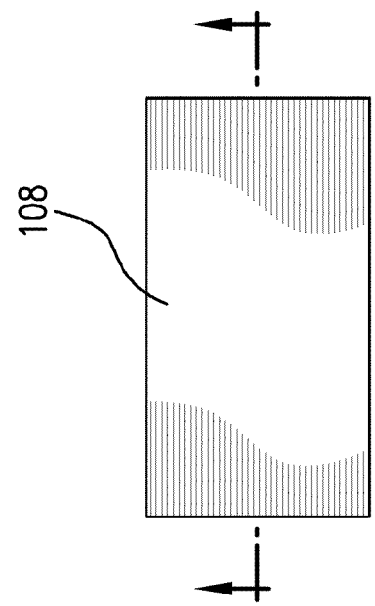

In step 424 then, transistor element 306 is removed. As described herein, transistor element can removed by disposing one or more masking regions 108 (e.g., an etch-resistant photolithography mask) on the suspended substrate elements 112', as shown in FIGS. 3K and 3L. At least a portion of the suspended substrate elements 112' and/or substrate layer 102 are then removed (e.g., via etching), thereby separating the transistor elements 306 from the substrate layer 102, as shown in FIGS. 3M and 3N. As shown in FIGS. 3M and 3N, transistor element 306 is surrounded by masking region 108 and can be removed from wafer 101. In further embodiments, transistor elements 306 can be removed from substrate layer 102 by simply agitating or vibrating the transistor elements 306, or by mechanically cutting them from substrate layer 102. As shown in FIGS. 3O and 3P, transistor elements 306 suitably comprise doped regions 304 (e.g., source and drain regions comprising doped semiconductor material) as well as gate regions (102/305), suitably comprising a metal or polysilicon.

Figure 5O:
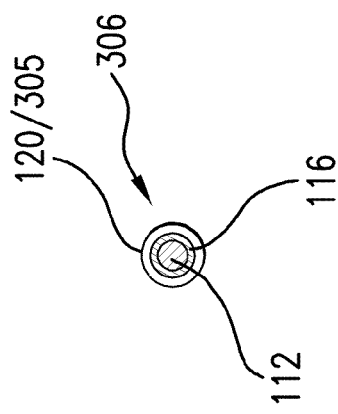
FIGS. 5A-5Z show schematics of an additional method of forming substrate elements in accordance with one embodiment of the present invention.

In still further embodiments, the methods of the present invention for preparing transistor elements 306 can further comprise additional doping stages 426. For example, as shown in flowchart 400 with reference to FIGS. 5A-5P, following the initial doping in step 420 (e.g., a light doping 302 as shown in FIGS. 5A and 5B) and the subsequent removal of masking region 108 in step 422 as shown in FIGS. 5D and 5C, an additional masking region 502 is disposed on gate region 305 as well as at least a portion of insulator layer 116 adjacent gate region 305 as shown in FIGS. 5E and 5F. As shown in FIG. 5F, masking region 502 extends beyond gate region 305 to cover at least some of the adjacent, doped substrate layer 102.

In step 430 of flowchart 400, substrate layer 102 is doped again with dopant atoms 504 to generate heavily doped regions 506, as shown in FIGS. 5G and 5H. When masking region 502 is removed in step 432, as shown in FIGS. 5I and 5J, heavily doped 506 and lightly doped 304 regions are generated, as well as gate region 305. Following doping stages 426, a thermal anneal can be performed in step 434 as described herein to aid in dopant diffusion and activation.

Figure 5P:
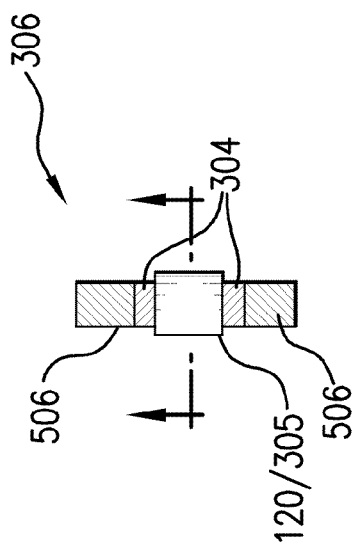
Figure 5M:
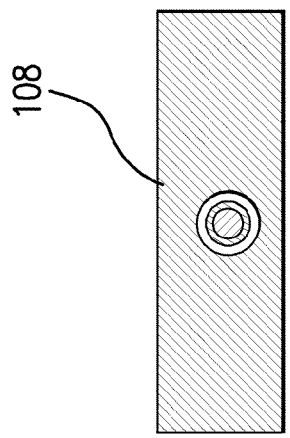
Figure 5N:
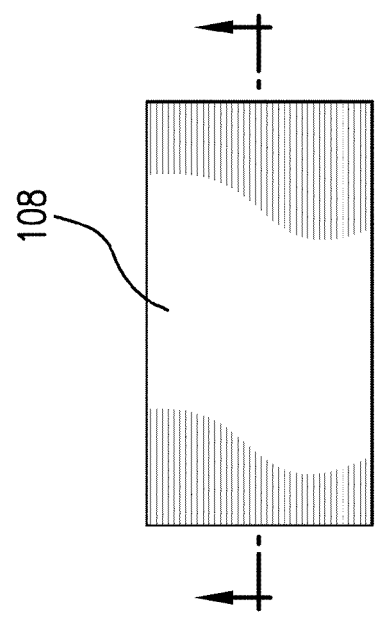

In exemplary embodiments, the methods of the present invention, as discussed above, are suitably used to generate one or more transistor elements. As shown in FIG. 5P, transistor element 306 suitably comprises a two heavily doped (n⁺ or p⁺) sections 506, separated by lightly doped (p⁻ or n⁻) regions 304, part of which are covered by gate region 305.

The n+ or p+ doping in steps 420 and 430 of flowchart 400 are suitably performed by ion implantation. High energy ions dope substrate layer 102. Performing the donor or acceptor ion implant step in a high temperature vacuum allows donor or acceptor ions to diffuse into the substrate layer, generating the donor or acceptor band levels for semiconduction.

Acceptor or donor states are suitably implanted by infusing acceptor or donor ion into the reactor chamber, where the acceptor or donor ions are accelerated to an energy high enough to be implanted into substrate layer 102. The surface implant step is run in parallel with one or more heating and cooling temperature cycles applied to the substrate elements 112', allowing the acceptor or donor ions lodged on the surface of the substrate elements 112' to diffuse into the substrate elements 112'. The approximate even diffusion and distribution of the acceptor and donor ions into the substrate elements 112' allows for setting a sharp, consistent in-band energy level for acceptor or donor states.

In another embodiment of the present invention, as shown in FIGS. 6A-6B, one of the problems associated with depositing and then connecting a large number of transistor elements 306 to electrical connections, is that very small shifts in the position of the components, or misalignments, can result in shorts between electrodes when they are finally electrically connected. For example, as shown in FIG. 6B, while correctly placed transistor elements are connected to source, gate and drain electrodes at the appropriate positions, a shift up or down, or a misalignment, can result in short circuits as incorrect electrodes are connected to the various sections of transistor element 306. In order to overcome this problem, the present invention provides various methods for generating substrate elements which can be selectively etched so as to reveal underlying connections when positioned correctly, but cannot be etched, and thus, are not electrically connected to electrodes, if improperly positioned. FIGS. 7A-7E illustrate the selective etching process of substrate elements which are prepared by the various methods of the present invention.

Figure 8G:
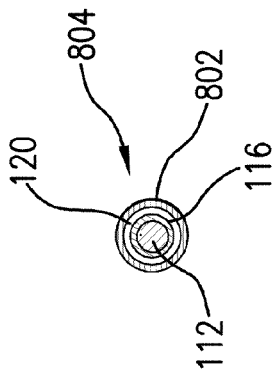
Figure 8I:
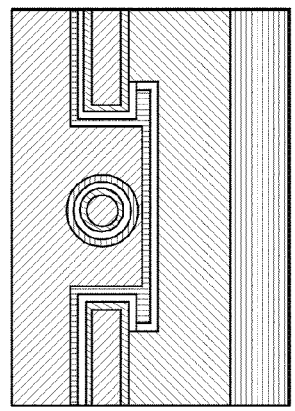
Figure 8K:
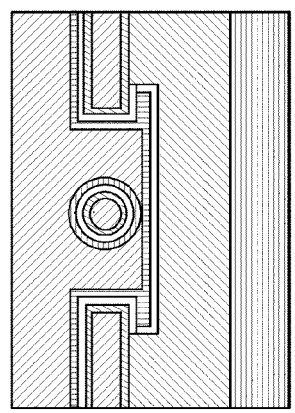
Figure 8H:
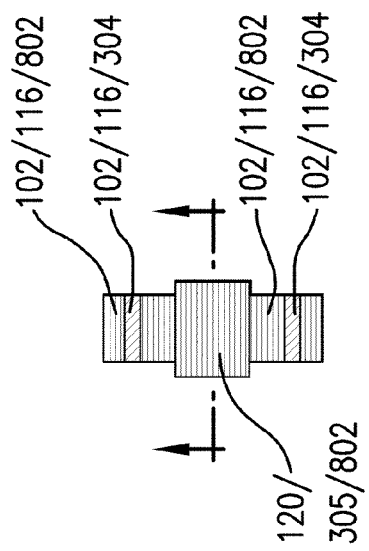
Figure 8J:
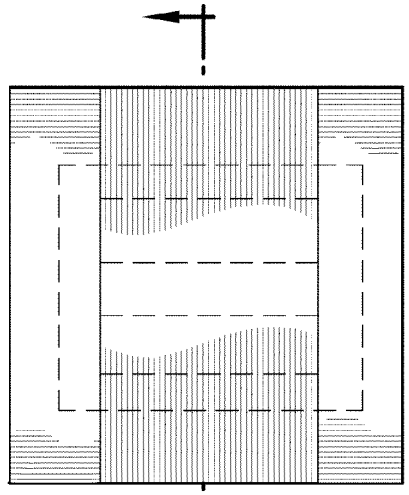
Figure 8L:
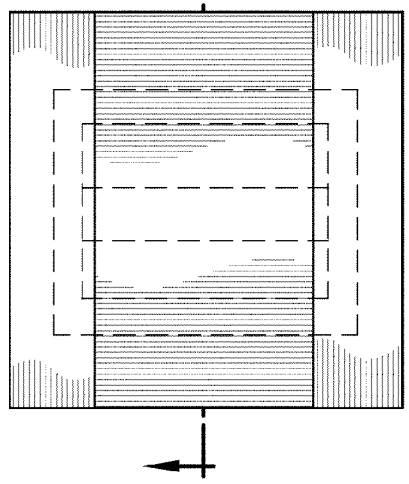
Figure 9B:
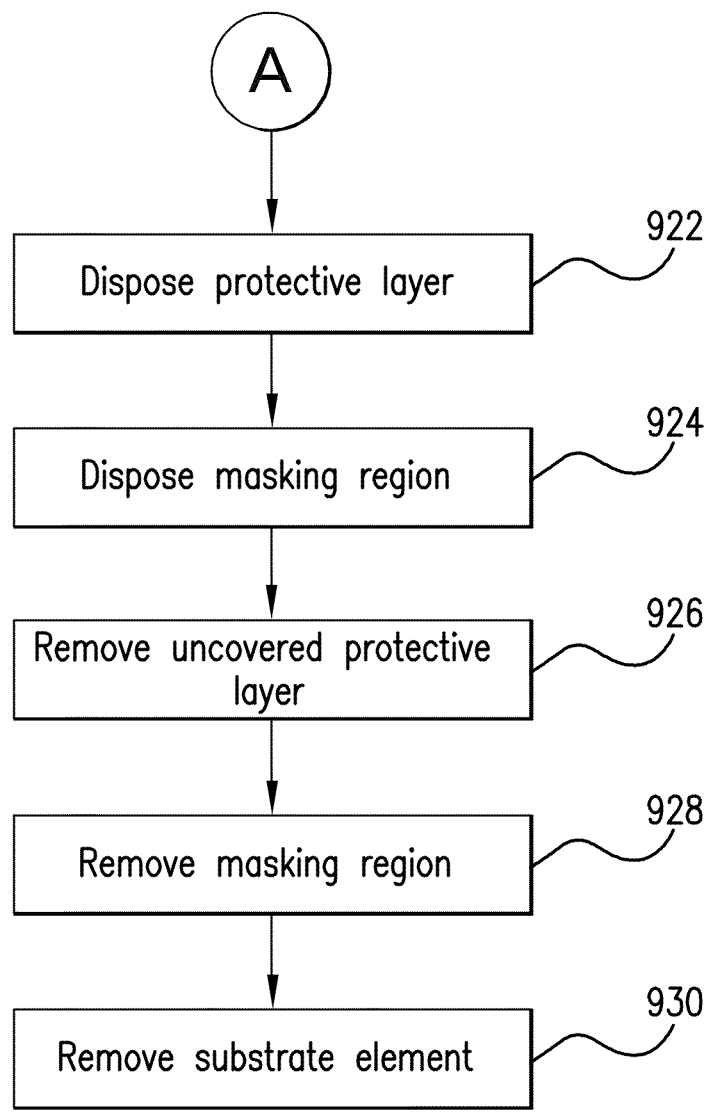

In another embodiment, as shown in flowchart 900 in FIGS. 9A-9B, and in the schematics in FIGS. 8A-8L, the present invention provides methods for generating substrate elements that can then be used in selective etching methods, as shown in FIGS. 7A-7E. Methods for preparing the substrate elements for selective etching suitably comprise generating a suspended substrate element 112' as described above and in flowcharts 400 and in FIGS. 3A-3J.

As shown in flowchart 900, in step 902, substrate layer 102 (e.g., comprising a semiconductor layer) disposed on support layer 104 (e.g., comprising a semiconductor oxide, semiconductor alloy or doped semiconductor) is provided. In step 904, one or more masking regions 108 (e.g., photolithography etch masks) are disposed on substrate layer 102, and then uncovered substrate layer sections 110 are removed (e.g. etched) in step 906. After the masking regions are suitably removed in step 908, at least a portion of support layer 104 beneath substrate layer 102 is then removed (e.g., etched) in step 910 to form one or more suspended substrate elements 112'.

In step 912 of flowchart 900, insulator layer 116 (e.g., an oxide) is then disposed on suspended substrate elements 112', and then in step 914, a gate layer 120 (e.g., a metal or polysilicon) is disposed on insulator layer 116. This generates the structure as shown in FIGS. 3A and 3B. In step 916 of flowchart 900, a masking region 108 is then disposed on gate layer 120 (as in FIGS. 3C and 3D). Uncovered gate layer 120 is then removed in step 918, thereby forming gate region 305, as shown in FIGS. 3E and 3F. In optional step 932, insulting layer 116 and substrate layer 102 can be doped with one or more dopant atoms as described herein, followed by an optional thermal anneal in step 934. The resulting structure of steps 902-918 is shown in FIGS. 3E-3F. After removal of masking region 108 in step 920, underlying gate region 305 can be seen in FIGS. 3I and 3J (note that doping 302 is an optional step).

Referring to FIGS. 8A-8B, in step 922 of flowchart 900 of FIG. 9B, a protective layer 802 is disposed on gate region 305, as well as insulator layer 116 that covers the remaining wafer surface. Protective layer 802 is suitably formed on exposed surfaces of gate, substrate and/or insulator layers. Disposing of protective layer 802 can be performed using any depositing, growing, forming, layering or similar technique, including thin film deposition, plasma or low-pressure (lp) chemical vapor deposition (CVD) (lp-CVD). In general, protective layer 802 is a layer that is differentially removable compared to other layers/portions of substrate element 112'. Suitably, protective layer 802 is differentially etchable as compared to other layers/portions of substrate element 112', and thus, it has an etch rate in a suitable etchant that is greater than the etch rate of other layers/portions of substrate element 112' when exposed to the same etchant. It is important that protective layer 802 be differentially etchable as compared to insulator layer 116 so that one or the other layer (e.g., 802 or 116) can be selectively etched will leaving the other layer essentially undisturbed. In suitable embodiments, protective layer 802 comprises a nitride, oxide, or similar material, such as $Si_3N_4$, $SiO_2$ or $Al_2O_3$. As shown in FIG. 8B, protective layer 802 suitably covers all of wafer 101, though it can also cover only a portion of the wafer if desired.

In step 924 of flowchart 900, one or more masking regions 108 (e.g., photolithography etch masks) are disposed on protective layer 802 as shown in FIGS. 8C and 8D. As represented in FIG. 8D, suitably at least a portion of underlying protective layer 802 is not covered by masking regions 108. In step 926, uncovered protective layer sections are then removed, revealing sections of substrate layer 102 covered by insulator layer 116, as shown in FIG. 8F. As shown in FIG. 8F, in suitable embodiments, substrate layer 102 (and substrate element 112') can be doped (e.g., lightly doped or heavily doped as discussed herein) to form doped regions 304. In step 928, masking regions 108 are then removed. Then, in step 930, substrate element 112' is removed. As discussed herein, suitably, substrate element 112' is removed by disposing a masking region 108 over the substrate element, and then removing a portion of the substrate element and the substrate layer 102 so as to separate it from the substrate layer 102, as shown in FIGS. 8G-8J. In other embodiments, substrate element 112' can be removed using the various other methods as described herein (e.g., mechanical cutting). As shown in FIGS. 8K and 8L, following removal, selectively etchable substrate element 804 is produced, which comprises a substrate element core 112 (substrate layer 102), surrounded by an insulator layer 116. As shown in FIG. 8L, element 804 also suitably comprises a gate region 120/305. By selectively removing portions of protective layer 802 as described herein, sections of substrate layer/insulator layer 102/116 are exposed (these regions can also be doped to generate doped regions 304). The remainder of element 804, however, is covered by protective layer 802.

As noted herein, selectively etchable substrate elements 804 are suitably used in the methods shown in FIGS. 7A-7E. FIG. 7A shows a cross-section through the length of element 804, showing substrate element core 112, surrounded by insulator layer 116. Gate layer/gate section 120/305 can be seen near the center of the element. Protective layer 802 can also be seen covering nearly all of element 804, however, with exposed sections of insulator layer 116 at either end (702/704). FIGS. 7B and 7C demonstrate the use of selectively etchable substrate element 804 and the ability of these elements to reduce or eliminate shorts due to improper element placement. As shown in FIG. 7B describing the use of a gate etch, if selectively etchable substrate element 804 is correctly placed, masking regions 108 cover all elements except gate region 305. An etch is then used to remove a portion of protective layer 802 (e.g. a nitride layer) covering gate layer/region 120/305 (e.g., a metal). This exposes the underlying gate region 305, which can then be electrically connected to a gate electrode. In contrast, in FIG. 7C, an incorrectly placed wire, when masked using the same pattern as in FIG. 7B, and then performing an etch to selectively remove protective layer 802, rather than revealing exposed gate region 305, instead reveals only the underlying insulator layer 116. Thus, connection to a gate electrode is not established, and while this selectively etchable substrate element 804 is not electrically connected, it also does not lead to a short in the circuit. The electrical circuit of which element 804 is a component can be designed in such a way so as to mitigate the situation when element 804 is not electrically connected due to misplacement or misalignment. For example, the circuit can be designed to accept multiple copies of element 804 at each node where element 804 is needed. Of, in other embodiments, a higher level of redundancy scheme could be used in which a sub-section of the circuit is switched off in the case of a missing substrate element. Other redundancy schemes, such as those commonly used to handle defects in memory or logic circuits, can also be used.

As shown in FIG. 7D, if instead of etching to expose gate region 305, masking regions 108 are disposed on selectively etchable substrate element 804 so as to mask gate region 305 and allow access to insulator layer 116. If the element is correctly placed, an etch selective for insulator layer 116 (e.g., an oxide etch) removes insulator layer 116, thereby revealing underling portions of substrate element 112, which in suitable embodiments can be doped source and/or drain regions. If selectively etchable substrate element 804 is incorrectly placed as in FIG. 7E, masking leaves exposed a section of protective layer 802 instead. Thus, an etch selective for insulator layer 116 does not etch protective layer 802, and thus, no electrical connection is made to selectively etchable substrate element 804.

Figure 13A:
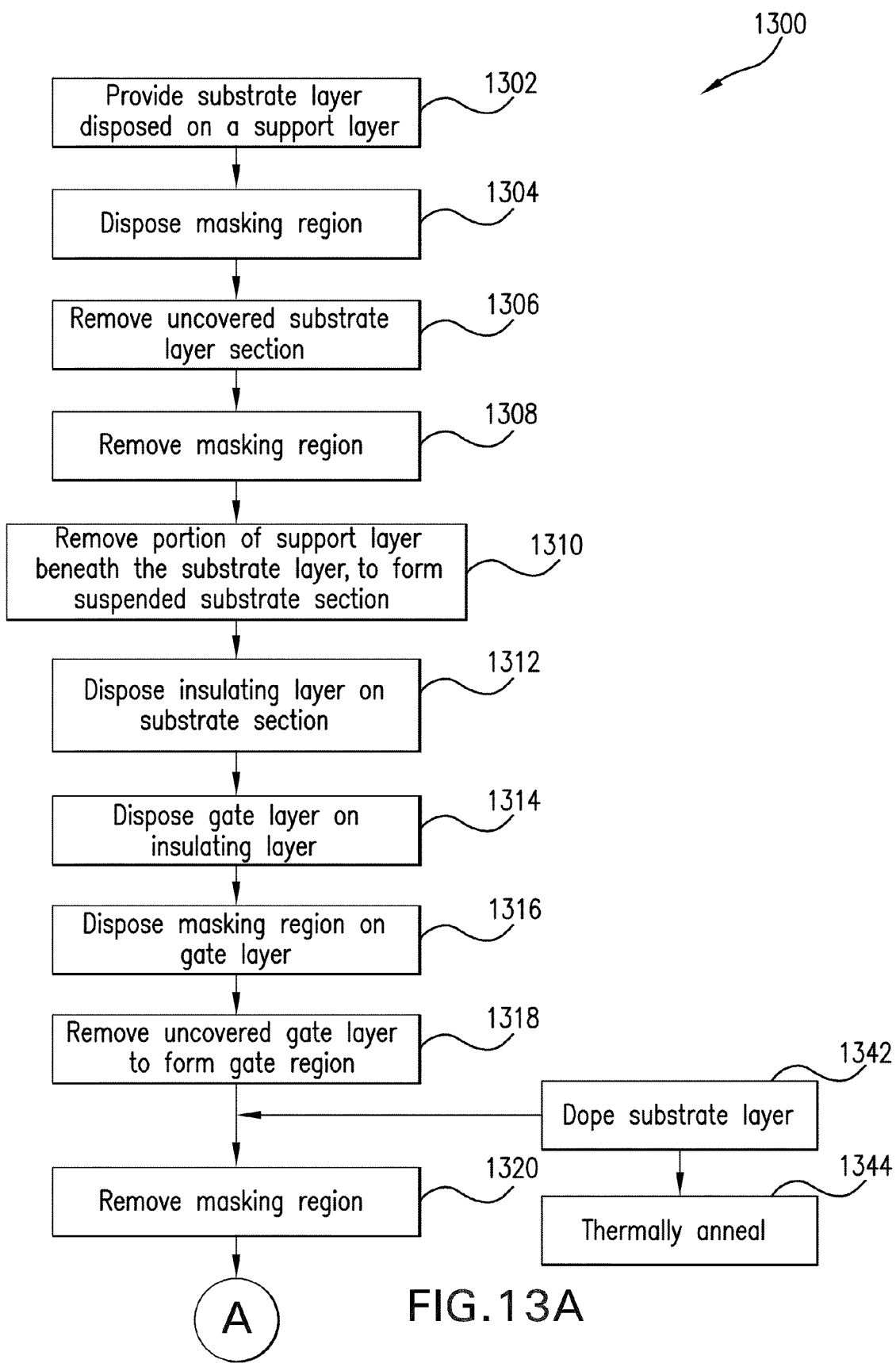
FIG. 13A-13B show a flowchart of a further method of forming substrate elements in accordance with one embodiment of the present invention.
Figure 13B:
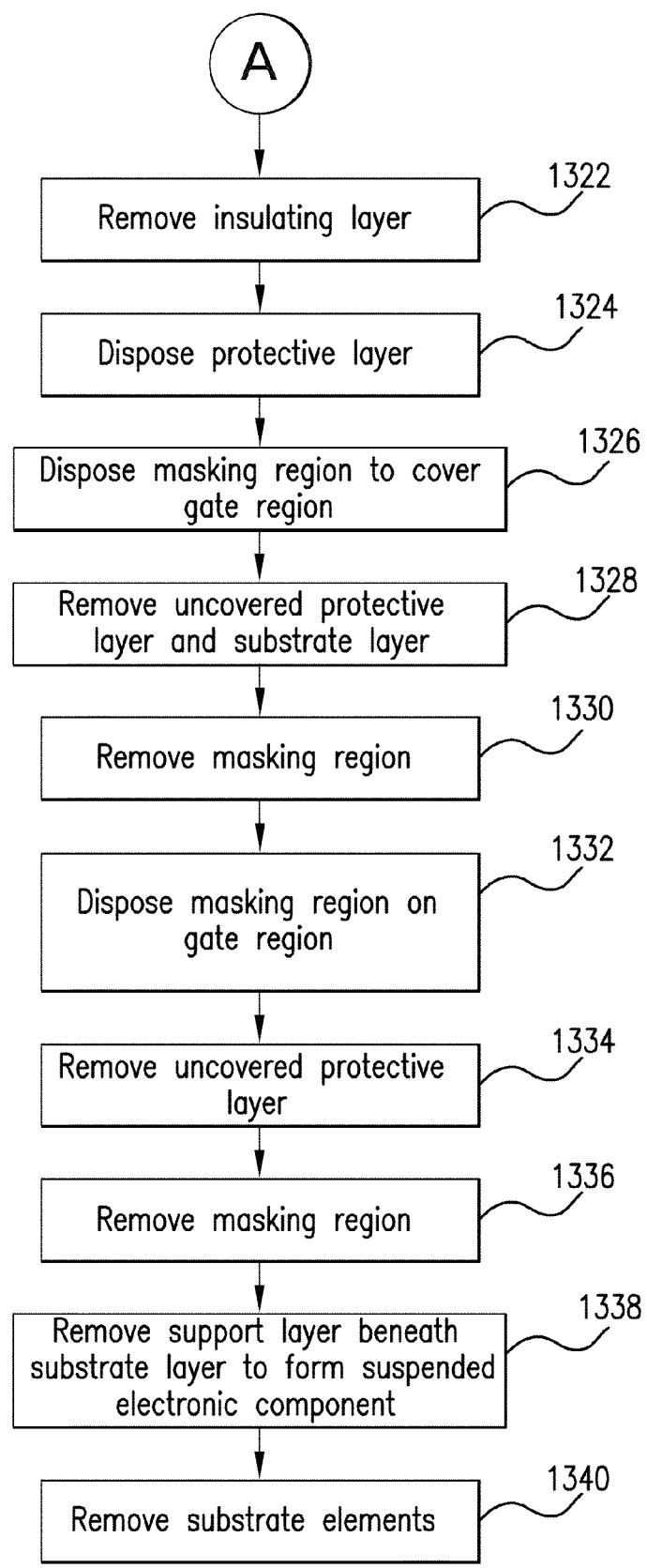

In a further embodiment, the present invention provides additional methods for forming one or more substrate elements, as shown in flowchart 1300 of FIGS. 13A-13B, with reference to the schematics in FIGS. 10A-10R, 11A-11J and 12A-12M. The initial steps of flowchart 1300 are similar to those described herein above. For example, in step 1302, substrate layer 102 (e.g., comprising a semiconductor layer) disposed on support layer 104 (e.g., comprising a semiconductor oxide, semiconductor alloy or doped semiconductor) is provided. In step 1304, one or more masking regions 108 (e.g., photolithography etch masks) are disposed on substrate layer 102, and then uncovered substrate layer sections 110 are removed (e.g., etched) in step 1306. It should be noted that in suitable embodiments, the dimensions of uncovered substrate sections 110 that are removed are shorter in length than the final desired length of substrate element 112'. See FIGS. 10A-10F. Use of shorter initial substrate sections helps to reduce bending and or stiction of the substrate sections during processing, including oxide etching with HF gas or other chemistries that include or evolve water; wet cleaning; oxide growth; oxide deposition; or other thin film deposition. Bending and stiction can also be reduced by modifying the water content of the various etchants used. For example, by controlling the amount of water vapor present during an etch (e.g., an HF etch), element bending and/or stiction can be reduced.

After the masking regions are removed in step 1308, at least a portion of support layer 104 beneath substrate layer 102 is then removed (e.g., etched) in step 1310 to form one or more suspended substrate sections 112. FIGS. 10G-10H show a top view of wafer 101 following formation of suspended substrate sections 112, as a well as a cross sectional view through plane 1-1. In addition, FIG. 10H also shows a cross-sectional view through plane 2-2 to the right of each wafer section. Cross-section 2-2 is taken along the length of substrate section/element. As shown in FIGS. 10I and 10J, as described herein, additional processing can occur so as to round off the corners of substrate section 112, for example, by depositing and then etching a thin oxide coating.

Figure 10A:
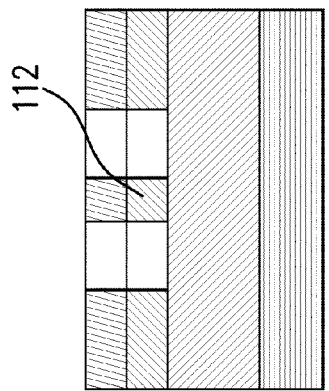
FIGS. 10A-10R show schematics of another method of forming substrate elements in accordance with one embodiment of the present invention.
Figure 10B:
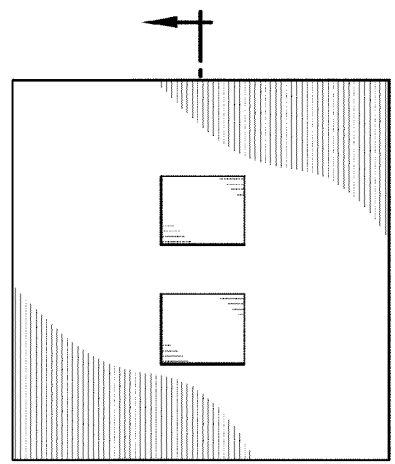
Figure 10C:
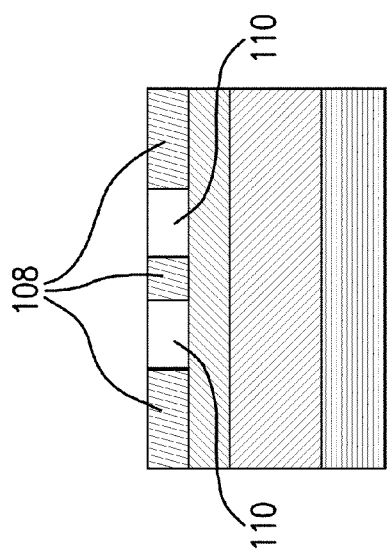
Figure 10D:
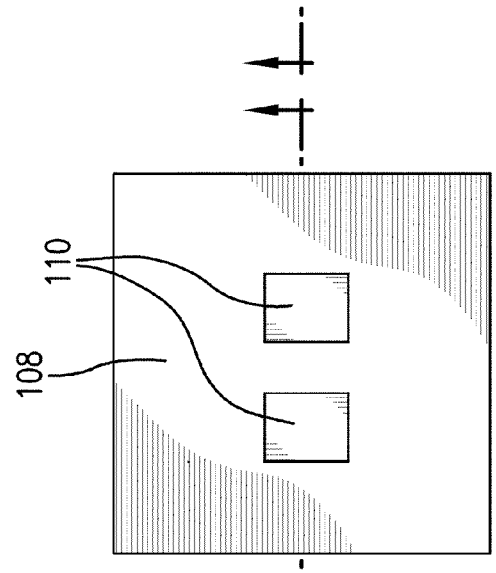
Figure 10E:
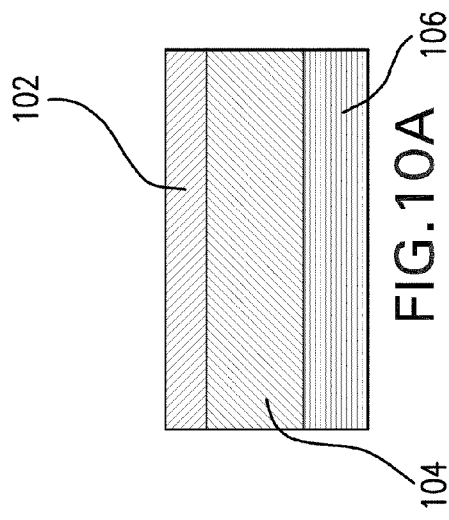
Figure 10F:
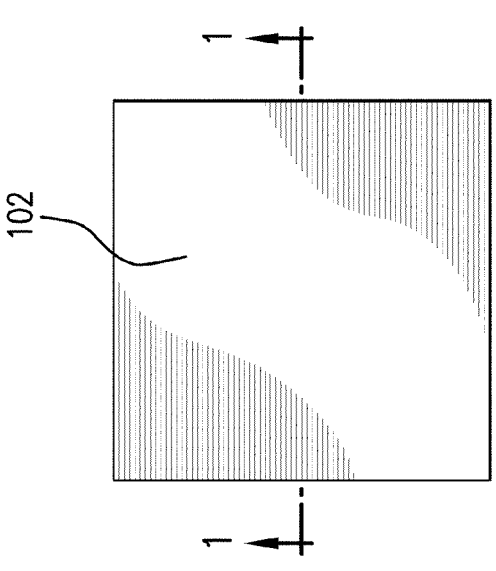
Figure 10Q:
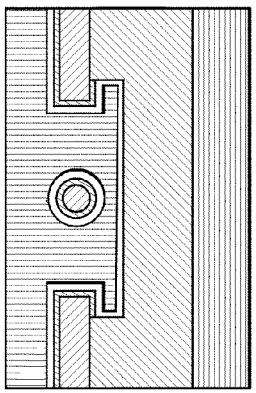
Figure 10O:
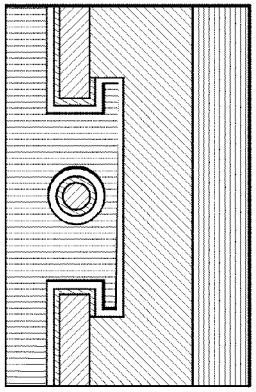
Figure 10M:
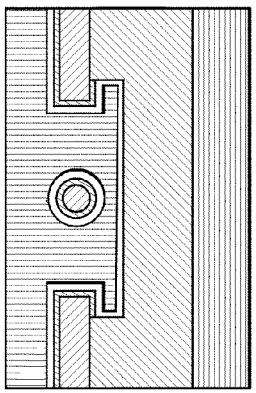
Figure 10R:
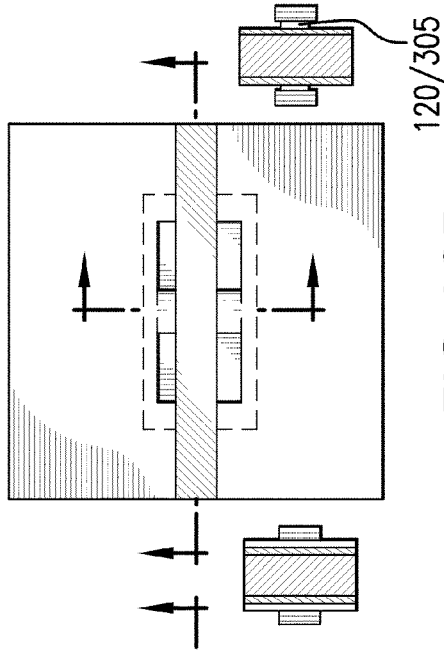
Figure 10P:
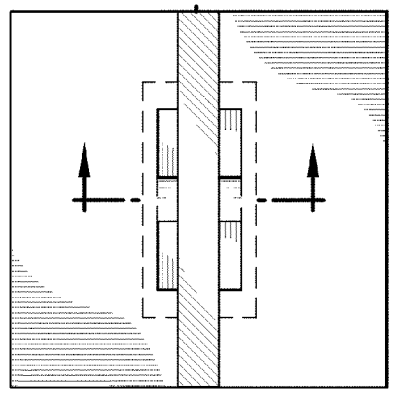
Figure 10N:
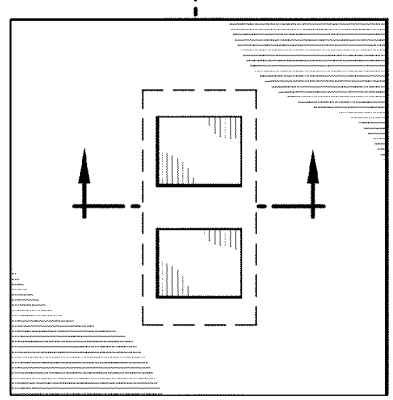

In step 1312 of flowchart 1300, insulator layer 116 (e.g., an oxide) is then disposed on suspended substrate section 112 (see FIGS. 10K and 10L), and then in step 1314, a gate layer 120 (e.g., a metal or polysilicon) is disposed on insulator layer 116 (see FIGS. 10M and 10N). In step 1316 of flowchart 1300, a masking region 108 is then disposed on gate layer 120 (as in FIGS. 10O and 10P). Uncovered gate layer 120 is then removed in step 1318, thereby forming gate region 120/305, as shown in FIGS. 10Q and 10R. As can be seen in FIG. 10R, removal of uncovered gate layer 120 (for example by etching) can remove some of gate material that is below masking region 108, in effect making gate region 305 smaller than masking region 108.

In optional step 1342, insulting layer 116 and substrate layer 102 can be doped with one or more dopant atoms 304 as described herein, and as shown in FIGS. 11A-11B. Suitably, dopant atoms are provided at an angle of between about 30°-80° to the surface of the substrate, for example between about 30°-60°, or at about 45° to the surface, as in FIGS. 11A-11B. Doping at an angle helps to deposit dopant atoms to all surfaces of the suspended substrate section 112'. As discussed herein, a thermal annealing step 1344 can then be performed following the doping. After removal of masking region 108 in step 1320, underlying gate region 305 can be see in FIGS. 11C and 11D. The length-wise cross-section (2-2) shown in FIG. 11D shows that the portion of substrate section 112 (substrate layer 102) that was covered by masking region 108 is not doped if a dopant was added.

Figure 11I:
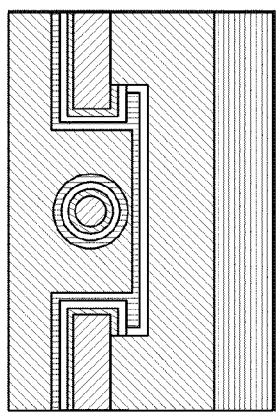
Figure 11J:
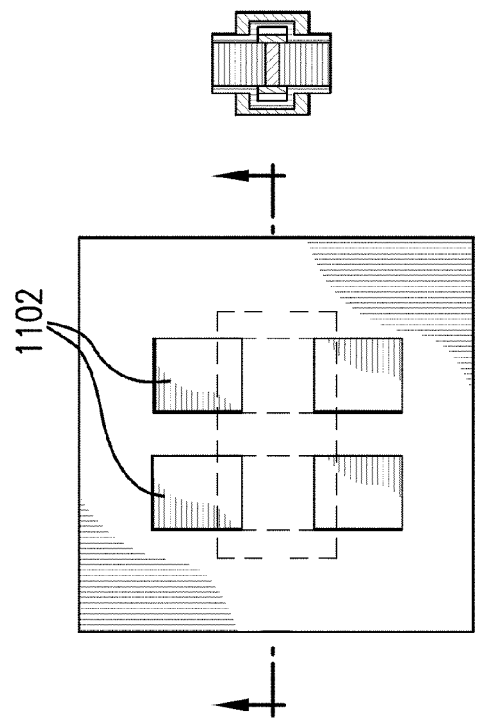
Figure 11G:
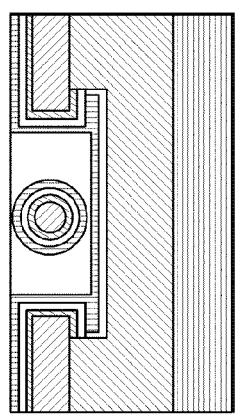
Figure 11H:
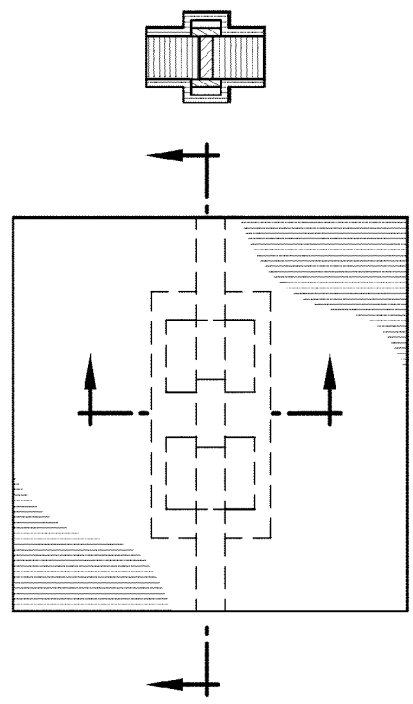

In step 1322 of flowchart 1300 of FIG. 13B, insulator layer 116 is then removed (e.g., etched), thereby revealing substrate layer 102. As shown in FIGS. 11E and 11F, insulator layer 116 that was under gate region 305 was not removed. In step 1324, a protective layer 802, e.g. a nitride layer, is then disposed on the wafer. As shown in FIGS. 11G-11H, protective layer 802 covers all exposed surfaces of wafer 101, including gate region 305 and substrate layer 102. In step 1326, masking region 108 is then disposed on protective layer 802 to at least cover gate region 305. As shown in FIG. 11J, sections of protective layer 1102 are suitably not covered. These uncovered protective layer sections 1102, as well as the underlying substrate layer 102, are then removed (e.g., etched) in step 1328. As shown in FIG. 12A this exposes support layer 104, and defines the overall length of the final substrate element 112'.

In step 1330, masking region 108 is removed, and then a subsequent masking region 108 is disposed on gate region 305 in step 1332. As shown in FIG. 12D, masking region 108 also covers protective layer 802 that is on top of gate region 305. Then, in step 1334, uncovered protective layer 802 that is outside of masking region 108 is then removed (e.g., etched). As shown in FIG. 12F, this exposes substrate layer 102 below, and the full length of substrate element 112.

Following the removal of masking region 108 in step 1336, at least a portion of support layer 104 beneath substrate layer 102 is removed in step 1338, thereby forming suspended substrate element 112' as described herein. As shown in FIG. 12H, suspended substrate element 112' comprises a gate region 305 covering an insulator layer 116, both of which are covered by protective layer 802. In step 1340, substrate elements 112' are then removed. As shown in FIGS. 12I-12M, this removal process suitably comprises disposing a masking region and then etching to remove the substrate element 112'. After removal of the element from wafer 101, masking region 108 is then removed, leaving substrate element 112' as in FIG. 12M that can now be utilized in various applications as described herein. In suitable embodiments, protective layer 802 is removed from substrate element 112' prior to use so as to expose gate region 305 to allow it to be electrically connected to an electrode. As noted herein, in exemplary embodiments, substrate layer 102 can be doped so as to form source or drain regions 304.

In further embodiments, the present invention provides methods for encapsulating substrate elements with a non-conductive layer, for example, a dielectric. As described herein, in suitable embodiments, the substrate elements can comprise a gate region as well as doped sections (including both heavily doped and lightly doped regions, such as source and drain regions). Suitably, after the gate region has been formed (e.g., with lithography and etching) and the doped regions have been generated and annealed, a non-conductive layer is added to the outside of the substrate element (e.g., the transistor) while still on wafer 101.

In exemplary embodiments, the non-conductive layer can be disposed by low temperature deposition of a dielectric material, such as, but not limited to, a $SiO_2$, $Si_3N_4$ or $Al_2O_3$ layer (similar to an interlayer dielectric deposition step). In further embodiments, the non-conductive layer can be formed by oxidation of a semiconductor (e.g., Si) or deposition of an organic insulator using techniques known in the art.

Figure 5Q:
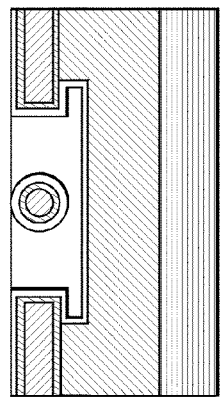
Figure 5S:
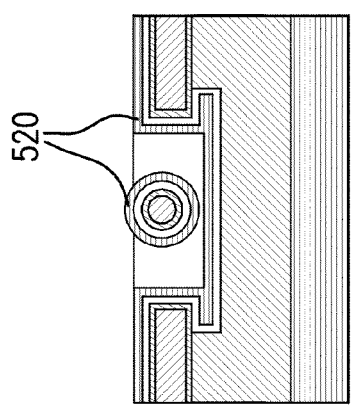
Figure 5U:
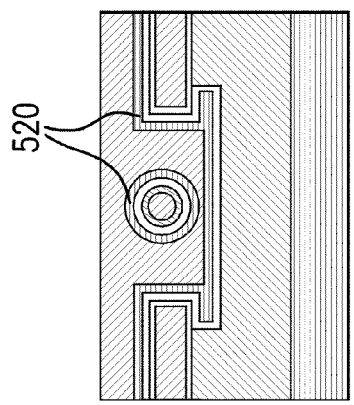
Figure 5R:
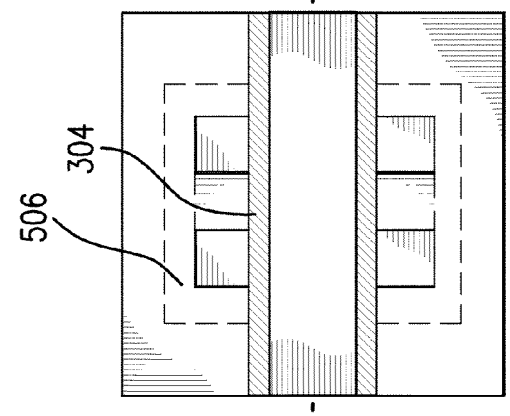
Figure 5T:
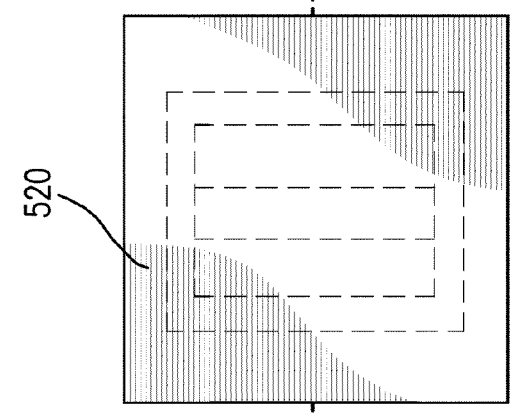
Figure 5V:
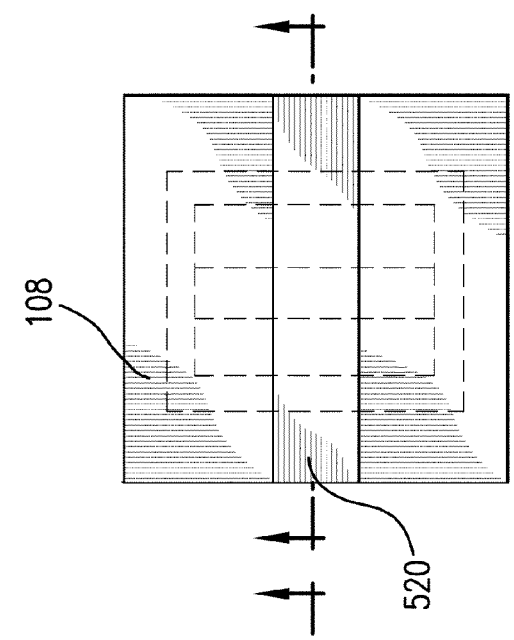

This non-conductive layer can be deposited such that it is uniform over all surfaces of the substrate element, or it can be preferentially deposited across the regions which require protection from electrical conduction from a gate electrode (e.g., gate shorts). In exemplary embodiments, as shown in FIGS. 5Q-5Z, a non-conductive layer 520 can be initially disposed over the entire substrate element. FIGS. 5Q and 5R represent the same structure shown FIGS. 5I and 5J of a substrate element 120 comprising a highly doped 506 and a lightly doped 304 region, as well as a gate region 305. Non-conductive layer 520 is then disposed over the entire element and wafer, as in FIGS. 5S and 5T. In exemplary embodiments, an $SiO_2$, $Si_3N_4$ of $Al_2O_3$ non-conductive layer is disposed. As shown in FIGS. 5U and 5V, the end portions of substrate element 120 are then masked, thereby leaving exposed the non-conductive layer that is covering the central portion (i.e., the gate region 305) of the structure, but covering the source and drain regions. In FIGS. 5W and 5X, the non-conductive layer is then etched, thereby revealing the underlying gate region 120/305, but with the ends of substrate element 120, including doped drain and source regions (304 and 506), remaining protected by non-conductive layer 520. As shown in FIGS. 5Y and 5Z, subsequent removal of substrate element 120 from wafer 101 (for example by etching or mechanical cutting as described herein) results in a protected transistor element 522 in which the gate region 120/305 is not covered, but both ends of the element (e.g. the doped source and drain) are protected by non-conductive layer 520.

As the final length of the substrate element (e.g., nanowire or transistor) is often dictated by the minimum dimensions of lines and spaces for the lithography of the contacting substrate in the final application, use of a non-conductive layer over at least a portion of the substrate element (e.g., a transistor) allows for generation of shorter elements/nanowires/transistors. For example, in order to have a matching contact length and minimum dimension, the element (e.g., nanowire or transistor) required is generally about five times the minimum geometry. Therefore, for example, a 2 µm minimum feature would require an overall length of the substrate element to be about the 10 µm, for a 1.5 µm feature, the element would have to be about 7.5 µm in length, for a 1 µm feature, the element would have be about 5 µm in length, etc. To preclude gate shorts in this configuration, the length of the gate region must be smaller than the minimum feature size or other differential contacting schemes must be used. Use of non-conducting layer 520 allows for protection of the source and drain regions, thereby allowing for the generation of a shorter substrate element (nanowire, transistor, etc.).

Figure 14G:
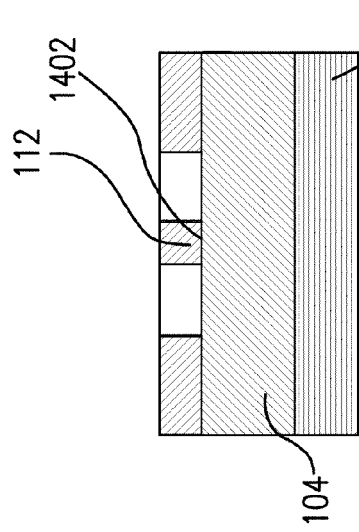
FIGS. 14A-14R show a still further method of forming substrate elements in accordance with one embodiment of the present invention.
Figure 14I:
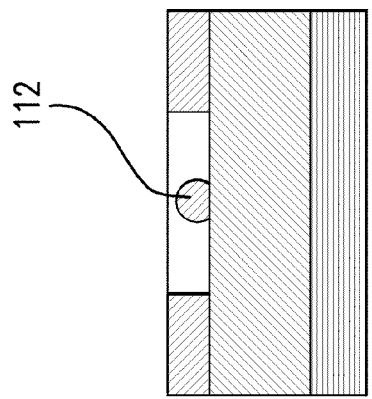
Figure 14K:
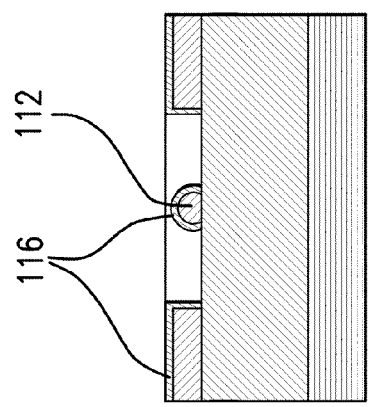
Figure 14H:
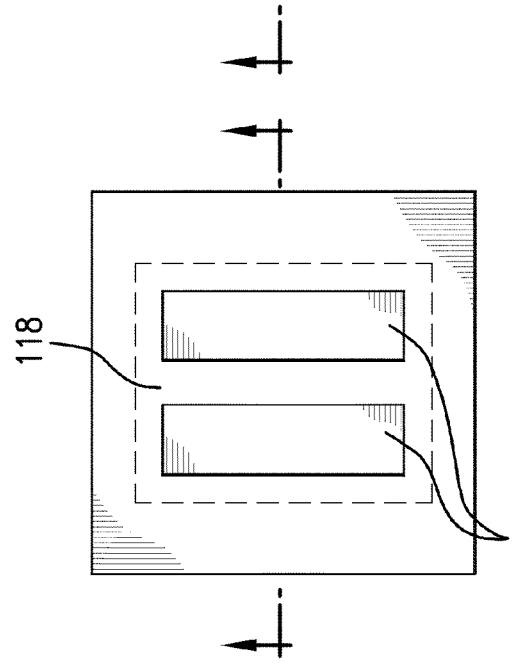
Figure 14J:
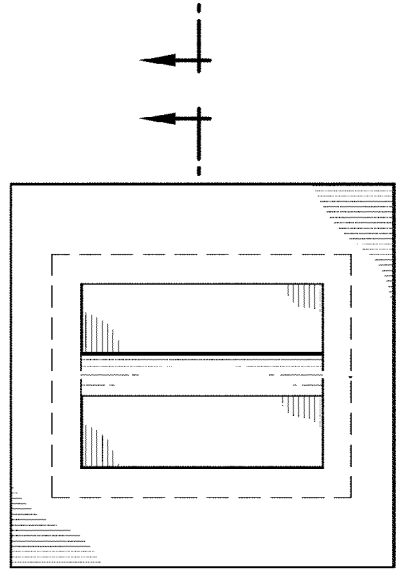
Figure 14L:
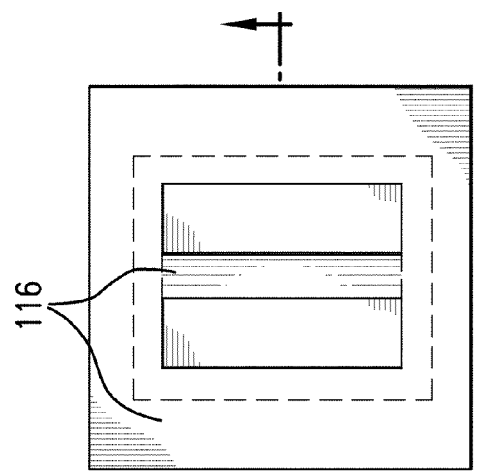
Figure 14M:
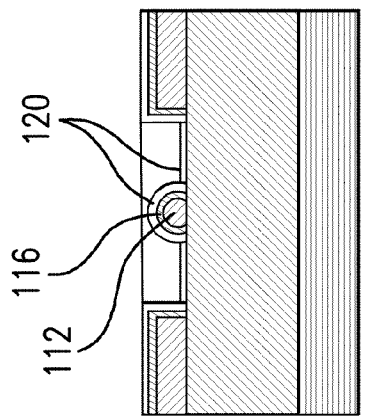
Figure 14N:
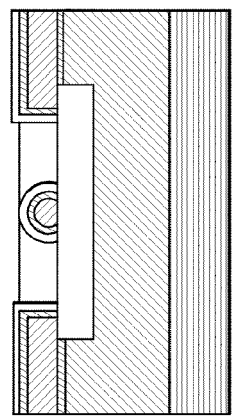
Figure 14O:
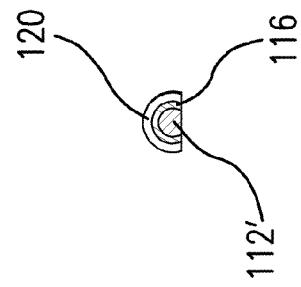
Figure 14Q:
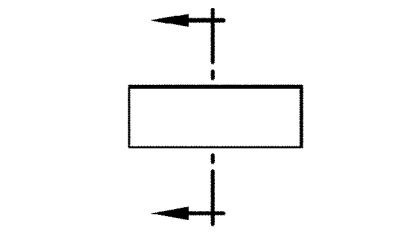
Figure 14P:
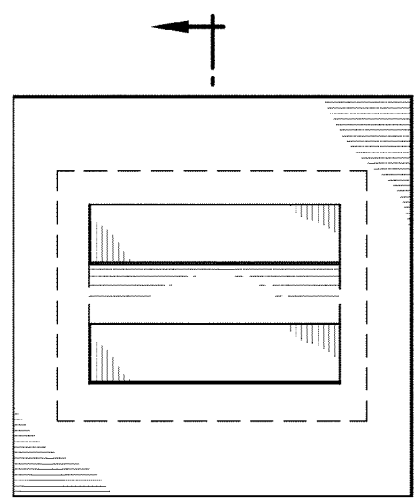
Figure 14R:
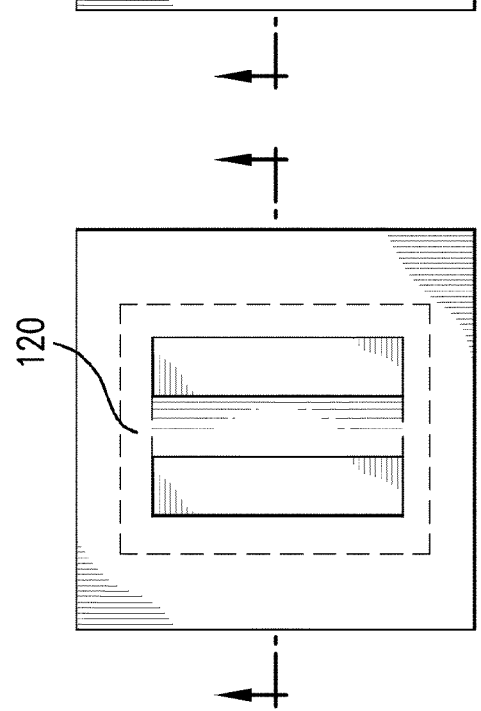
Figure 15:
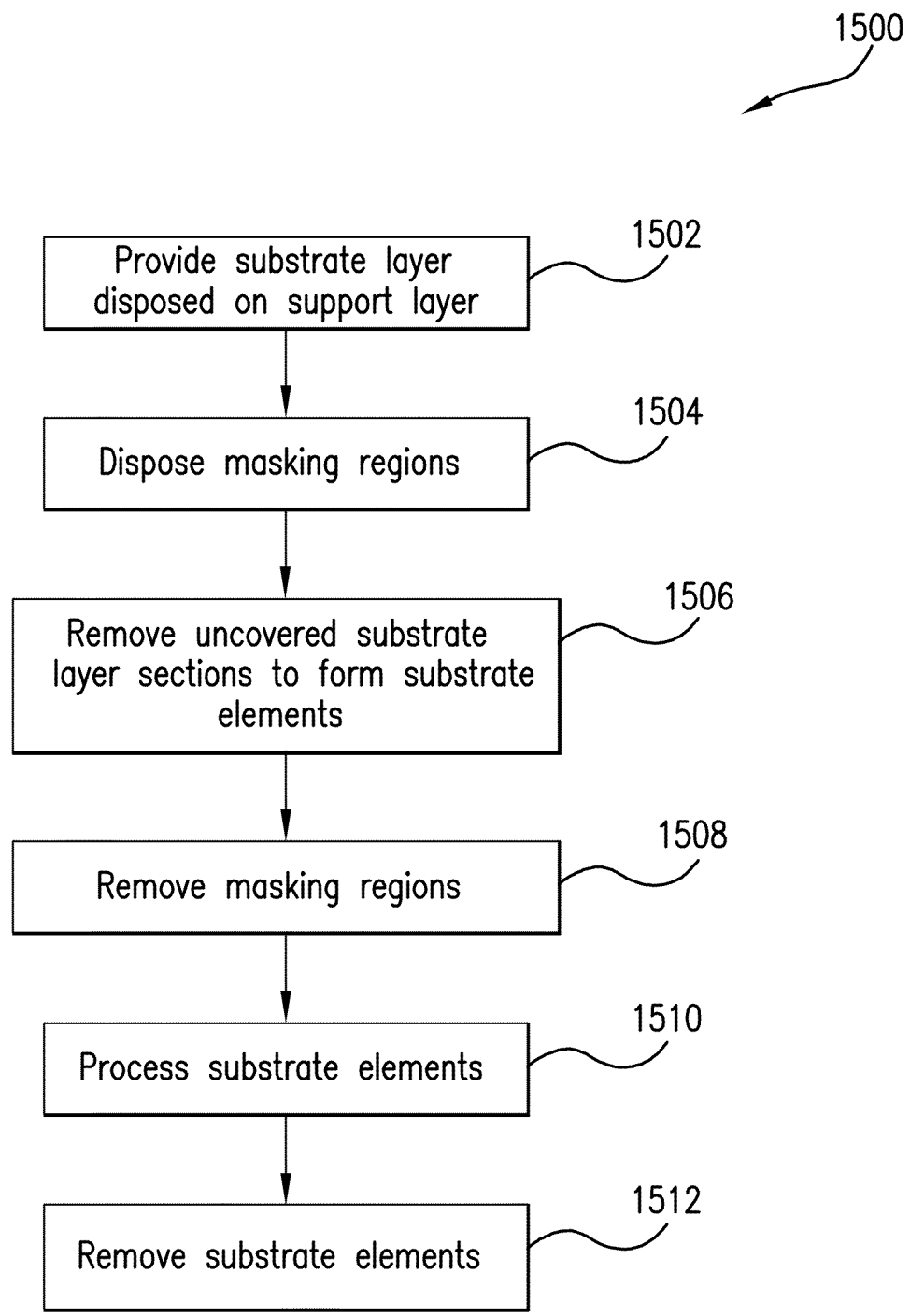
FIG. 15 shows a flowchart of a still further method of forming substrate elements in accordance with one embodiment of the present invention.

In further embodiments, as shown in the schematics in FIGS. 14A-14R and in flowchart 1500 in FIG. 15, the present invention provides methods for forming one or more substrate elements which does not utilize the production of a suspended substrate element. As shown in flowchart 1500, the method begins in a similar manner to that described hereinabove. In step 1502, a substrate layer 102 (e.g., comprising a semiconductor layer) disposed on support layer 104 (e.g., comprising a semiconductor oxide, semiconductor alloy or doped semiconductor) is provided. In step 1504, one or more masking regions 108 (e.g., photolithography etch masks) are disposed on substrate layer 102, and then uncovered substrate layer sections 110 are removed (e.g. etched) in step 1506 (see FIGS. 14A-14F) to generate substrate element 112.

Masking regions 108 are then removed in step 1508. Rather than removing a portion of underlying support layer 104 at this time, substrate element 112 is now further processed in step 1510. As described herein, further processing can include, for example, rounding off of the corners of substrate element 112, for example, as shown in FIGS. 14I and 14J. Processing can also further comprise deposition of insulator layer 116 on substrate element 112, as shown in FIGS. 14K and 14L. In embodiments where insulator layer 116 comprises an oxide layer grown on substrate element 112 (and substrate layer 102), oxide is only deposited on the substrate layer surfaces, as shown in FIGS. 14K and 14L. As can be seen in FIGS. 14L, only exposed surfaces of substrate layer 102, and specifically the exposed surfaces of substrate element 112 comprise insulator layer 116. Thus, as shown in FIG. 14L, as the surface of substrate element 112 is still disposed on support layer 104, it does not comprise an insulator layer.

As described herein, and as shown in FIGS. 14M and 14N, gate layer 120 can also be disposed on insulator layer. In further embodiments, additional processing can be performed as disclosed herein. For example, substrate element 112 can be doped using various doping atoms, and additional protective layers, such as nitride layers, can also be added, as well as the generation of gate regions as described herein.

In step 1512, substrate element 112 is then removed. As described herein, and as represented in FIGS. 14O and 14P, at least a portion of support layer 104 beneath substrate element 112 can be removed, thereby generating a suspended substrate element that can be removed from wafer 101. For example, the element can be removed by disposing one or more masking regions 108 on the suspended substrate elements, and then removing at least a portion of the suspended substrate elements and/or the substrate layer, thereby separating the suspended substrate elements from the substrate layer. In further embodiments, substrate elements 112 can be removed from support layer 104 by mechanically cutting the substrate elements so as to separate the substrate elements from the substrate layer, or any other suitable method. As shown in FIG. 14Q, substrate element 112' can comprise an insulator layer 116 and a gate layer 120 covering nearly all of the element.

In a still further embodiment, as shown in FIGS. 16A-16D, the present invention provides methods for generating two-dimensional circuits (and the circuits themselves), that can be electrically connected, regardless of how the die is ultimately oriented, e.g., forward, backward, upside, etc, prior to connection. As shown in FIG. 16A, two-dimensional die 1602 suitably comprises one or more circuit elements 1604, each of which has two, redundant terminals (a,a; b,b; c,c; and d,d as shown). For example, as shown in FIG. 16A, two-dimensional dies 1602 can comprise 1 or more (e.g., 2, 4, 10, 20, 50, 100, etc.) circuit elements 1604. As shown in FIG. 16B, during deposition of two-dimensional die 1602, the die can be rotated, such that the top and bottom of the die are reversed compared to FIG. 16A. In FIG. 16C, the die (original die A) is flipped so that the back of the die is now facing out of the plane of the page. In FIG. 16D, the die (original die A) is flipped and rotated, so that it is both upside down and backwards. However, due to the redundancy and placement of terminals 1606, the circuit can still be electrically connected as described below.

In suitable embodiments, each of terminals 1606 are covered by a material which has a differential removal property (e.g., is differentially etchable or selectively removable) as compared to the other terminals (or at least differentially removable as compared to terminals along the same electrical connection line). For example, terminals "a" can be covered by an insulator material (e.g., an oxide) while terminal "b" is covered by some other protective layer (such as a nitride). In FIGS. 16A-16D, electrode 1608 represents the connection for the "a" terminals; electrode 1610 the connection for the "c" terminals; electrode 1612 the connection for the "d" terminals; and electrode 1614 the connection for the "b" terminals.

As it is necessary to connect the proper terminal to the proper electrode to avoid short circuits or other malfunctions, the present invention provides methods for insuring that only the proper electrode is attached to the proper terminals. In exemplary embodiments, a masking region (e.g., a photolithography mask) is disposed over the two-dimensional die so as to cover the position of electrodes 1610, 1612 and 1614, but the position of electrode 1608 is not masked. Then, a etch selective for terminal "a" is applied, thereby removing the covering on terminal a and allowing it to be electrically connected, but not removing, the covering on terminal b. No matter what the orientation of two-dimensional die 1602 (in A, B, C, or D) at least terminal "a" is always located at the upper portion of the die, and thus, in the position where electrode 1608 is to be connected (in FIGS. 16C and 16D, the connection will occur through the back of the die). Following the removal of the selectively removable material covering terminal a, the masking region is then removed and the terminal is electrically connected. Then, a subsequent mask is applied, this time leaving open the position of electrode 1610. Then, the selectively removable material above terminal c is removed to expose terminal c, and electrode 1610 can then be connected. A similar method is then used to mask, expose terminals d and b, and then connect terminals 1612 and 1614 respectively. In additional embodiments, all of the terminals can also be eclectically connected at the end of the process, once the covering on the terminals has been selectively removed. As with terminals a, the use of redundant terminals allows for the die to be electrically connected no matter what the orientation of the die (FIGS. 16A-16D). This in effect forms a design for which the substrate element (die) is ensured to be connected correctly, even if it is flipped and/or rotated 180 degrees. Note that because the die can be connected from the front or back, vias or other conductive pathways must be created between the front and back sides of the die at the locations of the connection points a, b, c, and d.

Figure 18:
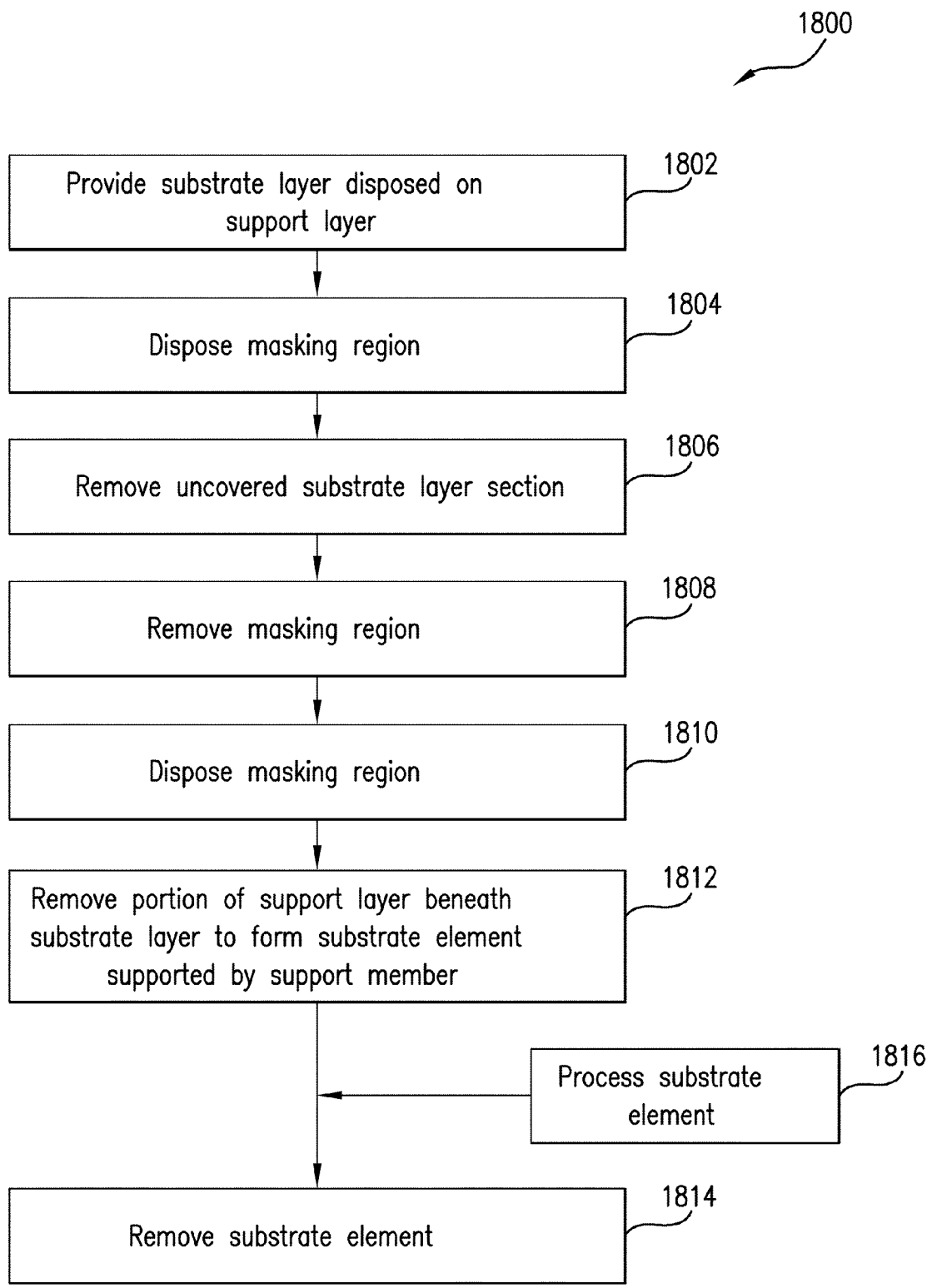
FIG. 18 shows a flowchart of a method for forming substrate elements utilizing support members in accordance with one embodiment of the present invention.

In further embodiments, as shown in FIGS. 17A-17N, with reference to flowchart 1800 of FIG. 18, the present invention provides additional methods for forming one or more substrate elements utilizing support members. In the schematics of FIGS. 17A-17K, the figures on the bottom half of the page (e.g., FIGS. 17B, 17D, 17F, 17H, 17J and 17L) show top views of wafer 101 during the processing described throughout. The figures on the top half of the page (e.g., FIGS. 17A, 17C, 17E, 17G, 17I and 17K) show cross sectional views taken through the various layers of wafer 101. The double headed arrows (1-1) shown in the bottom half of the page indicate the location and direction of the cross-sectional view through wafer 101 shown in the top half of the page.

As shown in flowchart 1800, and in FIGS. 17A-17B, in step 1802, wafer 101 comprising a substrate layer 102 disposed on a support layer 104, is provided. As described herein, suitably substrate layer 102 fully covers support layer 104, though it is not required that support layer 104 be fully covered. The thickness and dimensions of support layer and substrate layer are described herein. As discussed in detail throughout, suitably substrate layer 102 and support layer 104 are differentially removable. Exemplary substances for use as substrate layer 102 and support layer 104 are described throughout. In exemplary embodiments, substrate layer 102 comprises a semiconductor (e.g., Si) and support layer 104 comprises a semiconductor oxide (e.g., $SiO_2$), semiconductor alloy (e.g., SiGe), doped semiconductor (e.g., doped Si) or polysilicon.

In step 1804 of flowchart 1800, one or more masking regions 108 are disposed on substrate layer 102 to cover at least a portion of substrate layer 102, as shown in FIGS. 17C-17D. Exemplary materials for use as masking regions 108 (e.g., photolithography masks) are described herein and otherwise known in the art. In step 1806 of flowchart 1800, uncovered substrate layer sections 110 are removed. This generates a substrate section 112 beneath masking regions, as shown in FIG. 17E-17F. Substrate section 112 is still connected to substrate layer 102 at either one or both ends at attachment points 111. As shown in FIG. 17E, removing uncovered substrate layer sections 110 reveals support layer sections 1702. As discussed herein, as substrate layer 102 and support layer 104 are differentially removable, removal of substrate layer 102 does not substantially impact the integrity of underlying support layer 104.

In step 1808 of flowchart 1800, masking regions 108 are suitably removed. Then, in step 1810 of flowchart 1800, one or more masking regions 108 are disposed on substrate layer 102, substrate section 112 and support layer sections 1702. As shown in FIGS. 17G and 17H, masking regions 108 which are disposed in step 1808 suitably cover at least a portion of substrate section 112, and also fill in the void above support layer sections 1702 which flank substrate section 112. In exemplary embodiments, sections of masking regions 108 cross wafer 101 in a direction that is substantially normal to substrate section 112, though any orientation can be used. In exemplary embodiments, two or more (e.g., 3, 4, 5, 6, 7, 8, 9, 10, 20, etc.) masking regions 108 are disposed as shown in FIG. 17H so as to cover multiple sections of substrate section 112.

In step 1812, at least a portion of support layer 104 beneath substrate layer 102 is removed, thereby forming one or more substrate elements 112", wherein the substrate elements 112" are supported by one or more support members 1704, as shown in FIGS. 17I and 17J. The use of masking regions 108 to cover at least a portion of substrate section 112 and support layer sections 1702 provides protection to the masked regions during removal (e.g., etching as described herein). Thus, while removal of support layer 104 is allowed to continue beneath substrate section 112 over the majority of the length of the section, areas which are masked by masking regions 108 will not be directly removed as quickly.

For example, if an etchant (e.g., an isotropic etchant) is used to remove support layer 104, in areas that are protected by masking regions 108, the etchant will not be able to remove material (or not remove material as quickly) beneath the substrate section 112. This generates support members 1704 beneath masking regions 108, where etchant cannot reach (or where the rate of etching was less than it was in unmasked areas). Support members 1704 comprise support layer material 104 and form a type of pillar or post beneath substrate element 112". As shown in FIGS. 17K and 17L, following the removal of masking regions 108, substrate element 112" is supported by support members 2004 along the length of substrate element 112" as shown in FIG. 17L (dotted lines showing support members 1704 beneath substrate element 112"). FIG. 17N shows an expanded view of substrate element 112" and support members 1704 of FIG. 17M. It should be noted that any number of support members 1704 can be formed at utilized to aid in supporting substrate element 112".

As described herein, disposing of masking regions 108 suitably comprises disposing etch-resistant masking regions, such as photolithography masks. Uncovered substrate layer sections are then suitably removed by etching, such as anisotropic etching, so that substrate layer sections are removed primarily only in a direction that is normal to the plane of substrate layer 102. As described herein, removing of a portion of support layer beneath substrate layer 102 suitably comprises isotropic etching where the rate of etching is the same, or substantially the same in all directions. However, as masking regions 108 cover sections of substrate layer sections 112, the support layer 104 beneath these covered substrate layer sections will not be substantially etched so that a support member 1704 is formed.

In step 1814 of flowchart 1800, substrate element 112" is removed from wafer 101. As described herein, various methods can be used to remove substrate element 112" from wafer 101 in step 1814. For example, in suitable embodiments, the removing in step 1814 comprises, first, disposing one or more masking regions 108 on the substrate elements 112". At least a portion of the substrate element 112" and/or substrate layer 102 are then removed, thereby separating the substrate element 112" from the substrate layer 102, as described herein. Removing substrate element 112"/substrate layer 102 reveals support layer 104 beneath. Substrate element 112" is then surrounded by masking region 108 and this entire structure can be removed from wafer 101. In alternative embodiments, substrate element 112" and masking region 108 can remain on wafer 101 before removing masking region 108. Removing masking region 108 (e.g., dissolving) then leaves substrate element 112" as a separate structure. As discussed throughout, suitably masking region 108 is a photolithography mask which is etch-resistant. Removal of the portion of the substrate 112" and/or substrate layer 102 is suitably carried out by etching using the various techniques described herein. In suitable embodiments, anisotropic etching is used so that substrate elements 112" are removed from substrate layer 102 by etching primarily in a direction normal to the plane of the substrate layer such that a "cut" is made at the end of substrate elements 112". In further embodiments, substrate elements 112" can be removed from substrate layer 102 by simply agitating or vibrating the substrate elements 112" (thereby also separating them from support members 1704), or by mechanically cutting, sawing, or otherwise separating the elements from substrate layer 102, as described herein.

Removal of substrate element 112" can also be carried out as shown in FIGS. 19A-19E. FIG. 19B shows an expanded view of the substrate element 112" prior to removal from FIG. 19A. As shown in FIG. 19C, temporary supports 1902 can be disposed beneath sections of substrate element 112" that are suspended between adjacent support members 1704. In exemplary embodiments, temporary supports comprise a material that is differentially etchable as compared with support members 1704. For example, temporary supports 1902 can be prepared from a photolithography mask material, such that the supports will remain even when support members 1704 are removed (e.g., etched), as shown in FIG. 19D. Then, temporary supports 1902 can be removed, thereby yielded support element 112" as in FIG. 19E.

The formation of one or more supporting members 1704 beneath elements 112" allows for further processing of the elements, as noted in step 1816 of flowchart 1800, while still on wafer 101, while maintaining additional stability to the elements. As substrate elements 112" are suspended between adjacent support members 1704 (i.e., members that are next to each other along the length of substrate element 112") processing can take place on one surface of the elements (e.g., the top, bottom, or one side), or suitably, can take place on all surfaces at the same time, as all surfaces are exposed following the undercutting of substrate element 112". Use of the support members 1704, however, reduces some of the problems that occur during processing such as substrate elements sagging or bending, and thus touching the support layer 104 and/or each other. Use of support members 1704 allows for processing of longer wires, as well as production of arrays comprising more closely spaced wires, as the problems encountered during processing can be reduced or eliminated.

Subsequent processing can comprise disposing an insulator layer 116 (e.g., an oxide layer such as silicon oxide) on the substrate elements 112" as described herein. Further processing can also comprise formation of a gate layer 120 on insulator layer 116, as described throughout. Suitably, gate layer 120 is a metal or polysilicon layer, or similar conductive material. Exemplary metals for use as gate layer 120 include, but are not limited to, palladium (Pd), iridium (Ir), nickel (Ni), platinum (Pt), gold (Au), ruthenium (Ru), cobalt (Co), tungsten (W), tellurium (Te), rhenium (Re), molybdenum (Mo), iron platinum alloy (FePt), tantalum nitride (TaN), etc. Further processing can also comprise doping substrate elements 112" as described herein, as well as disposing of various protective layers 802, such as nitride layers and other non-conductive layers, as described herein.

In further embodiments, the present invention provides nanowires (as well as transistors) suspended above a substrate comprising one or more support members 1704 in contact with the nanowire and the substrate. Suitably the nanowires and transistors comprise a semiconductor, such as Si, and the support members comprise $SiO_2$, and the substrate comprises Si. In exemplary embodiments, the nanowires comprise 2 or more (e.g., 3, 4, 5, 6, 7, 8, 9, 10, etc.) support members 1704 supporting the nanowire or transistor above the substrate, while still allowing sections of the nanowire to be suspended, and therefore able to be processed.

Figure 23A:
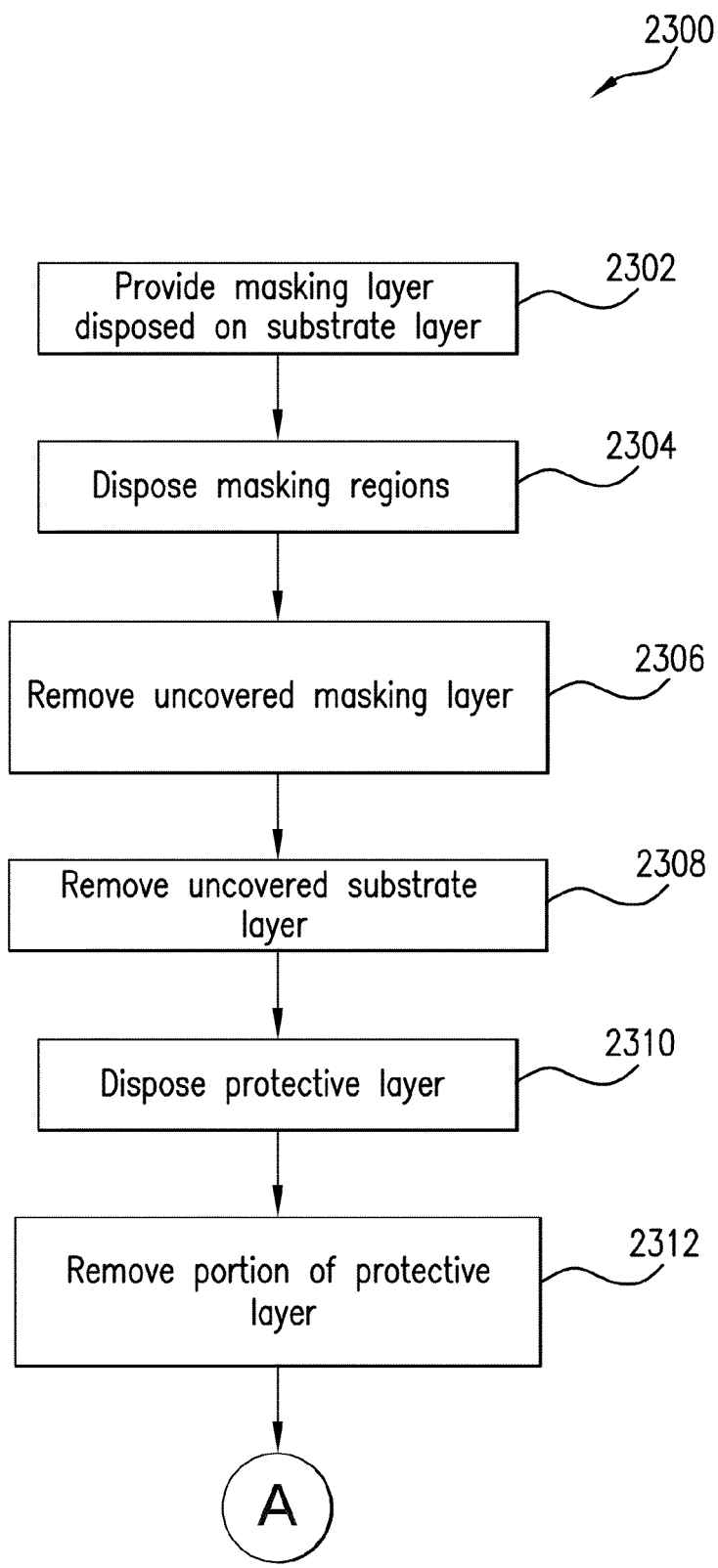
FIGS. 23A-23B is a flowchart of another method for forming substrate elements in accordance with one embodiment of the present invention.
Figure 23B:
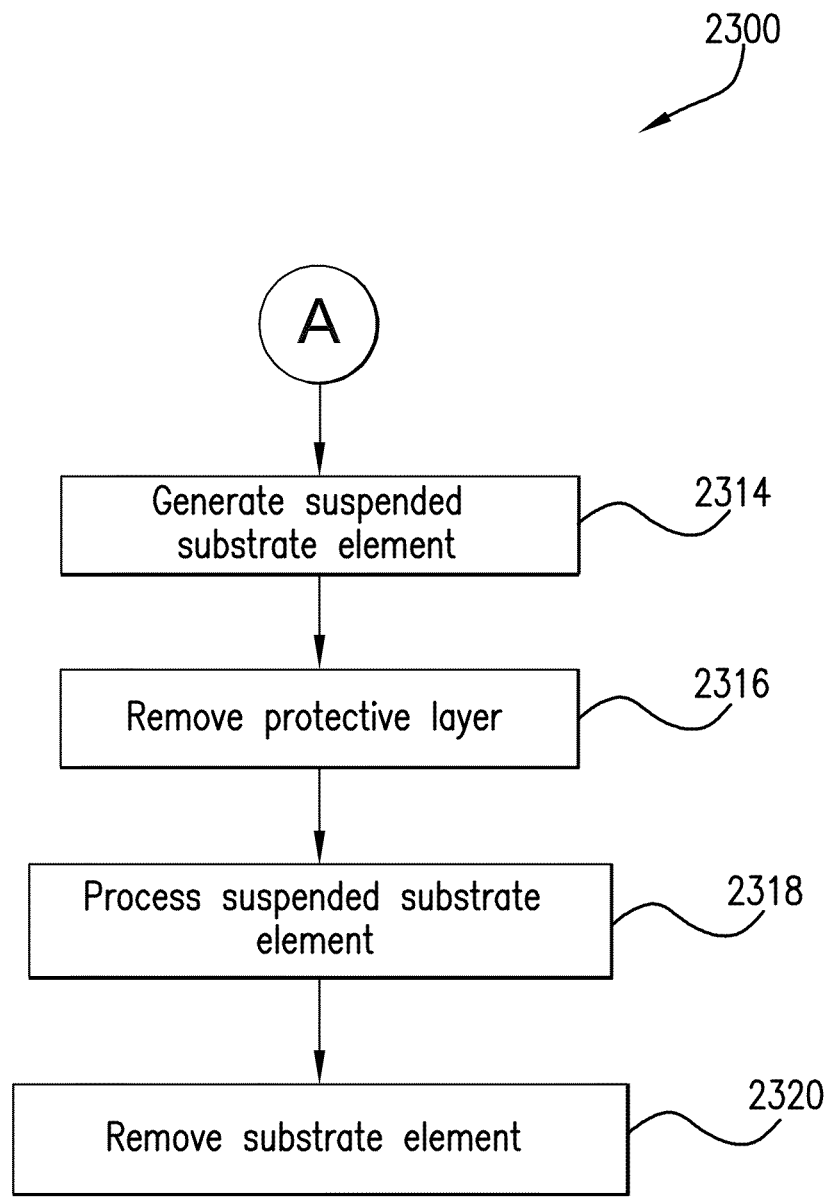

In still further embodiments, as shown in flowchart 2300 of FIGS. 23A-23B, with reference to FIGS. 24A-24N and 25A-25H, the present invention provides additional methods for forming one or more substrate elements. In the schematics of FIGS. 24A-24N and 25A-25H, the figures on the bottom half of the page show top views of wafer 101 during the processing described. The figures on the top half of the page show cross sectional views taken through the various layers of wafer 101 at plane 1-1.

In step 2302 of flowchart 2300, a masking layer 2402 disposed on a substrate layer 102 is provided, as shown in FIGS. 24A and 24B. In step 2304, one or more masking regions 108 are then disposed on masking layer 2402 to at cover at least a portion of masking layer 2402, as shown in FIGS. 24C and 24D. In step 2306 then, one or more uncovered masking layer sections 2406 are removed, and then in step 2308, one or more uncovered substrate layer sections are removed (as they were revealed by the removal of masking layer sections). As shown in FIGS. 24E and 24F, this generates a substrate element 112.

Figure 24G:
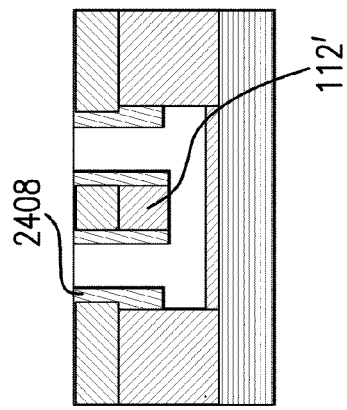
FIGS. 24A-24N show schematics of a method of forming substrate elements in accordance with one embodiment of the present invention.
Figure 24I:
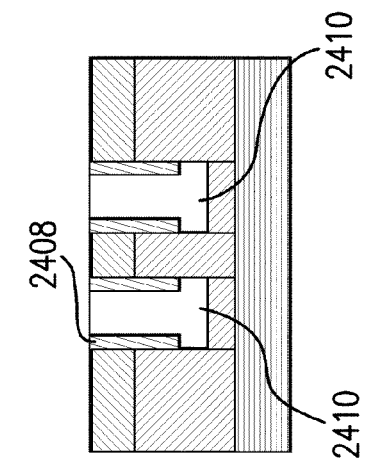

In step 2310, a protective layer 2408 is then disposed on masking layer 2402 and substrate layer 102. This protective layer 2408 also covers the sides of substrate element 112 as shown in FIGS. 24G and 24H. In step 2312 of flowchart 2300, at least a portion of the protective layer 2408 is removed. As shown in FIGS. 24I and 24J, suitably this comprises removing protective layer 2408 from the horizontal surfaces of wafer 101 (for example, using a vertical etch), while leaving protective layer 2408 covering the sides of substrate element 112.

Figure 24K:
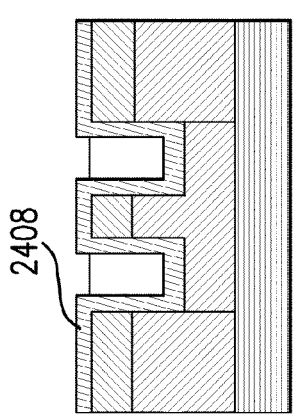
Figure 24H:
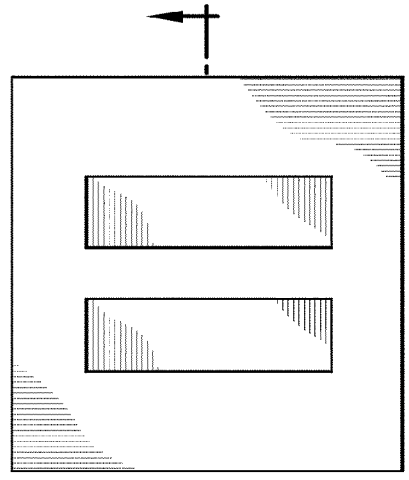
Figure 24J:
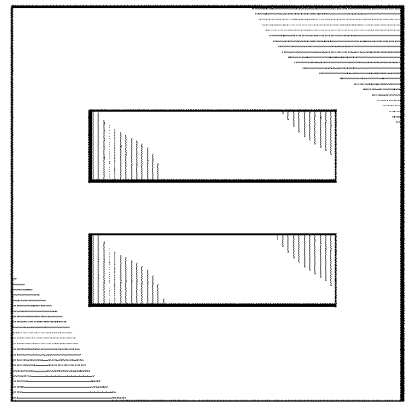
Figure 24L:
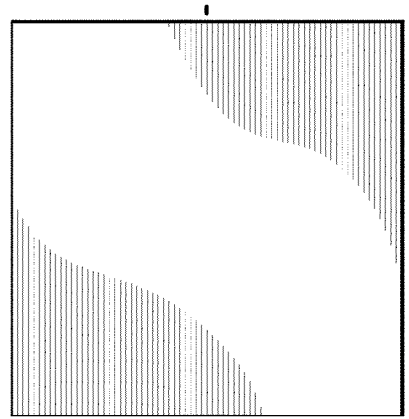

In step 2314 of flowchart 2300, a suspended substrate element is generated, suitably by removing at least a portion of the substrate layer 102, thereby forming one or more suspended substrate elements 112', wherein the suspended substrate elements 112' remain attached to the substrate layer 102, as shown in FIGS. 24K and 24L.

Figure 24M:
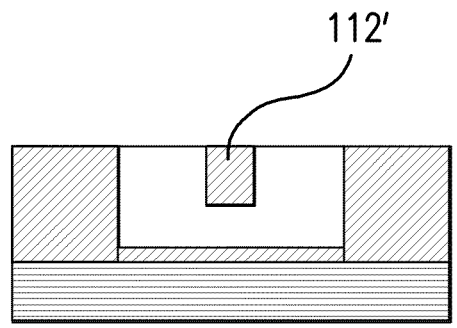
Figure 24N:
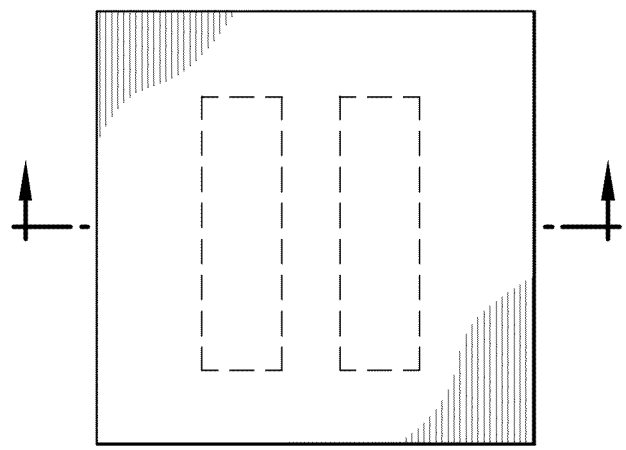
Figure 25G:
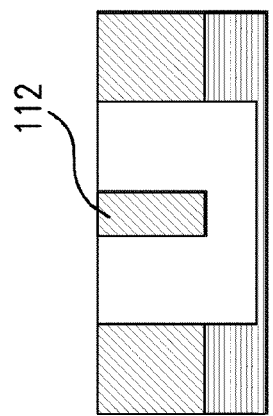
Figure 25H:
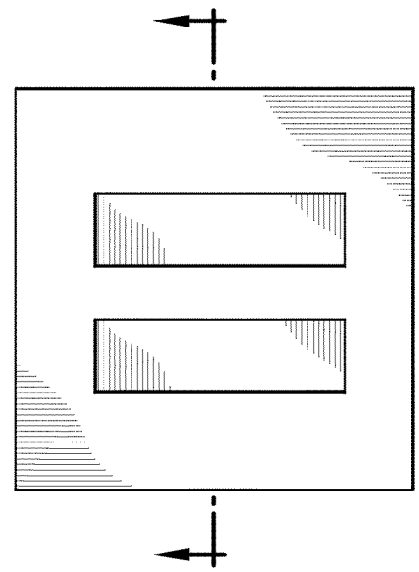

Suitably, in step 2316, the protective layer 2408 is then removed, yielding suspended substrate element 112' as in FIGS. 24M and 24N. In step 2318, the suspended substrate elements 112' can then be processed, and finally, in step 2320, the substrate elements can be removed from wafer 101.

Suitably, substrate layer 102 comprises a semiconductor (e.g., Si) and a masking layer 2402 comprises a semiconductor oxide (e.g., SiO$_2$). As described herein, suitably a photolithography mask is used as masking regions 108. Removal of portions of masking layer 2402 and substrate layer 102 suitably comprise etching. As shown in FIGS. 24E and 24F, suitably the initial etching is an anisotropic etching, so as to remove the substrate (e.g., Si) in a vertical direction.

In suitable embodiments, protective layer 2408 is an oxide layer, such as SiO$_2$. As shown in FIGS. 24I and 24J, initially, portions of protective layer 2408 are removed, for example by using an anisotropic etch (e.g., a vertical oxide etch). Then, a further anisotropic etch can be performed to remove a portion of substrate layer 102 in a vertical direction, followed by an isotropic etch of substrate 102 to undercut the substrate section 112, as shown in FIGS. 24K and 24L, thereby generating suspended substrate element 112'.

Subsequent processing can comprise disposing an insulator layer (e.g., an oxide layer such as silicon oxide) on the suspended substrate elements 112' as described herein. Further processing can also comprise formation of a gate layer on insulator layer, as described throughout. Suitably, gate layer is a metal or polysilicon layer, or similar conductive material. Exemplary metals for use as gate layer include, but are not limited to, palladium (Pd), iridium (Ir), nickel (Ni), platinum (Pt), gold (Au), ruthenium (Ru), cobalt (Co), tungsten (W), tellurium (Te), rhenium (Re), molybdenum (Mo), iron platinum alloy (FePt), tantalum nitride (TaN), etc. Further processing can also comprise doping suspended substrate elements 112' as described herein, as well as disposing of various protective layers, such as nitride layers and other non-conductive layers, as described herein.

Methods for removing suspended substrate element 112' are described herein and include use of masking and etching methods, as well as mechanical cutting and sonication.

In further embodiments, as shown in FIGS. 24A and 24B, substrate 102 can comprise a second section 2404. In suitable embodiments, substrate 102 is a p-doped semiconductor layer (e.g., p-doped Si) and second substrate section 2404 is an n-doped semiconductor layer (e.g., n-doped Si) (though in additional embodiments, substrate 102 can is an n-doped semiconductor layer and second section 2404 is a p-doped semiconductor layer). It should be noted, that while substrate 102 and second substrate section 2404 are shown as two distinct sections, in suitable embodiments, they will both be the same substrate, with simply one section doped differently than the other.

As shown in FIGS. 25A-25H, the methods described above can be used to mask and etch substrate layer 102 and a portion of second substrate section 2404, followed by deposition of a protective layer 2408 (e.g., an oxide) (i.e., steps 2302-2310 of flowchart 2300). Removal of a portion of protective layer 2408, followed by removal of a portion of second substrate section 2404 generates the structure shown in FIGS. 25C and 25D, where second substrate section 2404 beneath substrate section 112 is exposed. Then, second substrate section 2404 beneath substrate section 112 can be removed (e.g., by etching), thereby generating suspended substrate section 112' as in FIGS. 25E and 25F. Protective layer 2408 can then be removed, thereby yielding suspended substrate element 112' as in FIGS. 25G and 25H. Suitably, the suspended substrate elements 112' can then be processed, and finally removed from wafer 101, as described herein. In suitable embodiments, substrate layer 102 is a p-doped Si layer that is about 50 nm to about 500 nm (e.g., about 100 nm, about 200 nm, about 200 nm, about 400 nm, etc.) in thickness, while second substrate section 2404 is an n-doped Si layer that is about 50 μm to about 1000 μm in thickness.

In still further embodiments, the present invention provides methods for forming one or more substrate elements utilizing one or more lateral support tabs, as shown in flowchart 2700 of FIG. 27 with reference to the schematics in FIGS. 26A-26AB. In the schematics of FIGS. 26A-26AB, the figures on the bottom half of the page show top views of wafer 101 during the processing described throughout. The figures on the top half of the show cross-sectional views take through the various layers of wafer 101 through the 1-1 plane depicted in the schematics.

As shown in flowchart 2700, in step 2702, a substrate layer 102 on a support layer 104 is (optionally also comprising a support platform 106) provided, as shown in FIGS. 27A and 27B. As described herein, suitably substrate layer 102 and support layer 104 are differentially removable. Exemplary materials for use a substrate layer 102 include semiconductors, such as Si, etc. Exemplary support layers 104 include semiconductor oxides, semiconductor alloys, doped semiconductors and other materials described herein.

In step 2704 of flowchart 2700, one or more masking regions 108, such as photolithography masks, are disposed on substrate layer 102 so as to cover at least a portion of substrate layer 102. As shown in FIGS. 26C and 26D, suitably masking regions 108 are disposed to not only mask a region that will ultimately become substrate element 112, but masking sections 2602 are disposed in such a way so as to protect areas of substrate 102 that will ultimately form lateral support tabs 2604. In step 2706, uncovered substrate layer sections are then removed, thereby generating substrate element 112 and lateral support tabs 2604, as in FIGS. 26E and 26F. As shown in FIGS. 26E and 26F, any number of lateral support tabs 2604 can be formed. Such tabs provide for additional support during formation of suspended substrate element 112', as well as during further processing of suspended substrate element 112', by restricting lateral bending/buckling or other movement, as well as bending/buckling/movement in the plane of wafer 101. As shown in FIG. 26D, the section of substrate element 112 that will ultimately become the gate region (120/ 305) does not have any lateral supports in this area, thus allowing further processing in this section.

In step 2708, suitably masking regions 108 are removed. Then, instep 2710 of flowchart 2700, a portion of support layer 104 beneath substrate layer 102 is removed, thereby forming suspending substrate elements 112' which are attached to substrate layer 102 via lateral support tabs 2604. As noted above, lateral support tabs 2604 as shown in FIG. 26H were formed by the presence of masking sections 2602 protecting these areas from removal (e.g., protecting them from etching). As noted herein, suitably the removal in step 2706 is performed using anisotropic etching so as to only etch in a plane normal to the plane of the substrate surface, thus allowing for the formation of substrate element 112 and lateral support tabs 2604. Removal in step 2710 suitably comprises isotropic etching, whereby support layer 104 is removed underneath of substrate element 112 and lateral support tabs 2604, thereby generating suspended substrate element 112' that is separated from support layer 104, but still held in place by lateral support tabs 2604. Exemplary etchants and methods of etching are described herein and well known in the art.

Appropriate placement of masking sections 2602 allows for the generation of lateral support tabs 2604 in such a way that processing, as in step 2712 of flowchart 2700, can still occur on the suspended substrate element 112'. As noted herein, in exemplary embodiments, a first processing step that can occur during step 2712 can include a "rounding off" of the corners of suspended substrate element 112' so as to produce a more circular or oval cross-section, as shown in FIGS. 26I and 26J. It should be understood that this "rounding off" is not required. In one embodiment, this initial processing can comprise disposing an oxide layer (for example, growing a thin layer of oxide as described herein), and then removing or etching off this "sacrificial" oxide layer.

Subsequent processing of suspending substrate element 112' can comprise disposing an insulator layer on the suspended substrate element 112'. As shown in FIGS. 26K and 26L, insulator layer 116 is suitably disposed such that it covers all exposed surfaces of substrate element 112'. In exemplary embodiments, insulator layer 116 is an oxide layer that is grown on substrate element 112'. For example, when substrate layer 102 is a semiconductor such as Si, Ge, Sn, Se, Te or B, the oxide that is grown is a semiconductor oxide such as Si oxide ($SiO_2$), Ge oxide, Sn oxide, Se oxide, Te oxide or B oxide. In additional embodiments, still further processing can be carried out on substrate elements 112'. For example, a gate layer 120 can be disposed on insulator layer 116, as shown in FIGS. 26M and 26N. While insulator layer 116 typically is disposed only on exposed surfaces of substrate element 112' and substrate layer 102 (e.g., if an oxide is grown), disposition of gate layer 120 suitably covers all exposed surfaces. Suitably, gate layer 120 is a metal or polysilicon layer, or similar conductive material. Exemplary materials for use as gate layer 120 include, but are not limited to, palladium (Pd), iridium (Ir), nickel (Ni), platinum (Pt), gold (Au), ruthenium (Ru), cobalt (Co), tungsten (W), tellurium (Te), rhenium (Re), molybdenum (Mo), iron platinum alloy (FePt), tantalum nitride (TaN), etc.

In exemplary embodiments, suspended substrate element 112' can be removed from wafer 101 in step 2714, following this initial processing (or can be removed prior to any processing). As described herein, the methods of the present invention can be used to prepare nanowires comprising a core layer (e.g., a semiconductor), and one or more shell layers (e.g., an oxide layer and a gate layer). Thus, following this initial processing described above, the substrate elements can be removed as nanowires and other structures.

In still further embodiments, additional processing can take place on the suspended substrate elements 112' to generate functional transistors and other semiconductor structures. For example, in suitable embodiments, a masking region 108 (e.g., an etch-resistant masking region such as a photolithography mask) is disposed on gate layer 120, as shown in FIGS. 26O and 26P. As shown in FIG. 26P, suitably only a portion of gate layer 120 is covered by masking layer 108, for example a portion near the center of suspended substrate element 112' that does not have lateral support tabs 2604 in the area. Uncovered gate layer 120 is then removed, thereby revealing insulator layer 116 beneath as shown in FIG. 26R. This also forms gate region 305 (comprising a portion of gate layer 120) beneath masking layer 108.

In step 2716 of flowchart 2700, substrate layer 102 is then optionally doped with dopant atoms 302 to form doped regions 304 as shown in FIGS. 26S and 26T. As noted herein, in suitable embodiments, this doping can be a light doping or a heavy doping. Masking region 108 is then removed, as shown in FIGS. 26U and 26V, thereby revealing underlying gate region 305 which comprises material of gate layer 120. It should be noted that throughout this processing, lateral support tabs 2604 continue to support suspended substrate element. In exemplary embodiments, the doped substrate element can then be thermally annealed in step 2718.

Figure 26Y:
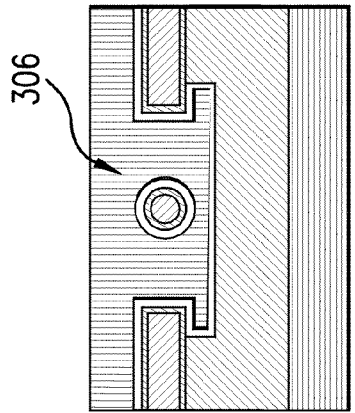
Figure 26Z:
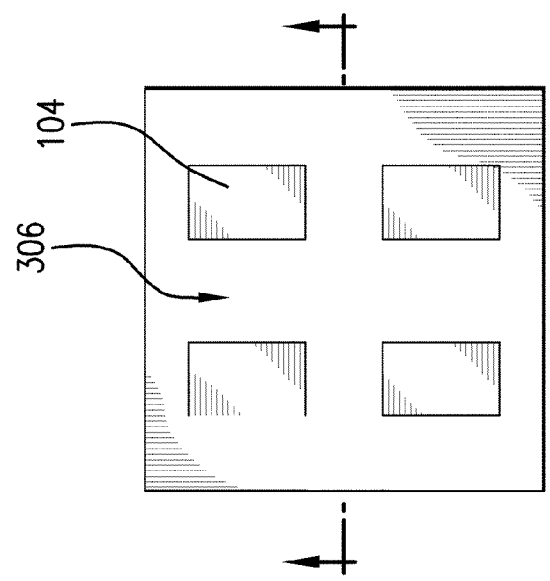

In step 2714 then, transistor element 306 is removed. As described herein, transistor element can removed by disposing one or more masking regions 108 (e.g., an etch-resistant photolithography mask) on the suspended substrate elements 112', as shown in FIGS. 26W and 26X. At least a portion of the suspended substrate elements 112' and/or substrate layer 102 are then removed (e.g., via etching), thereby separating the transistor elements 306 from the substrate layer 102, as shown in FIGS. 26Y and 26Z. This etching also separates transistor element 306 from lateral support tabs 2604. As shown in FIGS. 26Y and 26Z, transistor element 306 is surrounded by masking region 108 and can be removed from wafer 101. In further embodiments, transistor elements 306 can be removed from substrate layer 102 by simply agitating or vibrating the transistor elements 306, or by mechanically cutting them from substrate layer 102. As shown in FIGS. 26AA and 26AB, transistor elements 306 suitably comprise doped regions 304 (e.g., source and drain regions comprising doped semiconductor material) as well as gate regions (102/ 305), suitably comprising a metal or polysilicon. In still further embodiments, the methods of the present invention for preparing transistor elements 306 can further comprise additional doping stages, including light and heavy doping, as well as the deposition of additional protective or non-conductive layers as described throughout.

In additional embodiments, as shown in FIGS. 28A and 28B, the methods described herein to form substrate elements can utilize a stress-relieving structure 2800 to aid in formation and processing of the various substrate elements, including nanowires, transistors and other semiconductor elements described herein. As shown in FIG. 28A, a stress-relief element 2802 can be formed by masking and etching in an appropriate manner. Such stress-relief elements 2802 are suitably placed at the ends of suspended substrate element 112', though they can be placed at any position along the element. Stress-relief elements 2802 allow element 112' to expand (e.g., in a direction designated by arrows 2804) during formation and processing, thereby reducing buckling, bending and other movement, and limiting failure of the element prior to removal. As shown in FIG. 28B, removal of element 112' using the masking region 108 approach described herein can still be practiced, simply by etching the element 112' away from the stress-relief elements 2802.

FIG. 29A shows a scanning electron micrograph of a suspended substrate element 112' that was prepared without the use of a stress-relief element. A "bowing" upward of the element can be noted as the wire expanded during formation and/or processing. The use of stress-relief elements 2802 relieves this stress, thereby limiting bowing of the element 112', as show in the SEM of FIG. 29B.

FIG. 29C shows a scanning electron micrograph of a suspended substrate element 112' comprising lateral support tabs 2604 and also comprising stress relief elements 2802.

Numerous electronic devices and systems can incorporate the substrate elements prepared according to the present invention. As discussed herein, in suitable embodiments, the substrate elements are semiconductor elements, including nanowires, nanoribbons, nanotubes, etc., and can also be transistor elements. Some example applications for the present invention are described below or elsewhere herein for illustrative purposes, and are not limiting.

Semiconductor devices (or other type devices) comprising the various substrate elements described herein can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

As described herein, in suitable embodiments, the methods of the present invention can be used to generate multiple substrate elements (e.g., nanowires, transistors, etc.) from the same or separate wafers 101. The methods described herein allow for the processing of these elements on the wafer without the need to transfer them to a separate substrate first (though they can also be processed after transfer). The elements prepared by the methods of the present invention can then be incorporated in applications requiring a single substrate element (e.g., a single semiconductor), or multiple elements. For example, the substrate elements prepared by the processes and methods of the present invention are particularly applicable to large area, macro electronic substrates on which a plurality of elements (e.g., semiconductor devices) are formed. Such electronic devices can include display driving circuits for active matrix liquid crystal displays (LCDs), organic LED displays, field emission displays, etc. Other active displays can be formed from a nanowire-polymer, quantum dots-polymer composite (the composite can function both as the emitter and active driving matrix). The substrate elements prepared by the processes and methods of the present invention are also applicable to smart libraries, credit cards, large area array sensors, and radio-frequency identification (RFID) tags, including smart cards, smart inventory tags, and the like.

The substrate elements prepared by the processes and methods of the present invention are also applicable to digital and analog circuit applications. In particular, the substrate elements prepared by the processes and methods of the present invention are useful in applications that require ultra large-scale integration on a large area substrate. For example, a thin film of substrate elements (e.g., nanowires) can be implemented in logic circuits, memory circuits, processors, amplifiers, and other digital and analog circuits.

Hence, a wide range of military and consumer goods can incorporate the substrate elements prepared by the processes and methods of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

It will be readily apparent to one of ordinary skill in the relevant arts that other suitable modifications and adaptations to the methods and applications described herein can be made without departing from the scope of the invention or any embodiment thereof. Having now described the present invention in detail, the same will be more clearly understood by reference to the following examples, which are included herewith for purposes of illustration only and are not intended to be limiting of the invention.

EXAMPLES

Example 1

Preparation of Substrate Elements

A silicon substrate layer 102 disposed on a silicon oxide support layer 104 was initially coated with a layer of nitride. Photolithography techniques well known in the art were then used to generate a pattern mask on the nitride. Etching of the nitride generated a hard nitride mask covering portions of the Si substrate layer 102, but also leaving uncovered regions. A standard shallow trench isolation (STI) etch was then used to etch through the exposed Si layer to form substrate (Si) elements 112.

Figure 20A:
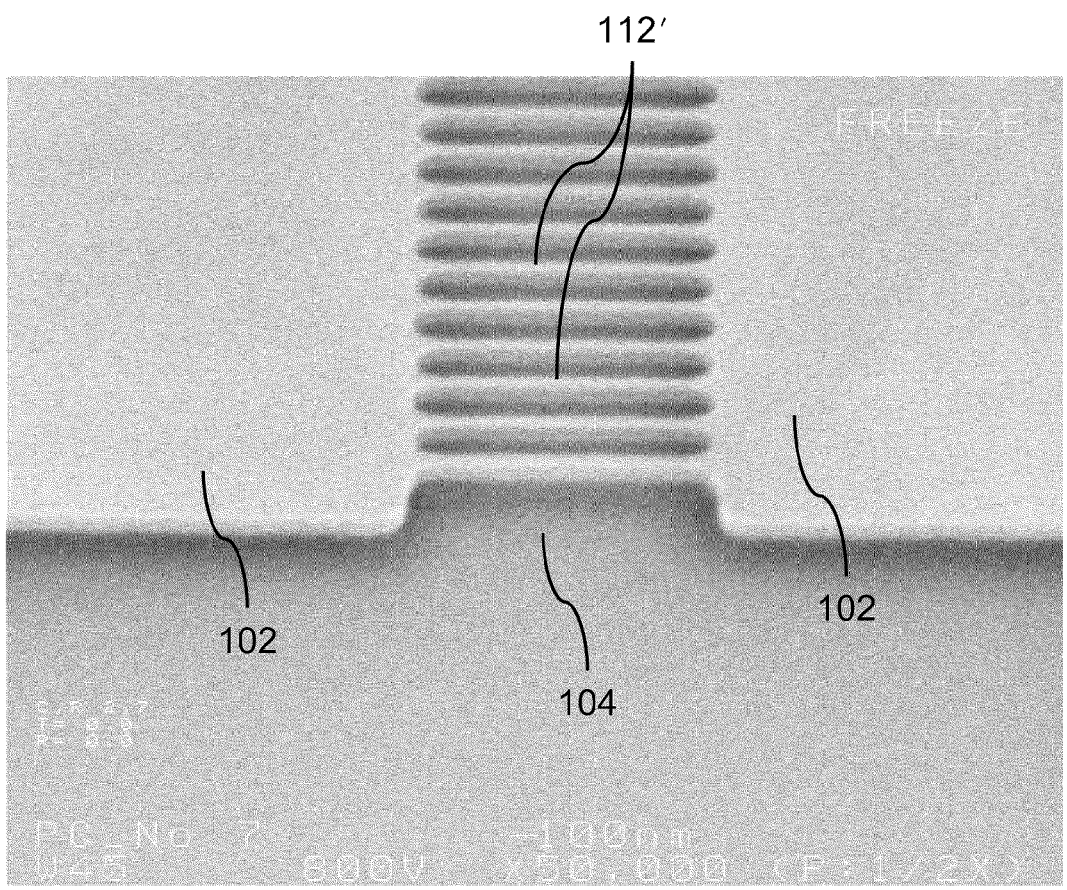
FIGS. 20A-20C show suspended substrate elements prepared in accordance with one embodiment of the present invention.
Figure 20B:
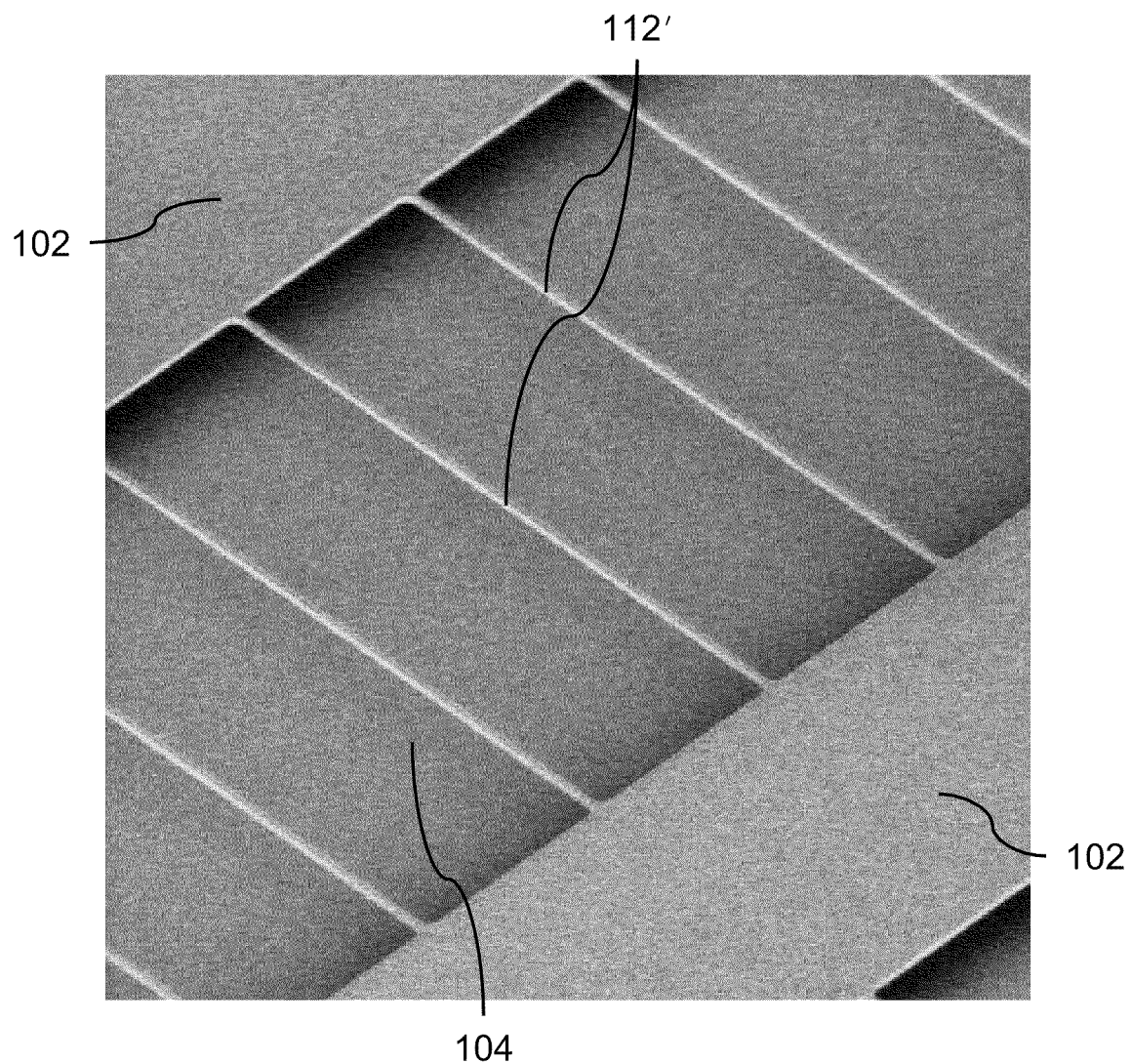
Figure 20C:
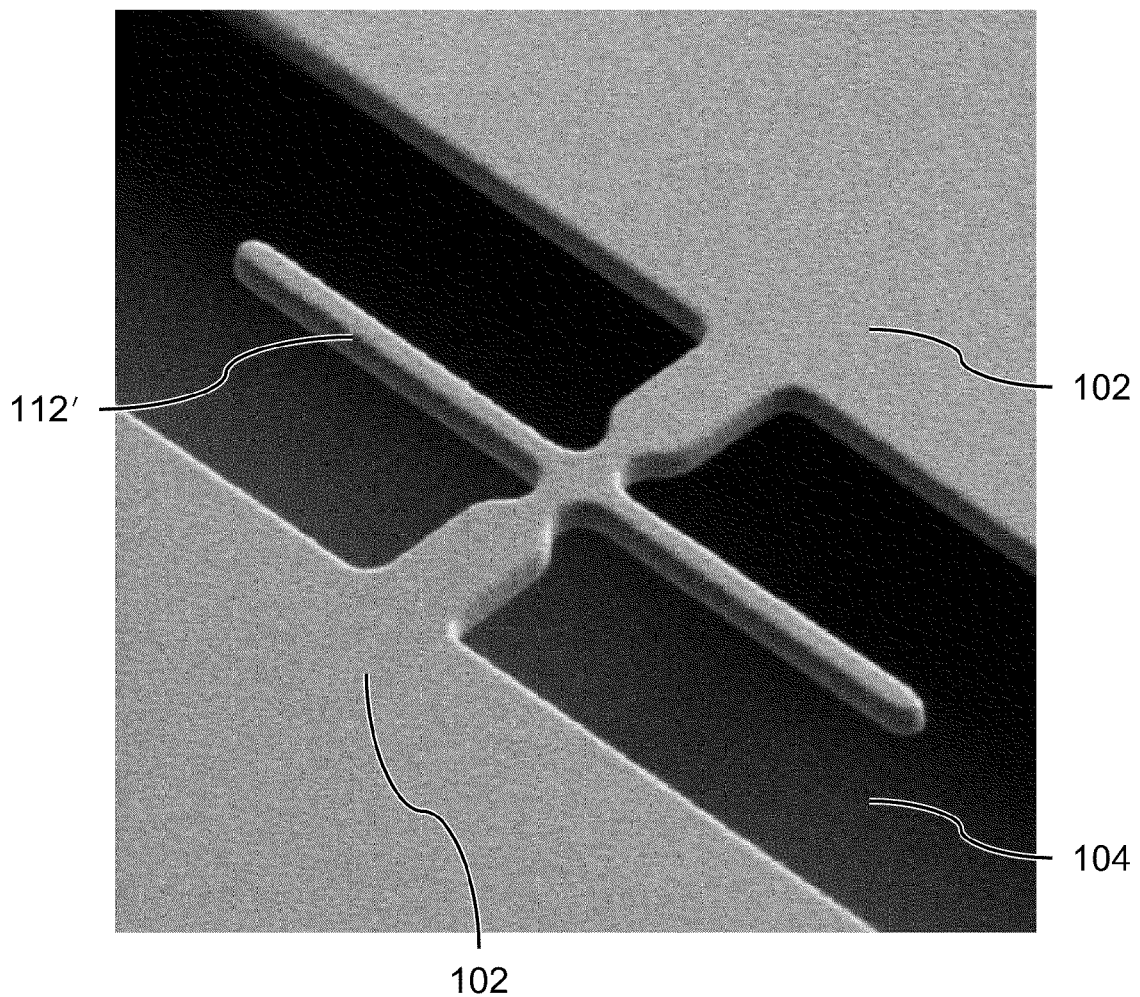

A HF etch was then used to remove a portion of the silicon oxide support layer 104 underneath the substrate elements 112. This formed suspended substrate elements 112' that were attached at both ends to substrate layer 102, as shown in FIG. 20A. The resultant suspended substrate elements 112' are on the order of about 100 nm in cross-section, and about 1 µm in length, though thicker or longer length wires can also be made using similar techniques. FIG. 20B shows a scanning electron micrograph of suspended substrate elements 112' of about 20 µm in length. FIG. 20C shows suspended substrate elements 112' suspended as a cantilever structure, i.e., attached only at one point on the element (in this embodiment, in the middle, though other attachment points can be utilized).

Example 2

Processing of Substrate Elements

As above, a silicon substrate layer 102 disposed on a silicon oxide support layer 104 was first coated with a layer of nitride. Photolithography techniques well known in the art were then used to generate a pattern mask on the nitride. Etching of the nitride generated a hard nitride mask covering portions of the Si substrate layer 102, but also leaving uncovered portions. A standard STI etch was then used to etch through the Si substrate layer to form substrate (Si) elements 112.

A HF etch was then used to remove a portion of the silicon oxide support layer 104 beneath the substrate elements 112. This formed suspended substrate elements 112' that were attached at both ends to substrate layer 102.

Subsequent processing was then performed on suspended substrate elements 112'. First, an oxide insulator layer 116 was added by thermal oxidation of the Si at about 900° C. Then, a polysilicon gate layer 120 was disposed on the oxide layer using standard deposition techniques well known in the art.

Figure 21:
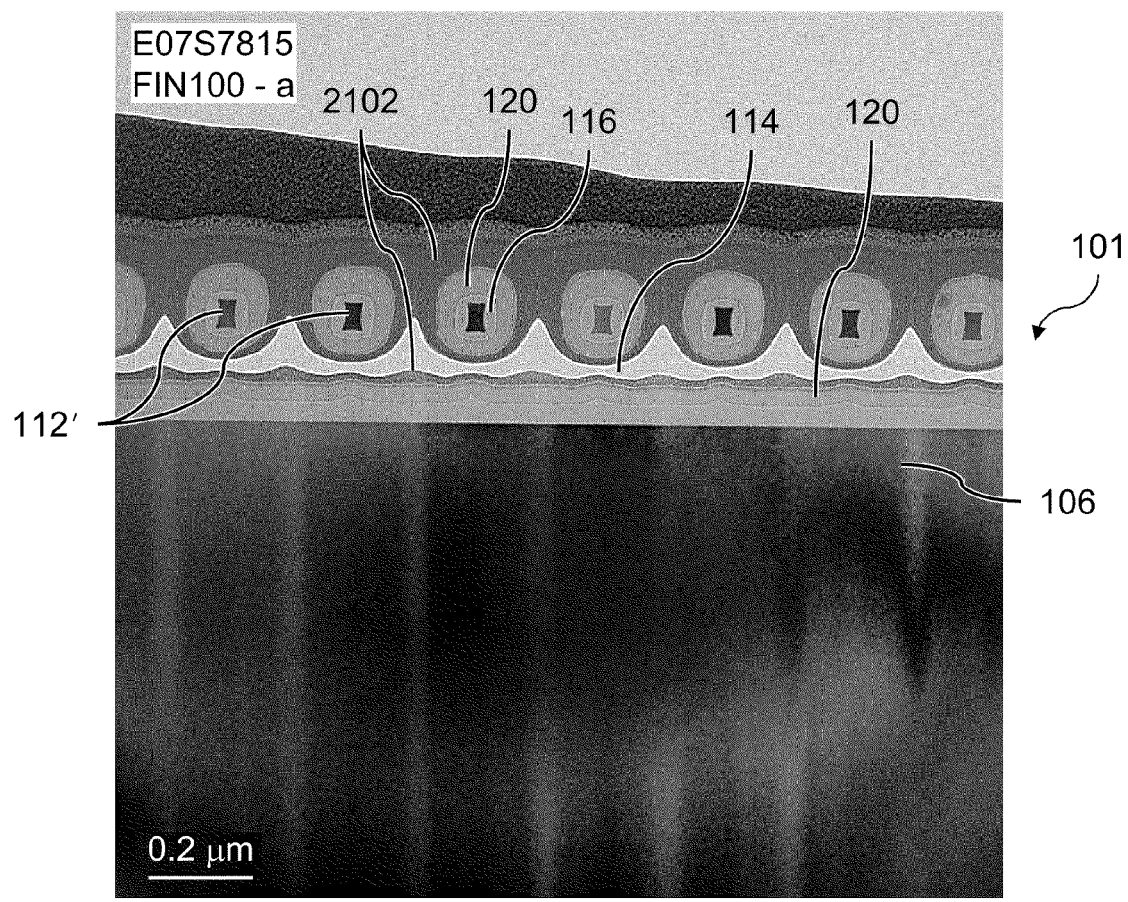
FIG. 21 shows a cross-section of processed suspended substrate elements in accordance with one embodiment of the present invention.
Figure 22:
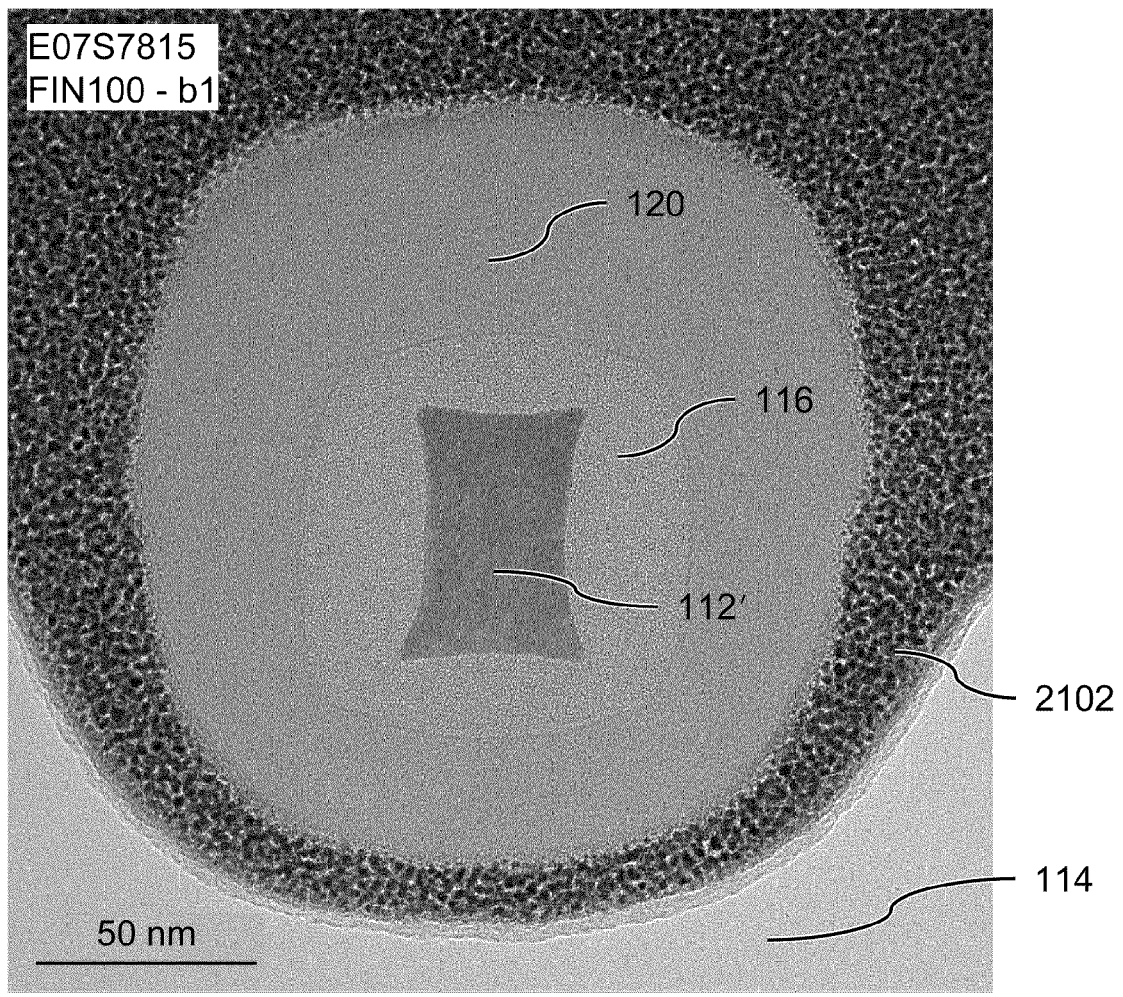
FIG. 22 shows a magnified cross-section processed suspended substrate elements in accordance with one embodiment of the present invention.

FIG. 21 shows a transmission electron micrograph (TEM) cross-section taken through wafer 101 comprising a number of suspended substrate elements 112'. Suspended substrate elements 112' (Si) are surrounded by an insulator layer 116 ($SiO_2$) which is then surrounded by a gate layer 120 (polysilicon). The dimensions of suspended substrate elements 112' are on the order of about 50 nm by about 100 nm in cross-section. Each is surrounded by an $SiO_2$ layer of about 10-20 nm in thickness, which is surrounded by a polysilicon layer on the order of about 50-100 nm in thickness.

As can be clearly seen in FIG. 21, each of suspended substrate elements 112' is suspended above support layer 104, a portion of which was been removed by the HF etching. A thin layer of polysilicon (120) sits on top of $SiO_2$ layer 104 as a result of the gate layer deposition. Sections where suspended substrate elements 112' have been undercut (114) can also be seen. Processing layers 2102 required for the preparation of the TEM pictures are also visible, as is support platform 106.

FIG. 23 shows a magnified TEM cross-section of one of the suspended substrate elements 112', again showing the presence of the oxide insulator layer 116, and the polysilicon gate layer 120.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

What is claimed is:

1. A method for forming one or more substrate elements, comprising:
    (a) providing a substrate layer disposed on a support layer;
    (b) disposing one or more masking regions on the substrate layer to cover at least a portion of the substrate layer;
    (c) removing one or more uncovered substrate layer sections;
    (d) completely removing the support layer beneath the substrate layer, thereby forming one or more suspended substrate elements which are suspended as a bridge above the support layer, wherein the suspended substrate elements remain attached to the substrate layer only at one or both ends of the substrate elements and can be processed prior to removal; and
    (e) removing the substrate elements.

2. The method of claim 1, wherein the providing comprises providing a substrate layer comprising a semiconductor and a support layer comprising a semiconductor oxide or semiconductor alloy.

3. The method of claim 2, wherein the providing comprises providing a substrate layer comprising Si and a support layer comprising $SiO_2$ or SiGe.

4. The method of claim 1, wherein the disposing in (b) comprises disposing a photolithography mask.

5. The method of claim 1, wherein the removing in (c) comprises etching.

6. The method of claim 5, wherein the etching comprises anisotropic etching.

7. The method of claim 1, wherein the removing in (d) comprises etching.

8. The method of claim 7, wherein the etching comprises isotropic etching.

9. The method of claim 1, wherein the removing in (e) comprises:
    i. disposing one or more masking regions on the suspended substrate elements;
    ii. removing at least a portion of the suspended substrate elements and/or the substrate layer, thereby separating the suspended substrate elements from the substrate layer; and
    iii. removing the masking regions.

10. The method of claim 9, wherein the disposing in i. comprises disposing a photolithography mask.

11. The method of claim 10, wherein the removing in ii. comprises etching.

12. The method of claim 11, wherein the etching comprises anisotropic etching.

13. The method of claim 1, wherein the removing in (e) comprises sonicating the suspended substrate elements so as to separate the substrate elements from the substrate layer.

14. The method of claim 1, wherein the removing in (e) comprises mechanically cutting the suspended substrate elements so as to separate the substrate elements from the substrate layer.

15. The method of claim 1, wherein the removing in (d) forms one or more suspended substrate elements, wherein the suspended substrate elements remain attached to the substrate layer via one or more lateral support tabs.

16. A method for forming one or more substrate elements, comprising:
    (a) providing a substrate layer disposed on a support layer;
    (b) disposing one or more masking regions on the substrate layer to cover at least a portion of the substrate layer;
    (c) removing one or more uncovered substrate layer sections;
    (d) completely removing the support layer beneath the substrate layer, thereby forming one or more suspended substrate elements which are suspended as a bridge above the support layer, wherein the suspended substrate elements remain attached to the substrate layer only at one or both ends of the substrate elements;
    (e) processing the suspended substrate elements; and
    (f) removing the substrate elements.

17. A nanowire prepared by a method comprising:
    (a) providing a substrate layer disposed on a support layer;
    (b) disposing one or more masking regions on the substrate layer to cover at least a portion of the substrate layer;
    (c) removing one or more uncovered substrate layer sections;
    (d) completely removing the support layer beneath the substrate layer, thereby forming one or more suspended substrate elements which are suspended as a bridge above the support layer, wherein the suspended substrate elements remain attached to the substrate layer only at one or both ends of the substrate elements and can be processed prior to removal; and (e) removing the substrate elements as nanowires.

18. A nanowire prepared by a method comprising:

(a) providing a substrate layer disposed on a support layer;

(b) disposing one or more masking regions on the substrate layer to cover at least a portion of the substrate layer;

(c) removing one or more uncovered substrate layer sections;

(d) removing the masking regions;

(e) completely removing the support layer beneath the substrate layer, thereby forming one or more suspended substrate elements which are suspended as a bridge above the support layer, wherein the suspended substrate elements remain attached to the substrate layer only at one or both ends of the substrate elements;

(f) processing the suspended substrate elements; and (g) removing the substrate elements as nanowires.

19. A method for forming one or more substrate elements, comprising:

(a) providing a substrate layer disposed on a support layer;

(b) disposing one or more masking regions on the substrate layer to cover at least a portion of the substrate layer;

(c) completely removing one or more uncovered substrate layer sections, thereby forming one or more substrate elements which are suspended as a bridge above the support layer, wherein the suspended substrate elements remain attached to the substrate layer only at one or both ends of the substrate elements;

(d) processing the substrate elements; and (e) removing the substrate elements.

* * * * *